United States Patent
Kushta et al.

(10) Patent No.: US 9,583,807 B2
(45) Date of Patent: Feb. 28, 2017

(54) HYBRID RESONATORS IN MULTILAYER SUBSTRATES AND FILTERS BASED ON THESE RESONATORS

(75) Inventors: Taras Kushta, Tokyo (JP); Takashi Harada, Tokyo (JP)

(73) Assignee: LENOVO INNOVATIONS LIMITED (HONG KONG), Quarry Bay, Hong Kong (CN)

(*) Notice: Subject to any disclaimer, the term of this patent is extended or adjusted under 35 U.S.C. 154(b) by 125 days.

(21) Appl. No.: 14/401,426

(22) PCT Filed: May 15, 2012

(86) PCT No.: PCT/JP2012/003175
§ 371 (c)(1),
(2), (4) Date: Nov. 14, 2014

(87) PCT Pub. No.: WO2013/171788
PCT Pub. Date: Nov. 21, 2013

(65) Prior Publication Data
US 2015/0077197 A1    Mar. 19, 2015

(51) Int. Cl.
*H01P 1/203*    (2006.01)
*H01P 7/08*    (2006.01)
(Continued)

(52) U.S. Cl.
CPC ........... *H01P 1/203* (2013.01); *H01P 1/2088* (2013.01); *H01P 1/20345* (2013.01);
(Continued)

(58) Field of Classification Search
CPC ........ H01P 1/203; H01P 7/08; H01P 1/20345; H01P 1/2088; H01P 7/082; H05K 1/16
(Continued)

(56) References Cited

U.S. PATENT DOCUMENTS

| 5,977,847 A * | 11/1999 | Takahashi ............. H01P 1/2039 333/204 |
| 7,579,925 B2 * | 8/2009 | Fan .......................... H01P 5/02 333/246 |

(Continued)

FOREIGN PATENT DOCUMENTS

| JP | 2007-158675 A | 6/2007 |
| JP | 2008-507858 A | 3/2008 |

(Continued)

OTHER PUBLICATIONS

International Search Report of PCT/JP2012/003175, dated Aug. 21, 2012. [PCT/ISA/210].

(Continued)

*Primary Examiner* — Stephen E Jones
*Assistant Examiner* — Scott S Outten
(74) *Attorney, Agent, or Firm* — Kunzler Law Group

(57) ABSTRACT

A filter of the present invention comprises a multilayer substrate, two terminals, a ground conductor and a hybrid resonator. The multilayer substrate includes a plurality of conductor layers and a dielectric configured to isolate said plurality of conductor layers from each other. The hybrid resonator is disposed in the multilayer substrate and comprises a first and a second resonant elements and a coupling strip connecting the first and said second resonant elements. Each resonant element comprises a signal via, a group of ground vias and an artificial dielectric. Each signal via is disposed through the multilayer substrate. Each group of ground vias is disposed through the multilayer substrate and configured to surround the signal via. Each artificial dielectric is disposed in the multilayer substrate and between the signal via and the group of ground vias. The artificial dielectric comprises a conductive plate connected to the first (Continued)

signal via and an isolating slit isolating the first conductive plate from the group of ground vias.

10 Claims, 65 Drawing Sheets

(51) Int. Cl.
*H01P 1/208* (2006.01)
*H05K 1/16* (2006.01)
*H05K 1/02* (2006.01)

(52) U.S. Cl.
CPC ............... *H01P 7/082* (2013.01); *H05K 1/16* (2013.01); *H05K 1/0222* (2013.01); *H05K 1/0298* (2013.01)

(58) Field of Classification Search
USPC .................. 333/246, 243, 238, 202–204
See application file for complete search history.

(56) References Cited

U.S. PATENT DOCUMENTS

| 7,705,695 B2 | 4/2010 | Kushta |
| 2010/0096174 A1 | 4/2010 | Nakano et al. |
| 2010/0265011 A1* | 10/2010 | Ding ........................ H01P 1/203 333/204 |

FOREIGN PATENT DOCUMENTS

| JP | 4367660 B2 | 11/2009 |
| WO | 2008/133010 A1 | 11/2008 |
| WO | 2010/073410 A1 | 7/2010 |
| WO | 2011/010393 A1 | 1/2011 |

OTHER PUBLICATIONS

International Preliminary Report on Patentability, dated Nov. 18, 2014, issued by the International Searching Authority in counterpart Application No. PCT/JP2012/003175.

* cited by examiner

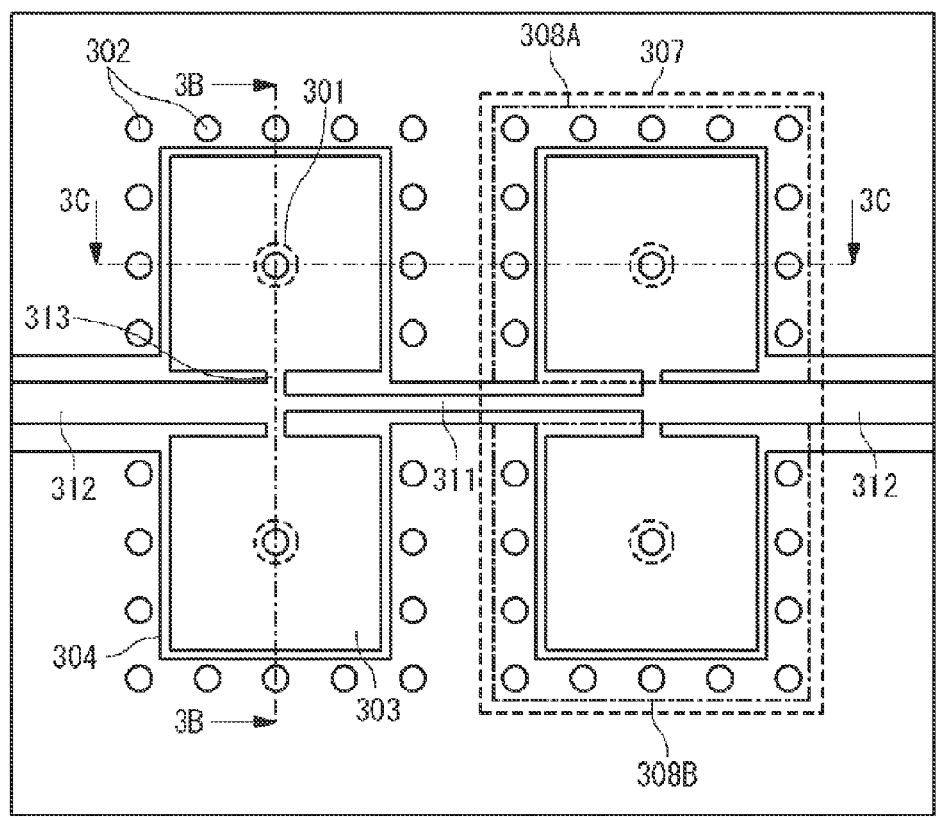

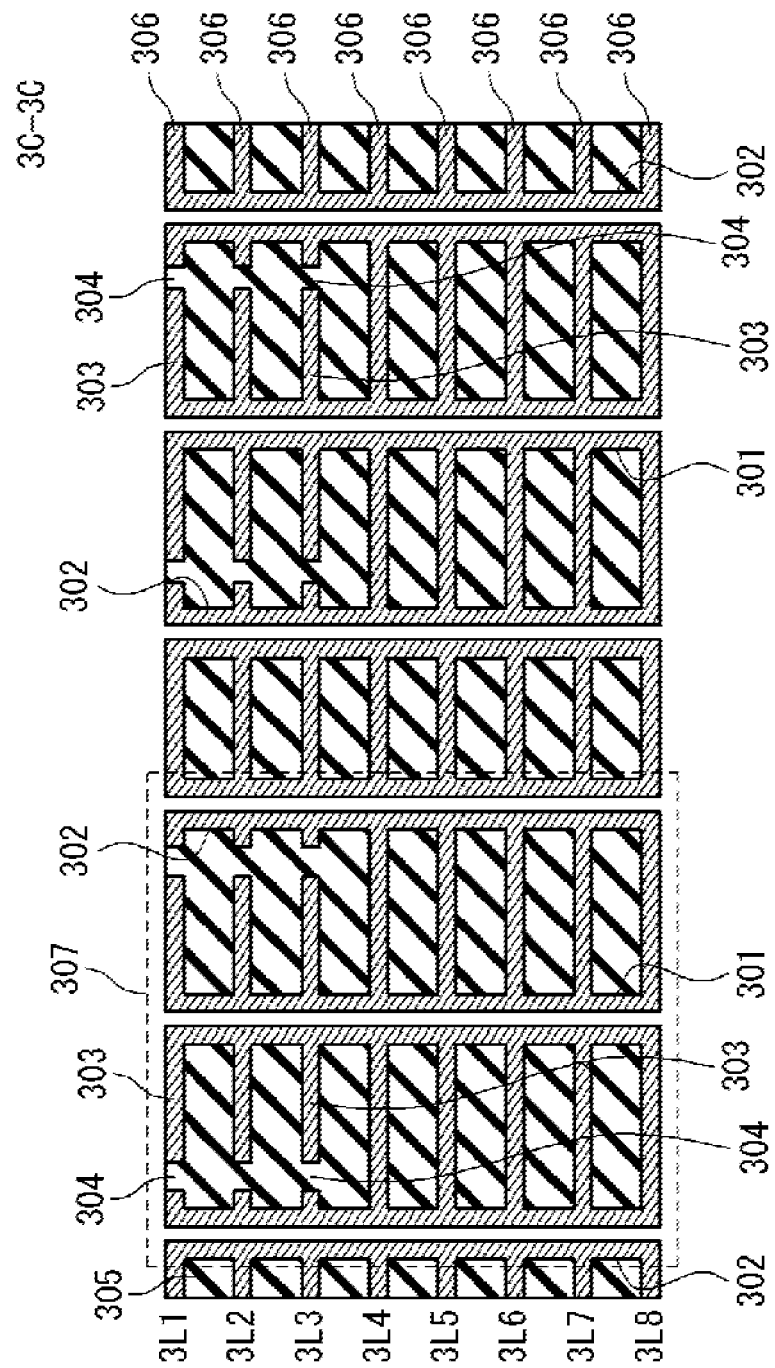

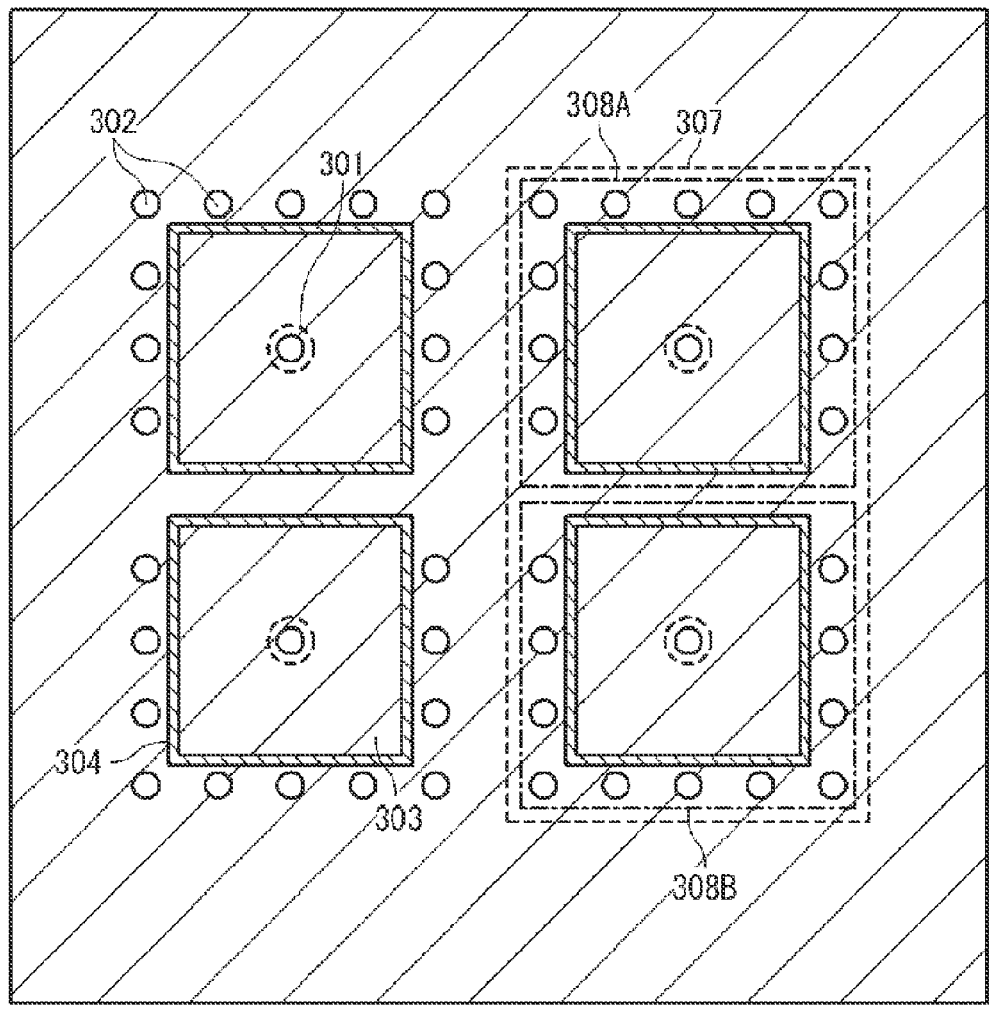

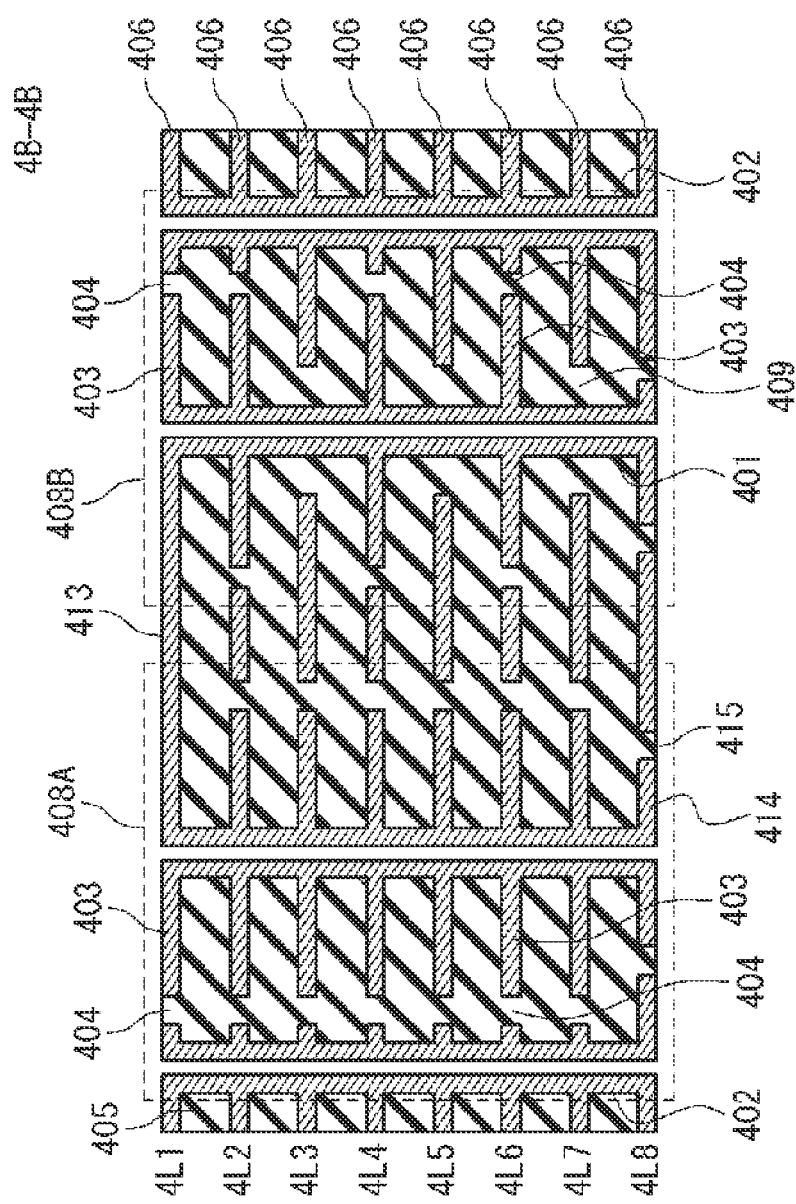

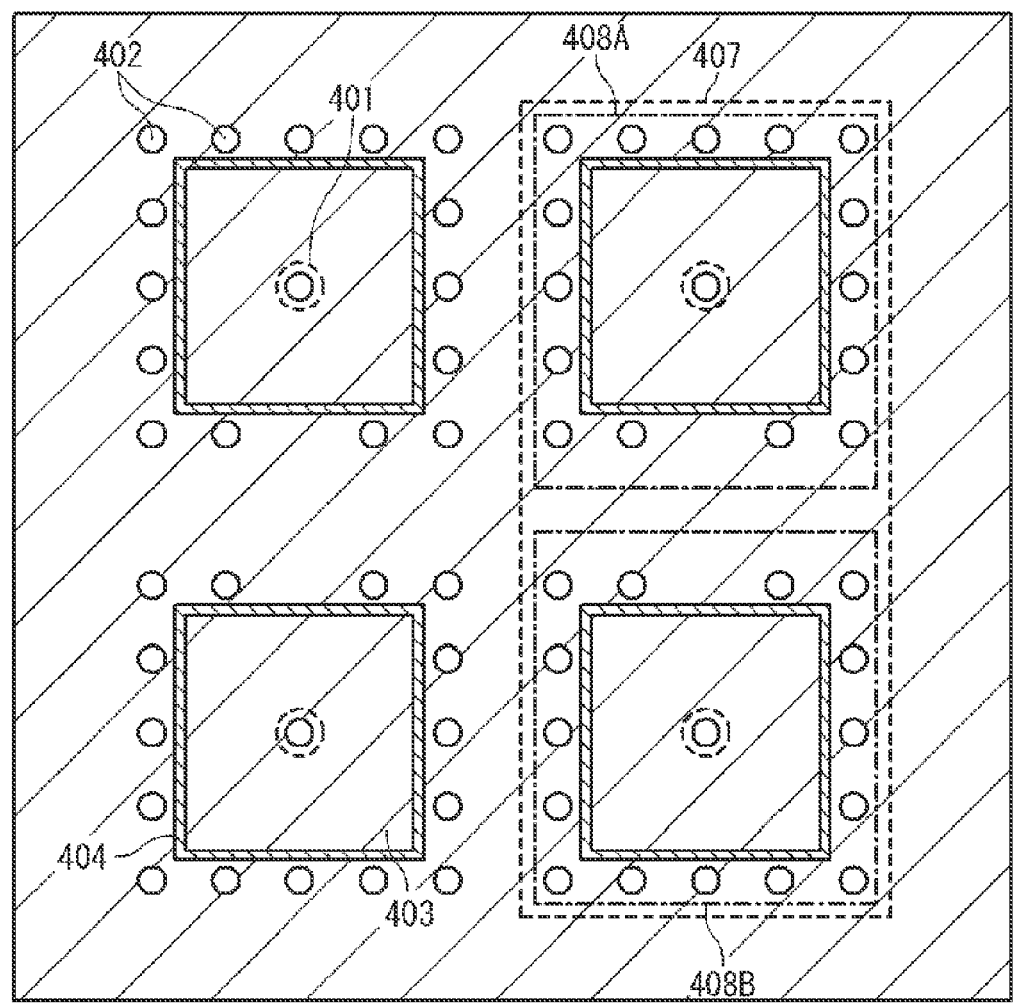

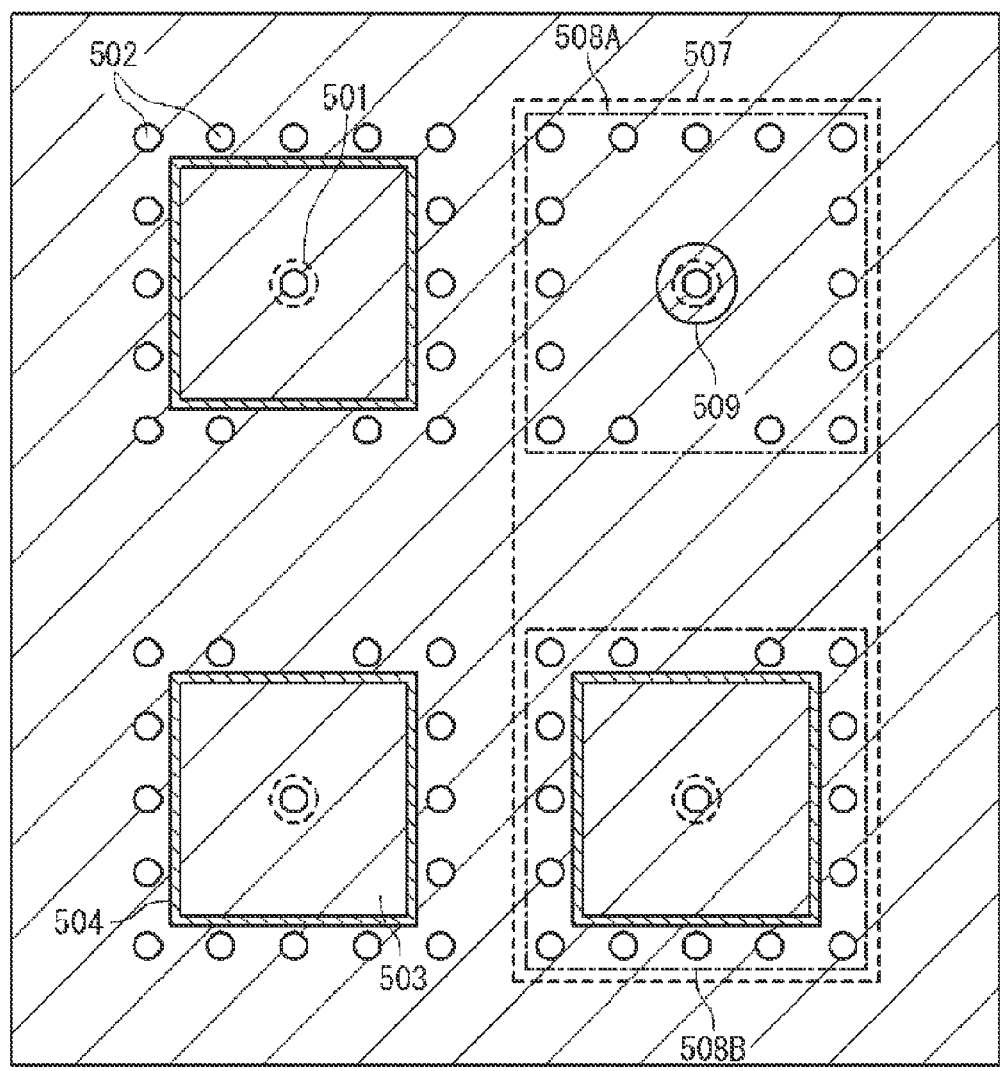

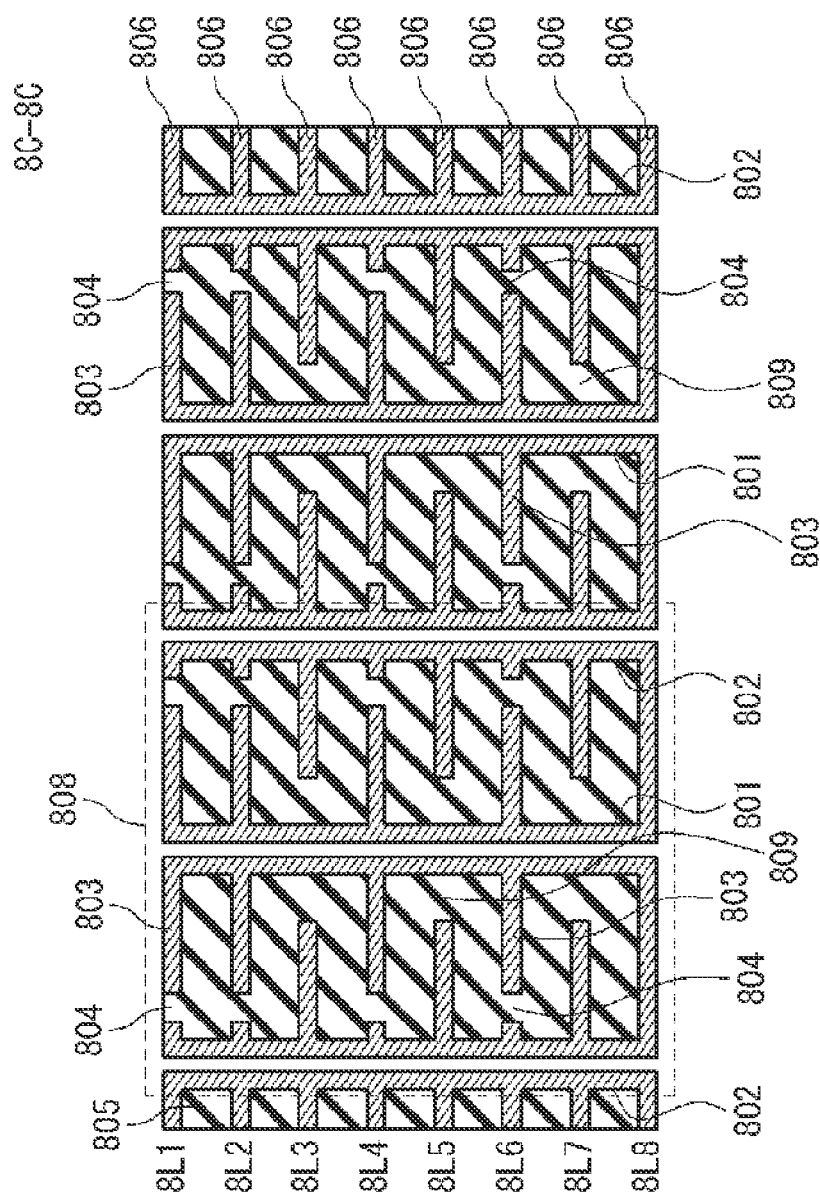

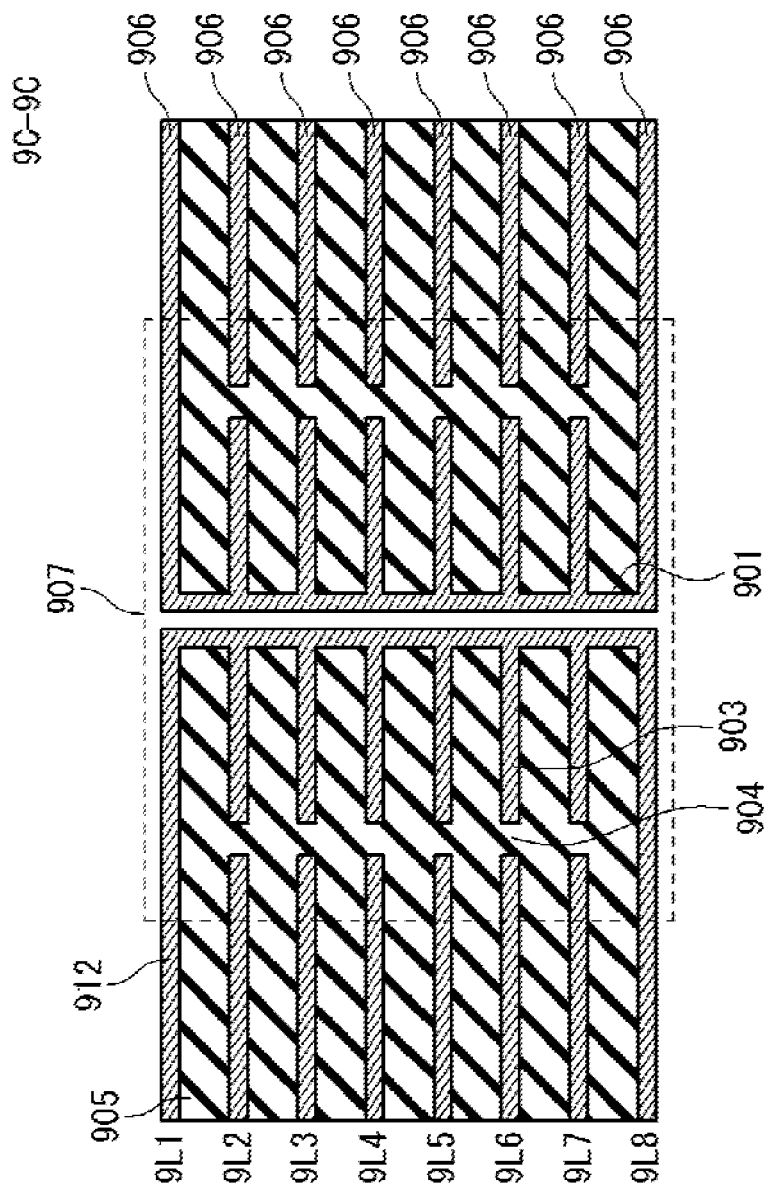

HYBRID RESONATORS IN MULTILAYER SUBSTRATES AND FILTERS BASED ON THESE RESONATORS

CROSS REFERENCE TO RELATED APPLICATIONS

This application is a National Stage of International Application No. PCT/JP2012/003175 filed May 15, 2012, the contents of all of which are incorporated herein by reference in their entirety.

TECHNICAL FIELD

This invention is related to hybrid resonators and filters based on these resonators. The structures considered have been based on multilayer substrates, including printed circuit boards.

BACKGROUND ART

A high-selective filter is a crucial component in wired and wireless communication systems, because they control the usage of frequency spectrum there. Due to a close proximity of the operation frequency band of functional elements in a device, the frequency characteristics skirt of the filter applied has to be sharp.

However, providing such electrical performance is a complex problem in high-density and multifunctional devices, because additional resonant elements are required.

Moreover, the use of such additional elements, which can improve the filter skirt sharpness, can lead to the increase of the in-band insertion losses that can be unac-ceptable for real applications.

Japanese Patent JP4367660 (U.S. Pat. No. 7,705,695B2) discloses composite via structures and filters based on these structures, which are formed in multilayer substrates. Compactness of resonant elements in these structures is provided by conductive plates connected to the signal via forming in such way an artificial dielectric of a high permittivity.

PCT Laid Open Patent Publication WO 2010/073410 discloses via structures and filters based on these via structures, in which an artificial dielectric of a high permittivity is formed by corrugated conductive plates connected to the signal via.

PCT Laid Open Patent Publication WO/2011/010393 discloses resonant elements and filters based on these elements, in which an artificial dielectric is formed by double corrugated surface obtained by the corrugation of both the signal plates and ground plates.

Above-mentioned structures are miniature and cost-effective ones. However, it is important to provide such type of resonators in a filter which can improve its selectivity.

CITATION LIST

Patent Literature

[PTL 1] Japanese Patent JP4367660 (U.S. Pat. No. 7,705,695B2)
[PLT 2] PCT Laid Open Patent Publication WO 2010/073410
[PLT 3] PCT Laid Open Patent Publication WO/2011/010393

SUMMARY OF INVENTION

It is an object of the present invention to provide a hybrid resonator in a multilayer substrate which has a high quality factor (Q-factor).

In an aspect of the present invention, such structure is obtained by the design of the hybrid resonator as comprising two or more resonant elements disposed vertically (perpendicularly to multilayer substrate conductor layers) and connected by a coupling strip. These elements are obtained by a signal via and ground vias surrounding the signal via.

Compactness of the elements in the vertical direction is provided by a high-permittivity artificial dielectric disposed in the area between signal and ground vias. Each resonant element has its own resonance frequency which can be equal or differing from each other.

It is another object of this invention to provide high-selective filters using proposed hybrid resonators.

BRIEF DESCRIPTION OF DRAWINGS

FIG. 3A is a top view of a filter in further another exemplary embodiment of the present invention.

FIG. 3C is a vertical cross-sectional view of the filter in further another exemplary embodiment of the present invention on the 3C-3C section shown in FIG. 3A.

FIG. 3D is a horizontal cross-sectional view of the filter in further another exemplary embodiment of the present invention at the conductor layer 3L2 shown in FIGS. 3B and 3C.

FIG. 4B is a vertical cross-sectional view of the filter in further another embodiment of the present invention on the 4B-4B section shown in FIG. 4A.

FIG. 4D is a horizontal cross-sectional view of the filter in further another embodiment of the present invention at the conductor layers 4L2, 4L4, and 4L6 shown in FIGS. 4B and 4C.

FIG. 5E is a horizontal cross-sectional view of the filter in further another embodiment of the present invention at the conductor layers 5L3 shown in FIGS. 5B and 5C.

FIG. 8C is a vertical cross-sectional view of the filter in further another embodiment of the present invention on the 8C-8C section shown in FIG. 8A.

FIG. 9C is a vertical cross-sectional view of the filter in a related art on the 9C-9C section shown in FIG. 9A.

DESCRIPTION OF EMBODIMENTS

Hereinafter, several types of hybrid resonators and high-selective filters based on these resonators disposed in multilayer substrates according to the present invention will be described in details with reference to attached drawings. But, it would be well understood that this description should not be viewed as narrowing the appended claims.

An Exemplary Embodiment

Figure 1A:
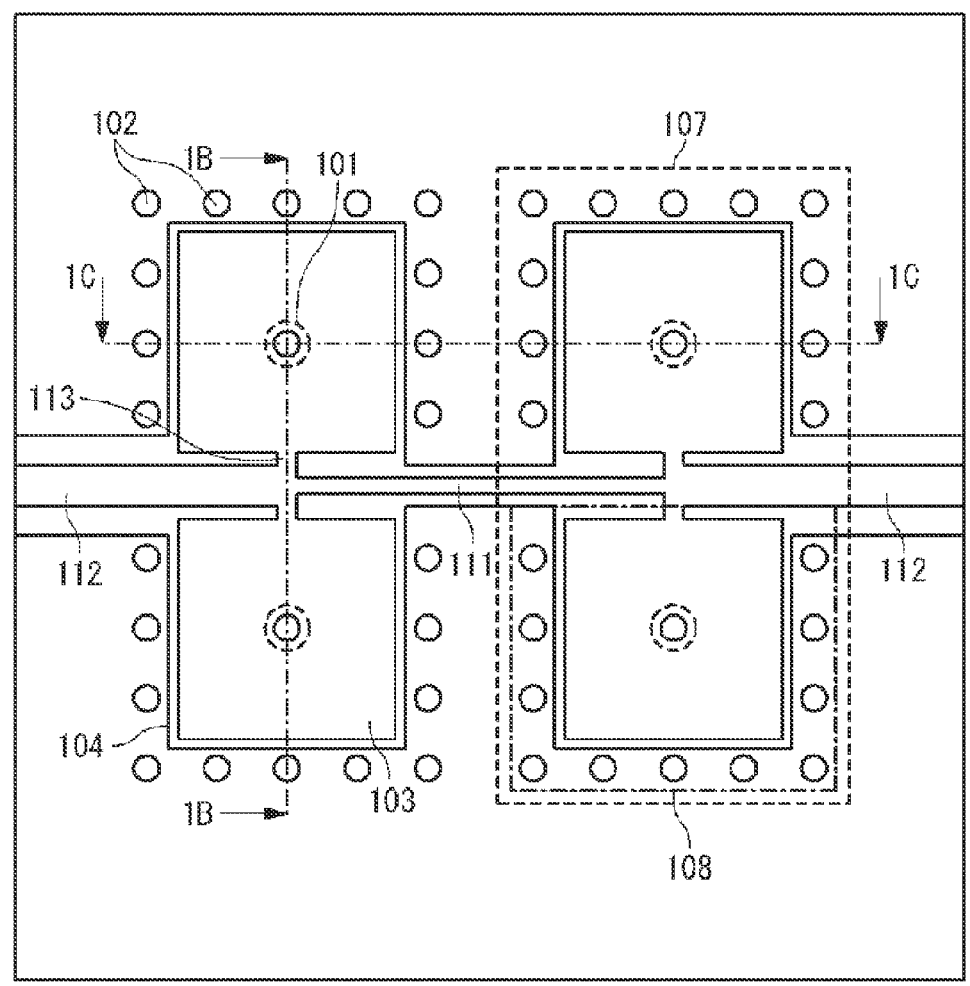
FIG. 1A is a top view of a filter in an exemplary embodiment of the present invention.
Figure 1B:
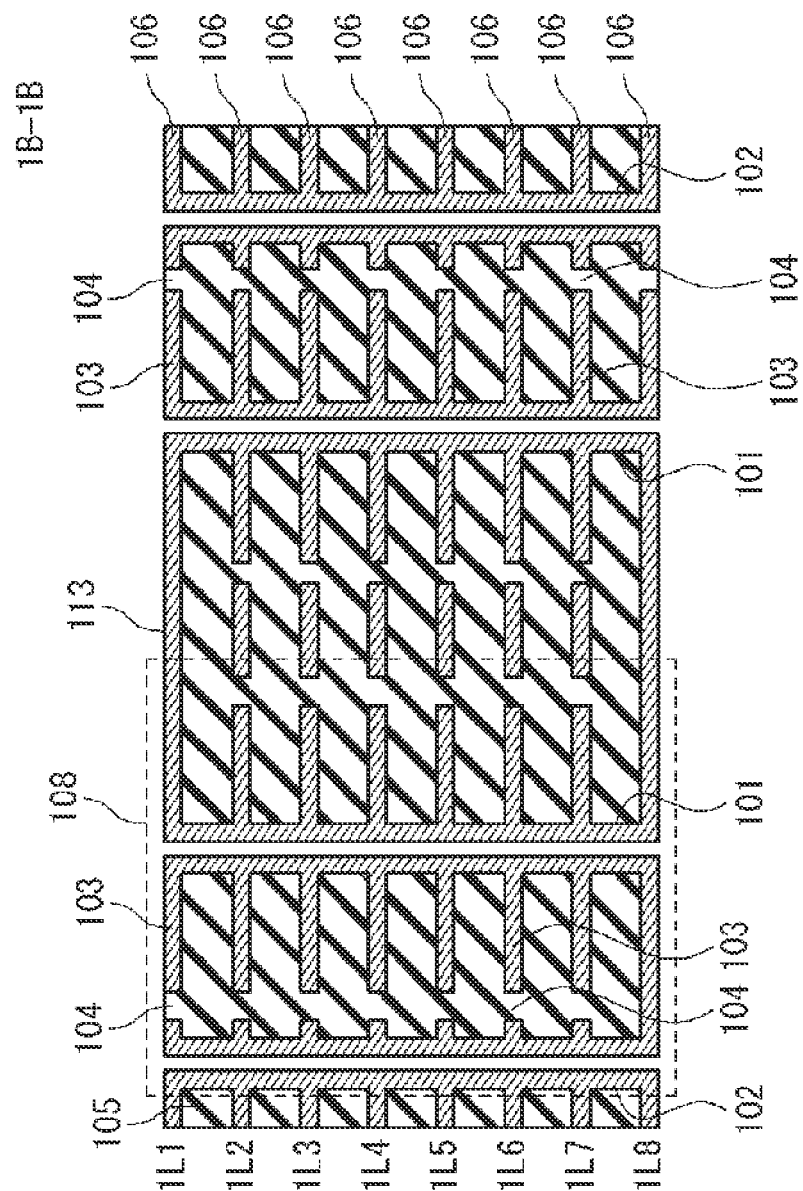
FIG. 1B is a vertical cross-sectional view of the filter in an exemplary embodiment of the present invention on the 1B-1B section shown in FIG. 1A.
Figure 1C:
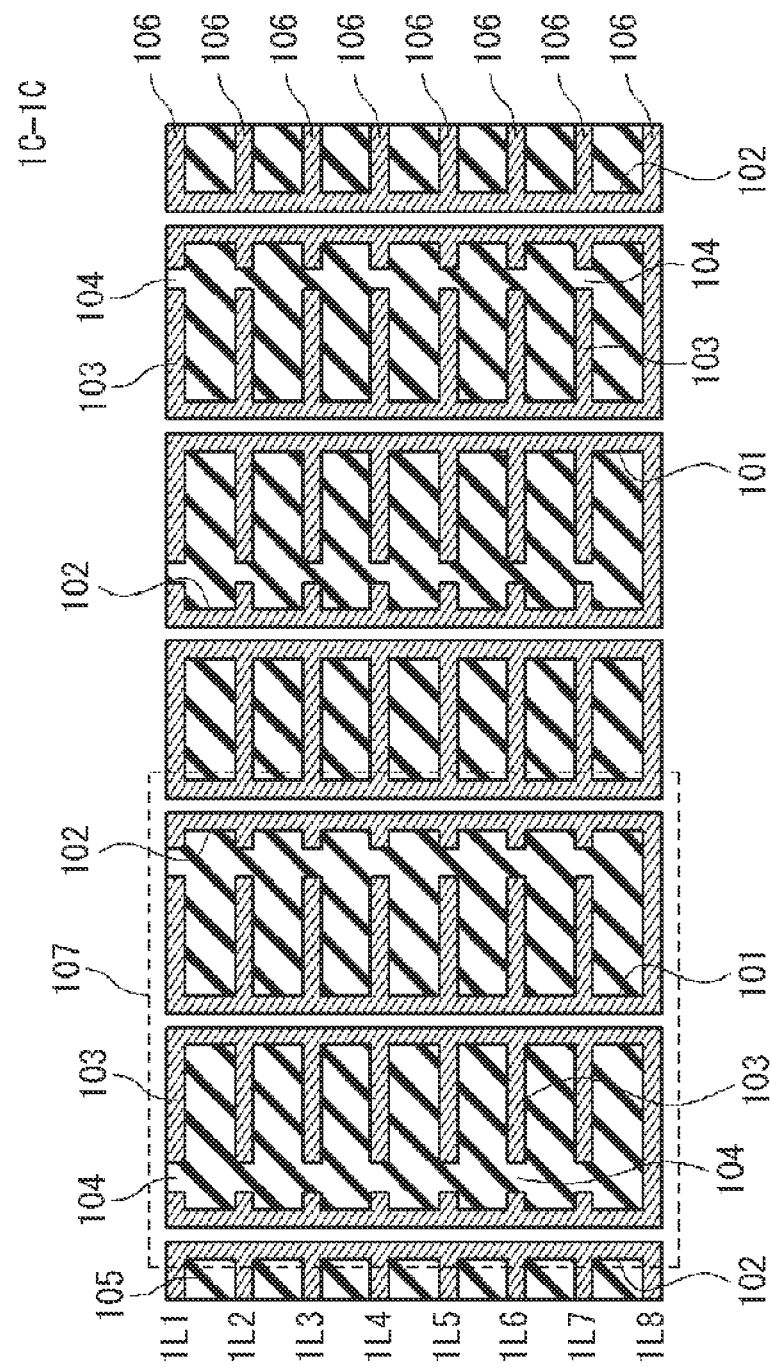
FIG. 1C is a vertical cross-sectional view of the filter in an exemplary embodiment of the present invention on the 1C-1C section shown in FIG. 1A.
Figure 1D:
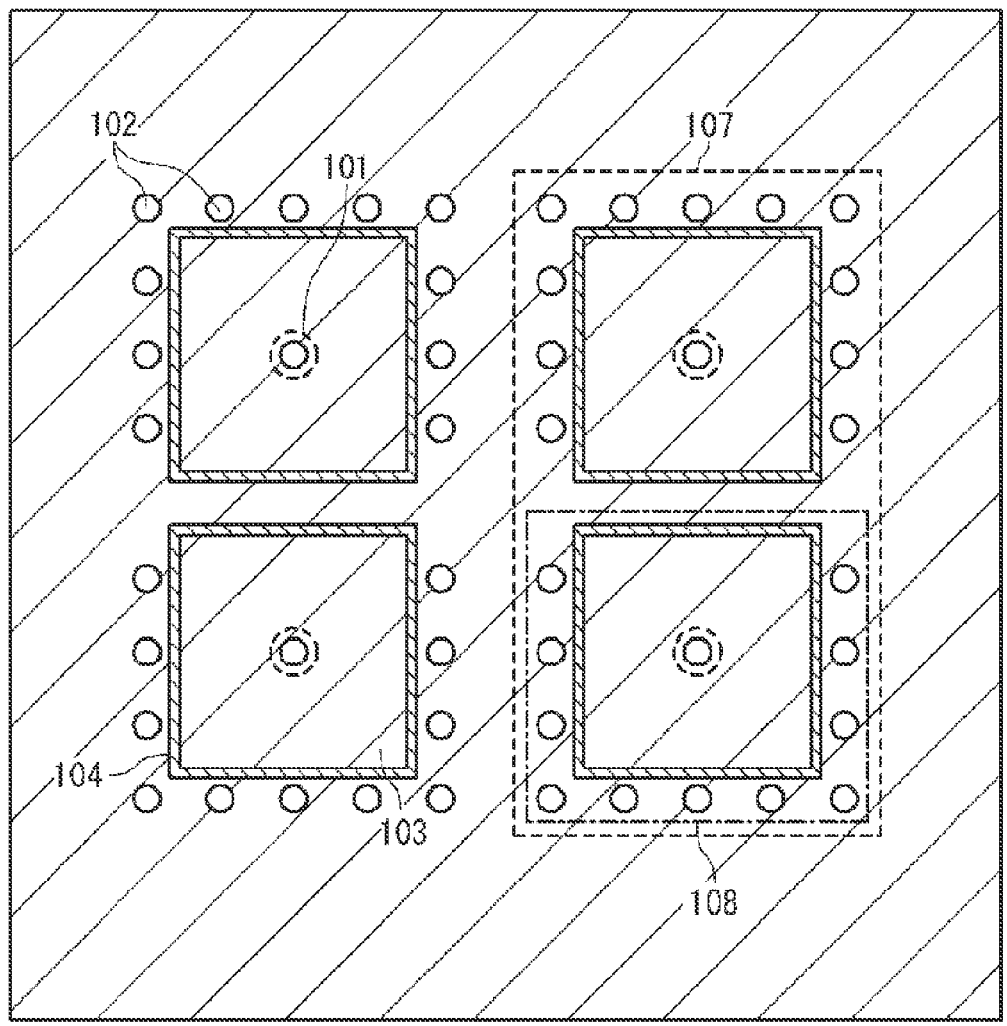
FIG. 1D is a horizontal cross-sectional view of the filter in an exemplary embodiment of the present invention at the conductor layers 1L2, 1L3, 1L4, 1L5, 1L6, and 1L7 shown in FIGS. 1B and 1C.
Figure 1E:
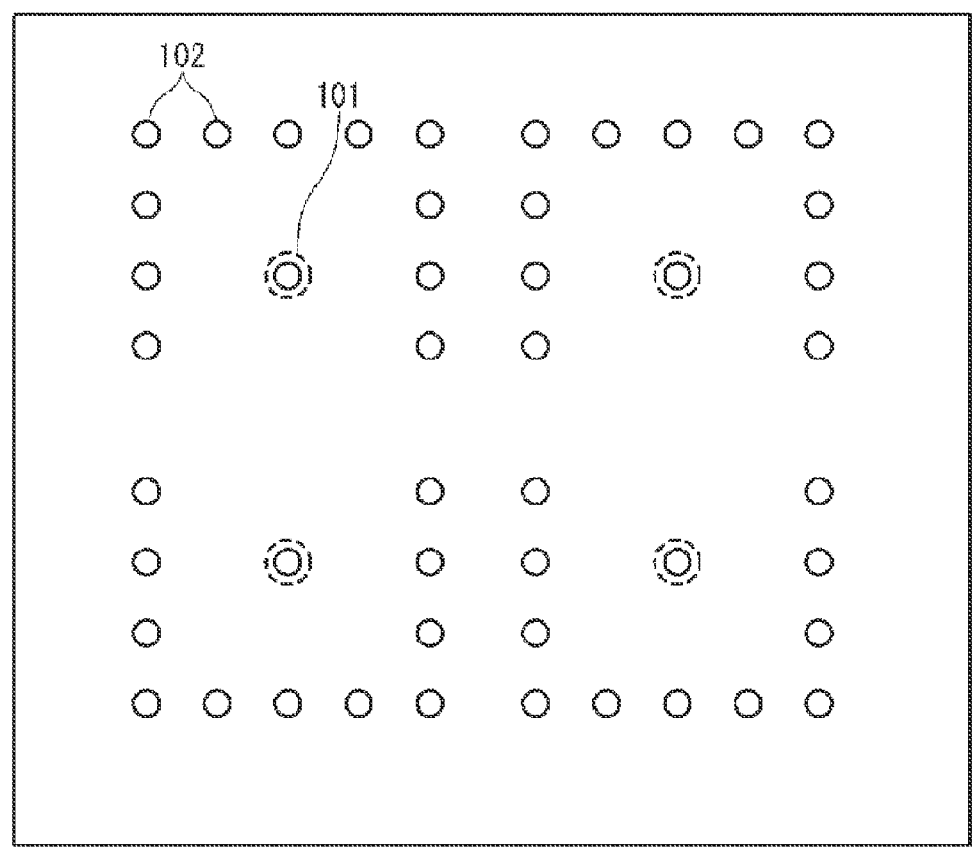
FIG. 1E is a bottom view of the filter in an exemplary embodiment of the present invention shown in FIGS. 1A to 1D.

A filter in an exemplary embodiment of the present invention is shown in FIGS. 1A to 1E. FIG. 1A is a top view of a filter in an exemplary embodiment of the present invention. FIG. 1B is a vertical cross-sectional view of the filter in an exemplary embodiment of the present invention on the 1B-1B section shown in FIG. 1A. FIG. 1C is a vertical cross-sectional view of the filter in an exemplary embodiment of the present invention on the 1C-1C section shown in FIG. 1A. FIG. 1D is a horizontal cross-sectional view of the filter in an exemplary embodiment of the present invention at the conductor layers 1L2, 1L3, 1L4, 1L5, 1L6, and 1L7 shown in FIGS. 1B and 1C. FIG. 1E is a bottom view of the filter in an exemplary embodiment of the present invention shown in FIGS. 1A to 1D.

The filter shown in FIGS. 1A to 1E includes two hybrid resonators 107. Each hybrid resonator 107 is designed vertically in a same multilayer substrate. The multilayer substrate includes eight conductor layers 1L1 to 1L8 and a dielectric material 105 isolating the conductor layers 1L1 to 1L8 from each other. Each of the conductor layers 1L1 to 1L8 includes a ground conductor 106.

An eight-conductor-layer substrate is only an example of multilayer substrates. Number of conductor layers, number of ground conductors, filling dielectric material and other substrate parameters can be different and are defined according to an application.

In the present embodiment, each hybrid resonator 107 includes two same resonant elements 108 and a coupling strip 113 which is formed in the top conductor layer 1L1. Two resonant elements 108 are connected by the coupling strip 113.

In the present embodiment, the top conductor layer 1L1 further includes a connection strip 111 and two microstrip lines 112. The connection strip 111 connects two hybrid resonators 107. One of the microstrip lines 112 is connected by one end to one end of the connection strip 111 which is connected via coupling strips 113 to both conductive plates 103 of one hybrid resonator 107. The other one of the microstrip lines 112 is connected by one end to the other end of the connection strip 111 which is connected via coupling strips 113 to both conductive plates 103 of the other hybrid resonator 107.

Each resonant element 108 includes a signal via 101, a group of ground vias 102 and an artificial dielectric. The signal via 101 is disposed through the multilayer substrate. The group of the ground vias 102 is disposed through the multilayer substrate, surrounding the signal via 101 and the artificial dielectric and connected to the ground conductor 106 at each of the conductor layer 1L1 to 1L8. The artificial dielectric is disposed in the multilayer substrate and between the signal via 101 and the group of the ground vias 102.

The artificial dielectric includes a plurality of conductive plates 103 and a plurality of isolating slits 104. Among the conductive plates 103, one is disposed in the top conductor layer 1L1 and others are disposed in other conductor layers 1L2 to 1L7. Among the isolating slits 104, one is disposed in the top conductor layer 1L1 and others are disposed in other conductor layers 1L2 to 1L7. In each of the conductor layers 1L1 to 1L7, the conductive plate 103 is connected to the signal via 101 and isolated from the ground conductor 106 by the isolating slit 104.

In each resonant element 108 of this embodiment, the signal via 101 is short-circuited at the bottom conductor layer 1L8.

The resonant frequency $f_{res}$ of the resonant element 108 is defined as in a short-circuited stub formed in the vertical direction under the coupling strip 113 as a segment of a specific coaxial waveguide obtained by the signal via 101 and ground vias 102, conjointly, by the following equation.

$$f_{res} = \frac{n \cdot c}{4 \cdot \sqrt{\kappa_{eff} \cdot l_{res}}}$$

where:

$n$ = an integer number $c$ = the velocity of light in free space $l_{res}$ = the length of the resonant element in the vertical direction $\kappa_{eff}$ = the effective permittivity of artificial dielectric Here, $l_{res}$ is the length of the resonant element in the vertical direction, defined as the distance between the bottom side of the coupling strip and the top side of the conductor layer to which the signal via is connected.

In present embodiment, the resonant frequency $f_{res}$ of each resonant element 108 is the same. And, the use of such elements as a coupled pair gives a considerable increase of the Q-factor of the hybrid resonator obtained as a result.

The filter shown in FIGS. 1A to 1E includes two hybrid resonators 107 joined by the connection strip 111 which plays an important role in controlling the filter in-band performance which is strongly dependent on the connection strip 111 impedance. In this filter, microstrip lines 112 connected to the coupling strips 113 of the hybrid resonators 107 serve as terminals.

It should be emphasized that presented connection method of the hybrid resonator 107 and terminals 112 is an important point of the filter providing its high Q-factor. Each resonant element 108 has its own resonant frequencies which can be defined by its length and the effective permittivity of artificial dielectric. Note that in the present embodiment the effective permittivity is dependent on dimensions of the conductive plates 103 and isolating slits 104.

Thus, resonant frequencies $f_{res}$ of the resonant elements 108 can be same or different by forming respectively symmetrical or asymmetrical hybrid resonator type.

Another Exemplary Embodiment

Figure 2A:
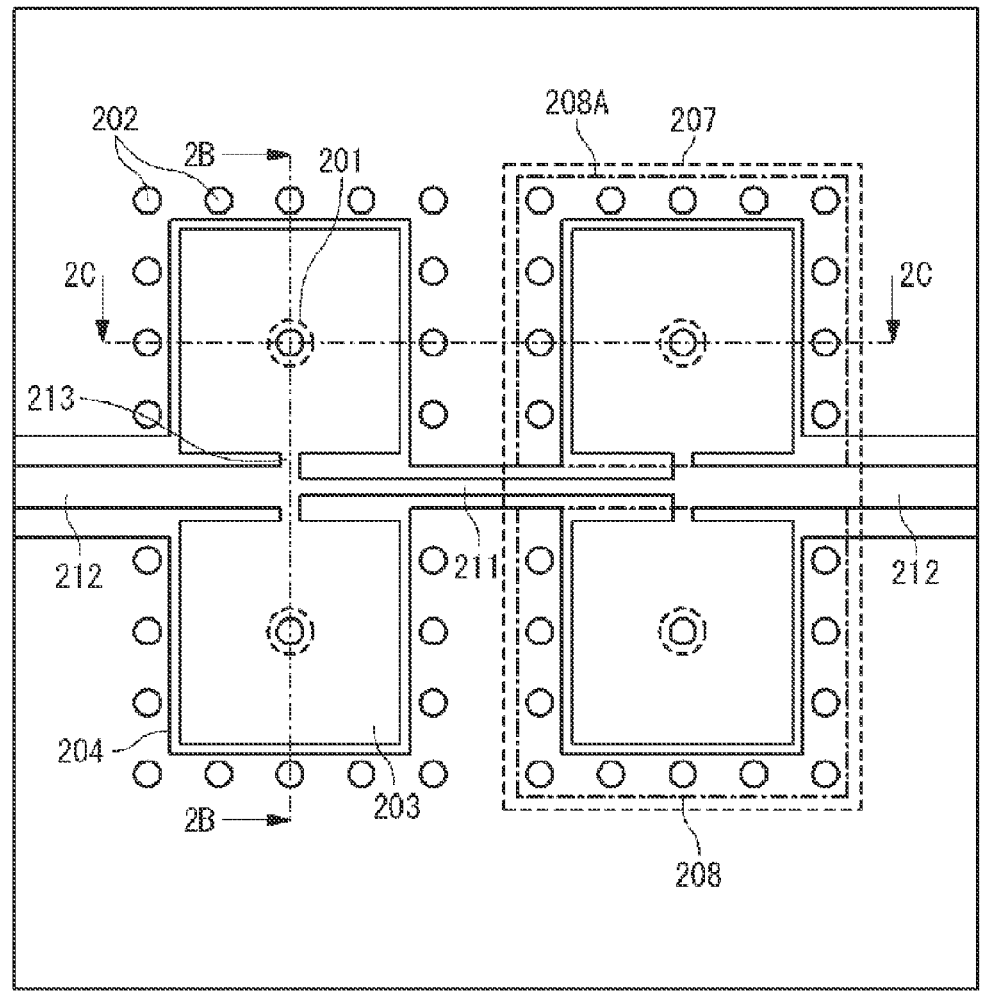
FIG. 2A is a top view of a filter in another exemplary embodiment of the present invention.
Figure 2B:
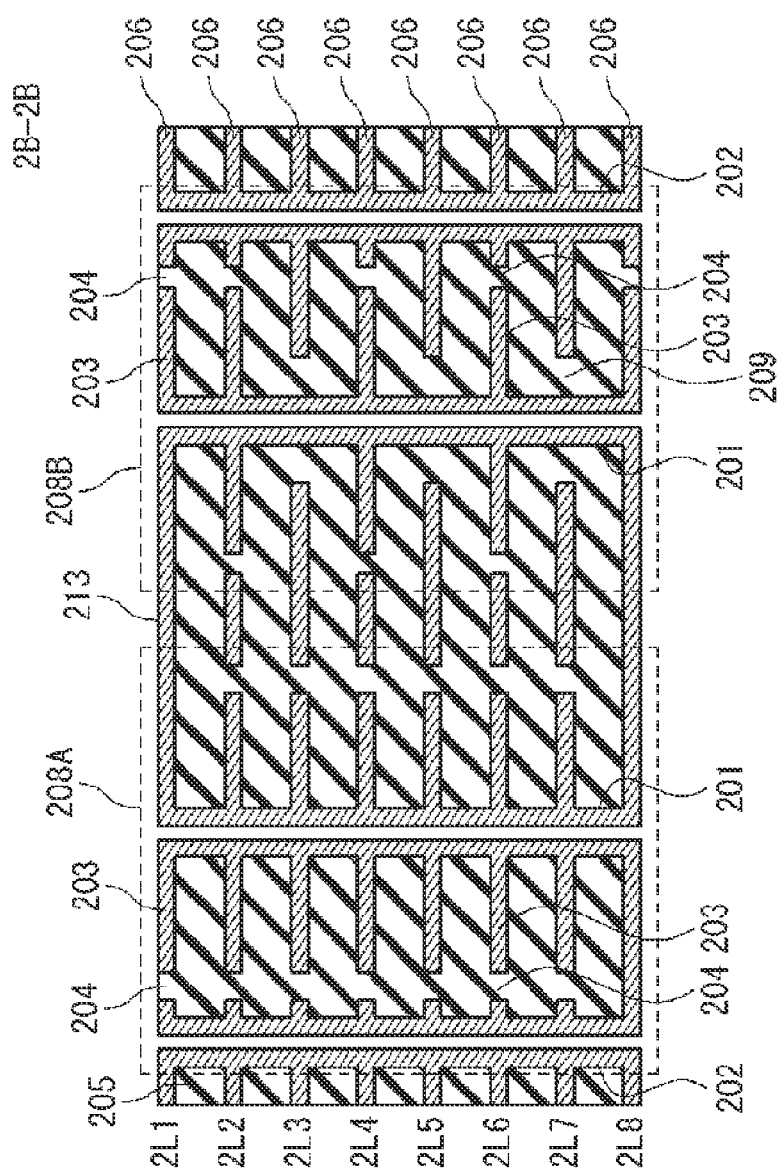
FIG. 2B is a vertical cross-sectional view of the filter in another exemplary embodiment of the present invention on the 2B-2B section shown in FIG. 2A.
Figure 2C:
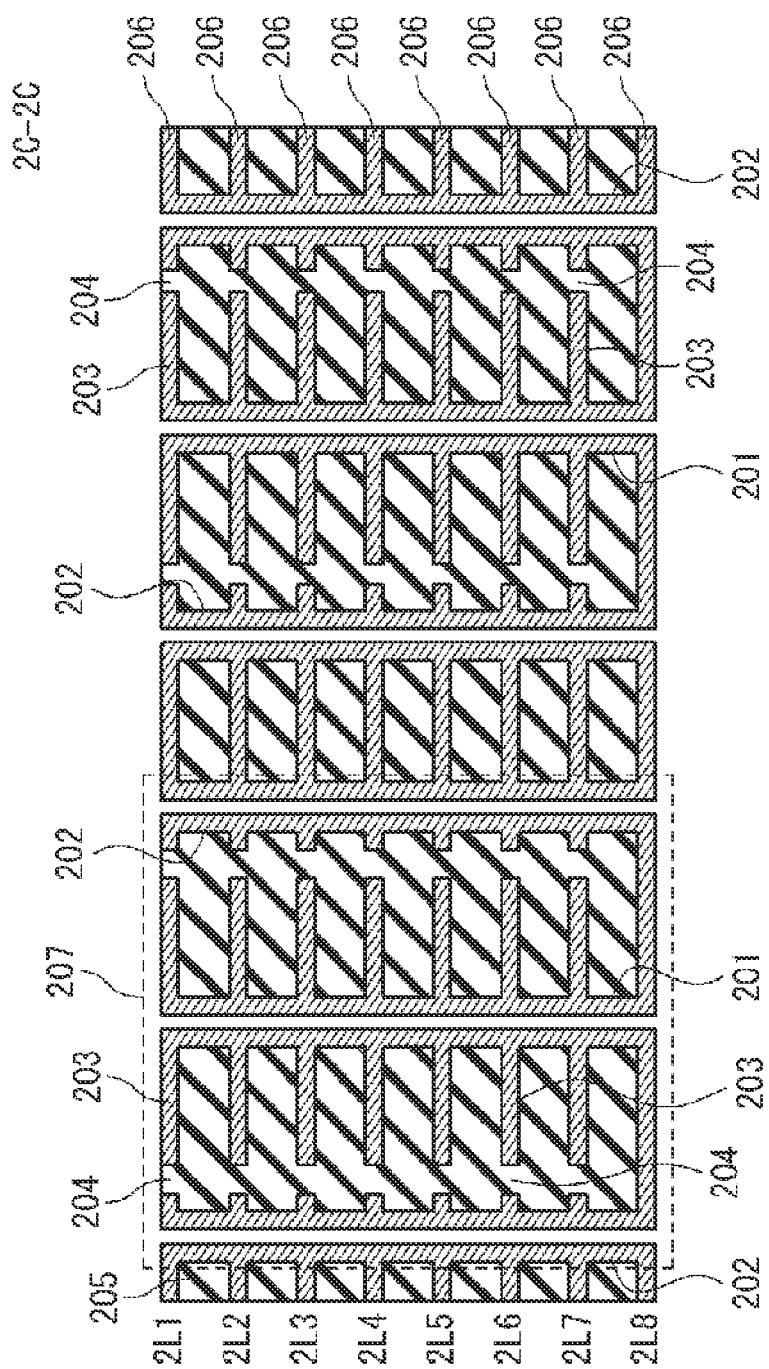
FIG. 2C is a vertical cross-sectional view of the filter in another exemplary embodiment of the present invention on the 2C-2C section shown in FIG. 2A.
Figure 2D:
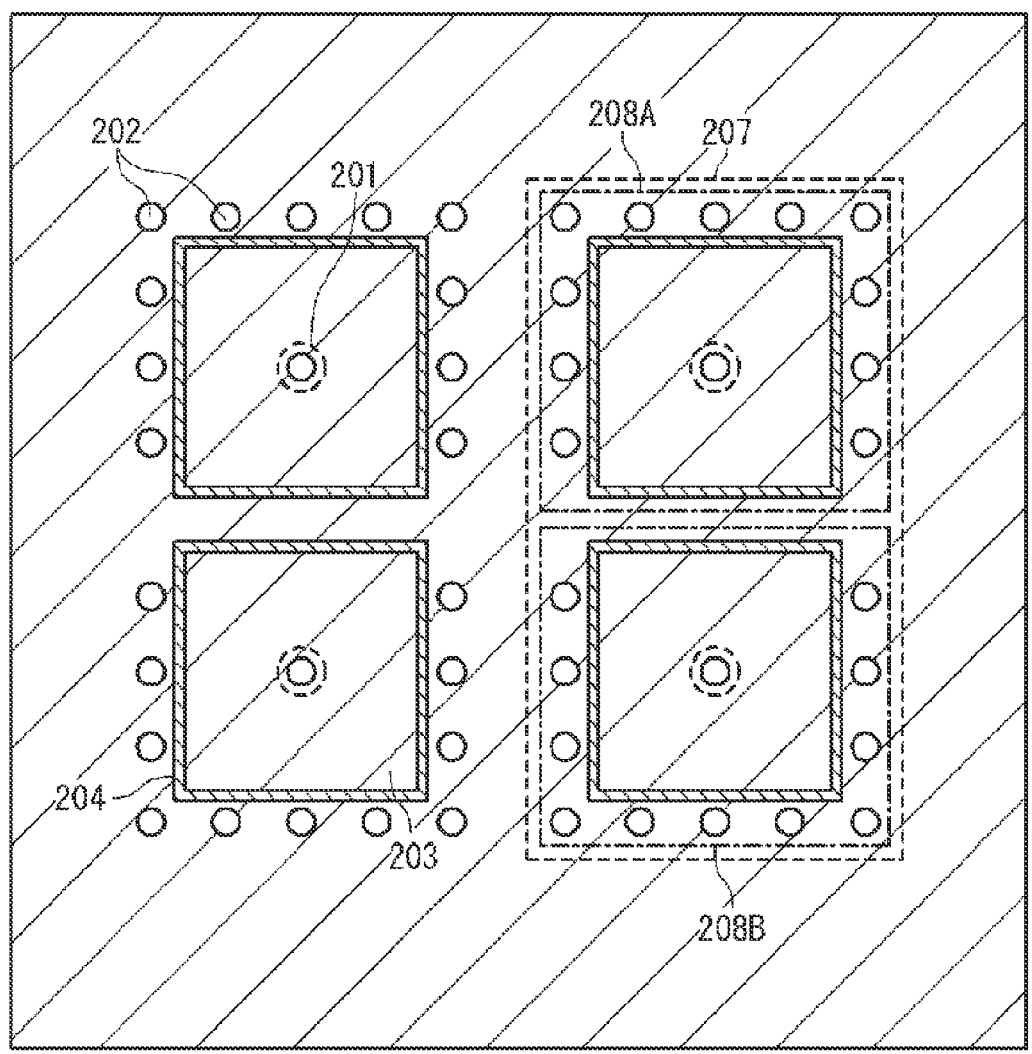
FIG. 2D is a horizontal cross-sectional view of the filter in another exemplary embodiment of the present invention at the conductor layers 2L2, 2L4, and 2L6 shown in FIGS. 2B and 2C.
Figure 2E:
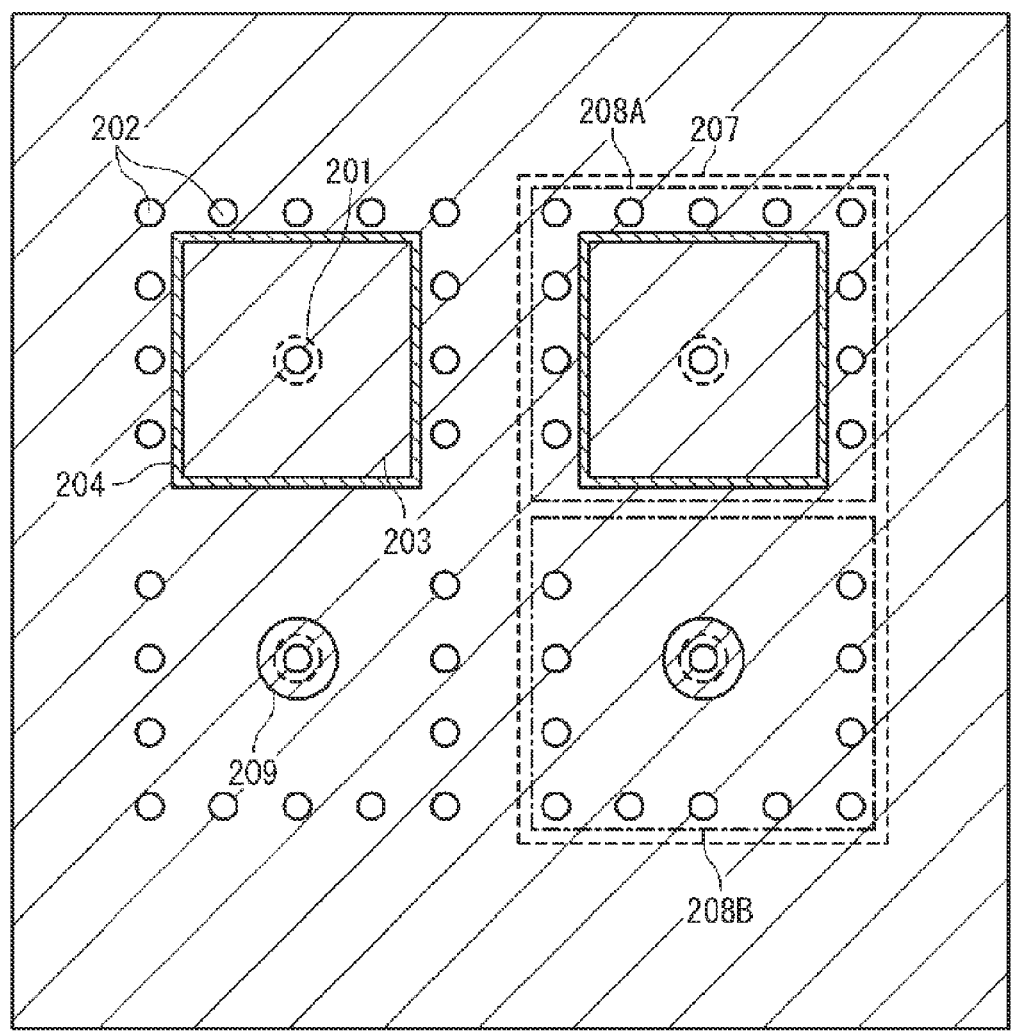
FIG. 2E is a horizontal cross-sectional view of the filter in another exemplary embodiment of the present invention at the conductor layers 2L3, 2L5, and 2L7 shown in FIGS. 2B and 2C.
Figure 2F:
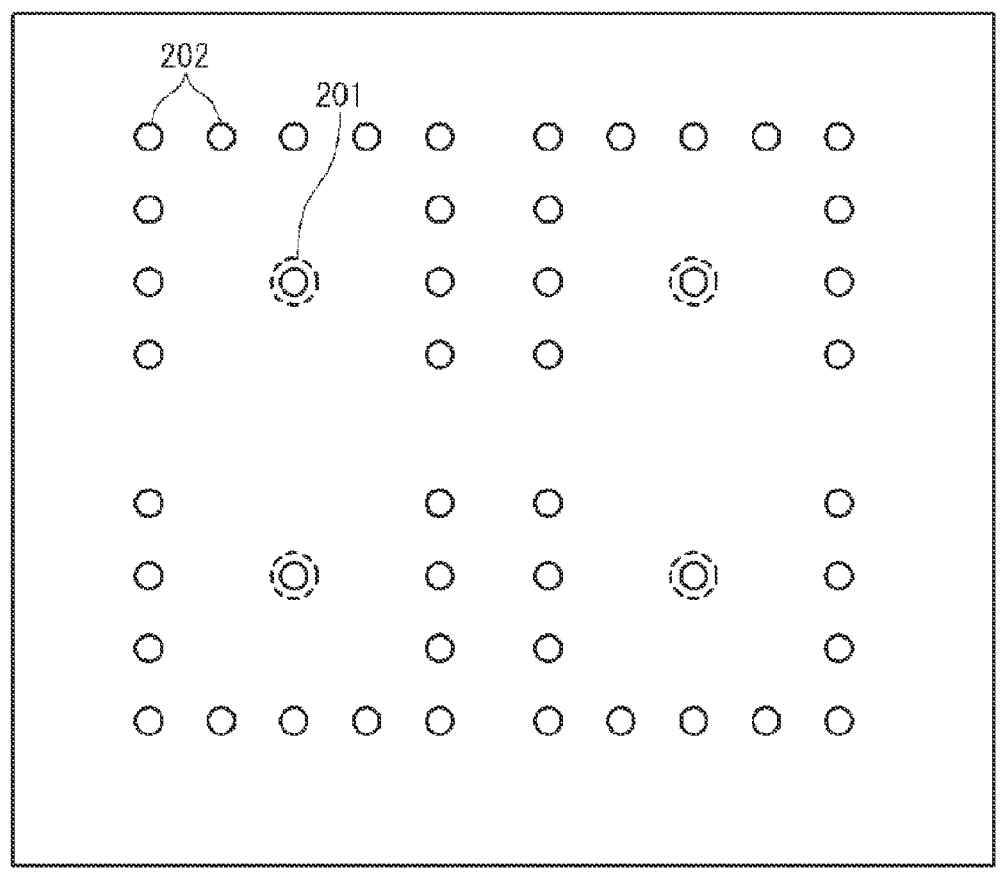
FIG. 2F is a bottom view of the filter in another exemplary embodiment of the present invention shown in FIGS. 2A to 2E.

A filter in another exemplary embodiment of the present invention is shown in FIGS. 2A to 2F. FIG. 2A is a top view of a filter in another exemplary embodiment of the present invention. FIG. 2B is a vertical cross-sectional view of the filter in another exemplary embodiment of the present invention on the 2B-2B section shown in FIG. 2A. FIG. 2C is a vertical cross-sectional view of the filter in another exemplary embodiment of the present invention on the 2C-2C section shown in FIG. 2A. FIG. 2D is a horizontal cross-sectional view of the filter in another exemplary embodiment of the present invention at the conductor layers 2L2, 2L4, and 2L6 shown in FIGS. 2B and 2C. FIG. 2E is a horizontal cross-sectional view of the filter in another exemplary embodiment of the present invention at the conductor layers 2L3, 2L5, and 2L7 shown in FIGS. 2B and 2C. FIG. 2F is a bottom view of the filter in another exemplary embodiment of the present invention shown in FIGS. 2A to 2E.

The filter shown in FIGS. 2A to 2F includes two hybrid resonators 207. Each hybrid resonator 207 is designed vertically in a same multilayer substrate. The multilayer substrate is provided with a plurality of conductor layers 2L1 to 2L8. Each of those conductor layers 2L1 to 2L8 includes a ground conductor 206. The multilayer substrate also includes a dielectric material 205 isolating the plurality of ground conductors 206 from each other.

In the present embodiment, each hybrid resonator 207 includes two same resonant elements and a coupling strip 213 which is disposed in the top conductor layer 2L1. Two same resonant elements of the one hybrid resonator 207 are similarly to the resonant element 108 shown in FIGS. 1A to 1E and are connected by the coupling strip 213.

In the present embodiment, the other hybrid resonator 207 includes two different resonant elements 208A and 208B and a coupling strip 213. Two different resonant elements 208A and 208B are connected by the coupling strip 213.

In the present embodiment, the top conductor layer 2L1 further includes a connection strip 211 and two microstrip lines 212. The connection strip 211 connects two hybrid resonators 207. One of the microstrip lines 212 is connected by one end to one end of the connection strip 211 which is connected via coupling strips 213 to both conductive plates 203 of one hybrid resonator 207. The other one of the microstrip lines 212 is connected by one end to the other end of the connection strip 211 which is connected via coupling strips 213 to both conductive plates 203 of the other hybrid resonator 207.

The resonant element 208A is similar to the resonant element 108 shown in FIGS. 1A to 1E, as same as two resonant elements of the one hybrid resonator 207. That is, the resonant element 208A includes a signal via 201, a group of ground vias 202 and a first artificial dielectric. The signal via 201 is disposed through the multilayer substrate. The group of the ground vias 202 is disposed through the multilayer substrate, surrounding the signal via 201 and the first artificial dielectric and connected to the ground conductor 206 at each of conductor layers 2L1 to 2L8. The first artificial dielectric is disposed between the signal via 101 and the group of the ground vias 202.

The first artificial dielectric includes a plurality of conductive plates 203 and a plurality of isolating slits 204. Among the conductive plates 203, one is disposed in the top conductor layer 2L1 and others are disposed in other conductor layers 2L2 to 2L7. Among the isolating slits 204, one is disposed in the top conductor layer 2L1 and others are disposed in other conductor layers 2L2 to 2L7. In each of the conductor layers 2L1 to 2L7, the conductive plate 203 is connected to the signal via 201 and isolated from the ground conductor 206 by the isolating slit 204.

The resonant element 208B is similar to the resonant element 208A, except in the artificial dielectric. That is, the resonant element 208B includes a second artificial dielectric in the place of the first artificial dielectric of the resonant element 208A.

The second artificial dielectric includes a plurality of conductive plates 203, a plurality of isolating slits 204 and a plurality of clearance holes 209. Among the conductive plates 203, one is disposed in the top conductor layer 2L1 and others are disposed in conductor layers 2L2, 2L4 and 2L6. Among the isolating slits 204, one is disposed in the top conductor layer 2L1 and others are disposed in conductor layers 2L2, 2L4 and 2L6. In each of the conductor layers 2L1, 2L2, 2L4 and 2L6, the conductive plate 203 is connected to the signal via 201 and isolated from the ground conductor 206 by the isolating slit 204.

The clearance holes 209 are disposed in conductor layers 2L3, 2L5 and 2L7. In each of the conductor layers 2L3, 2L5 and 2L7, the signal via 201 is isolated from the ground conductor 206 by the clearance hole 209.

In each resonant element of this embodiment, the signal via 201 is short-circuited at the bottom conductor layer 2L8.

A method to form artificial dielectric in the present embodiment is well suitable for asymmetrical type of hybrid resonators in which the effective permittivity of the artificial dielectrics filling in the resonant elements are different and, as a result, their own frequencies are also different.

If there is a difference between effective permittivities of artificial dielectrics in resonant elements, then a higher Q-factor of a hybrid resonator can be obtained. Also, in this case, the resonant frequency of the hybrid resonator $f_{res,g}$ can be approximately defined as the following equation.

$$f_{res,g} = \sqrt{f_1 \cdot f_2}$$

Here, $f_1$ and $f_2$ are the resonant frequencies of the first and second resonant elements, respectively.

Further Another Exemplary Embodiment

Figure 3B:
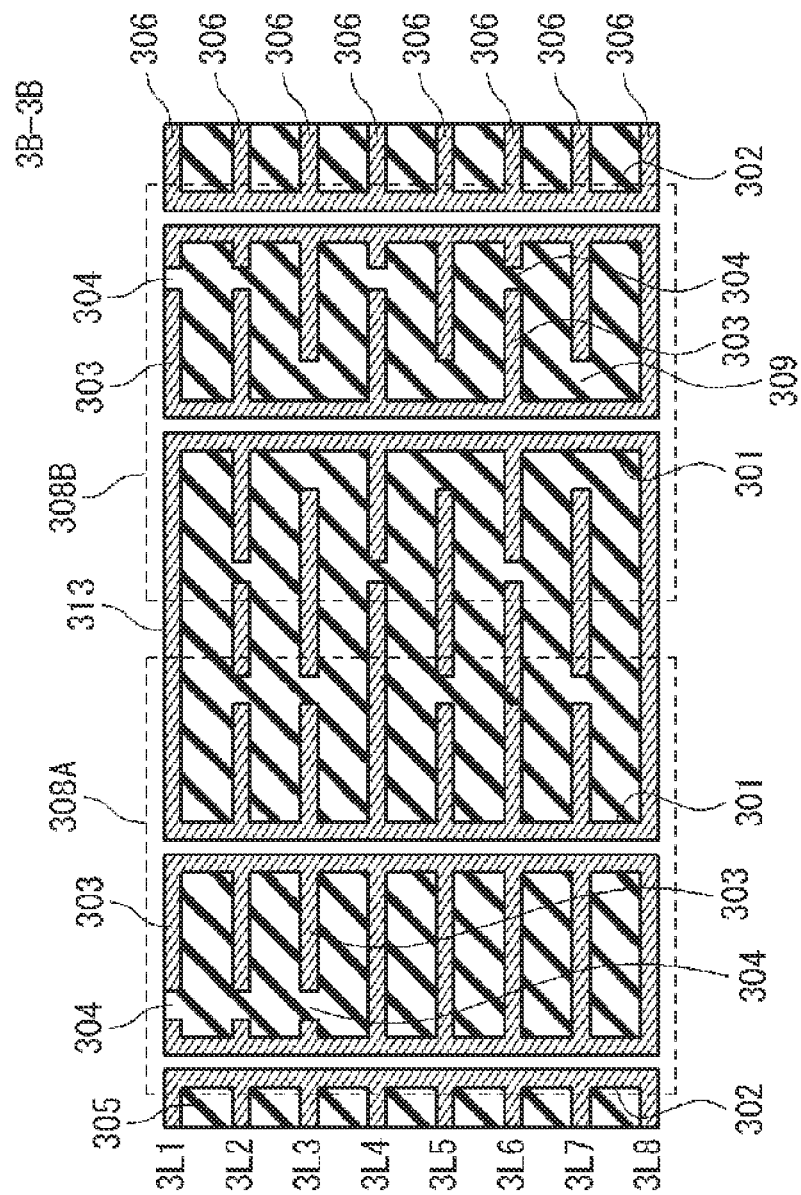
FIG. 3B is a vertical cross-sectional view of the filter in further another exemplary embodiment of the present invention on the 3B-3B section shown in FIG. 3A.
Figure 3E:
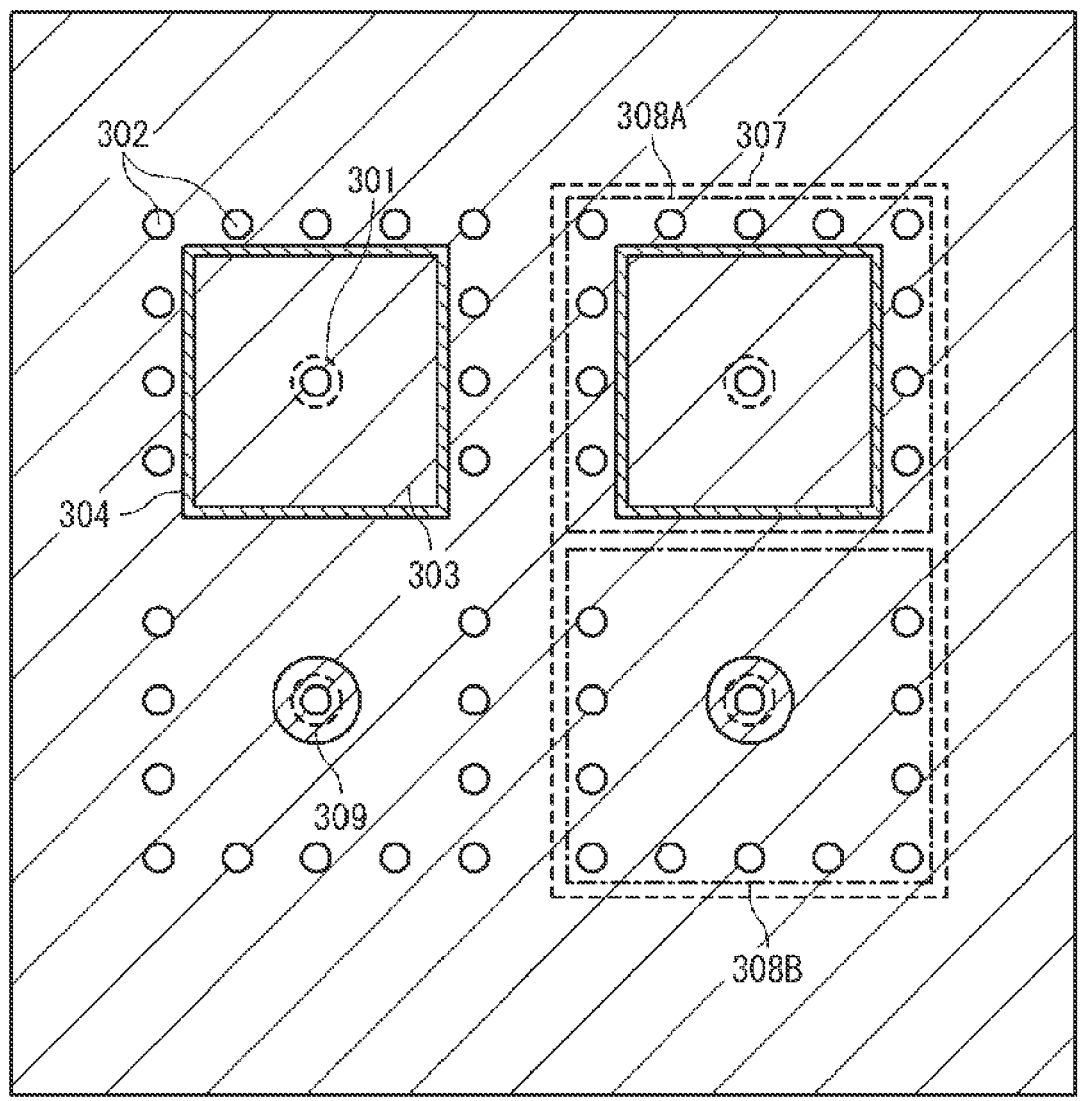
FIG. 3E is a horizontal cross-sectional view of the filter in further another exemplary embodiment of the present invention at the conductor layer 3L3 shown in FIGS. 3B and 3C.
Figure 3F:
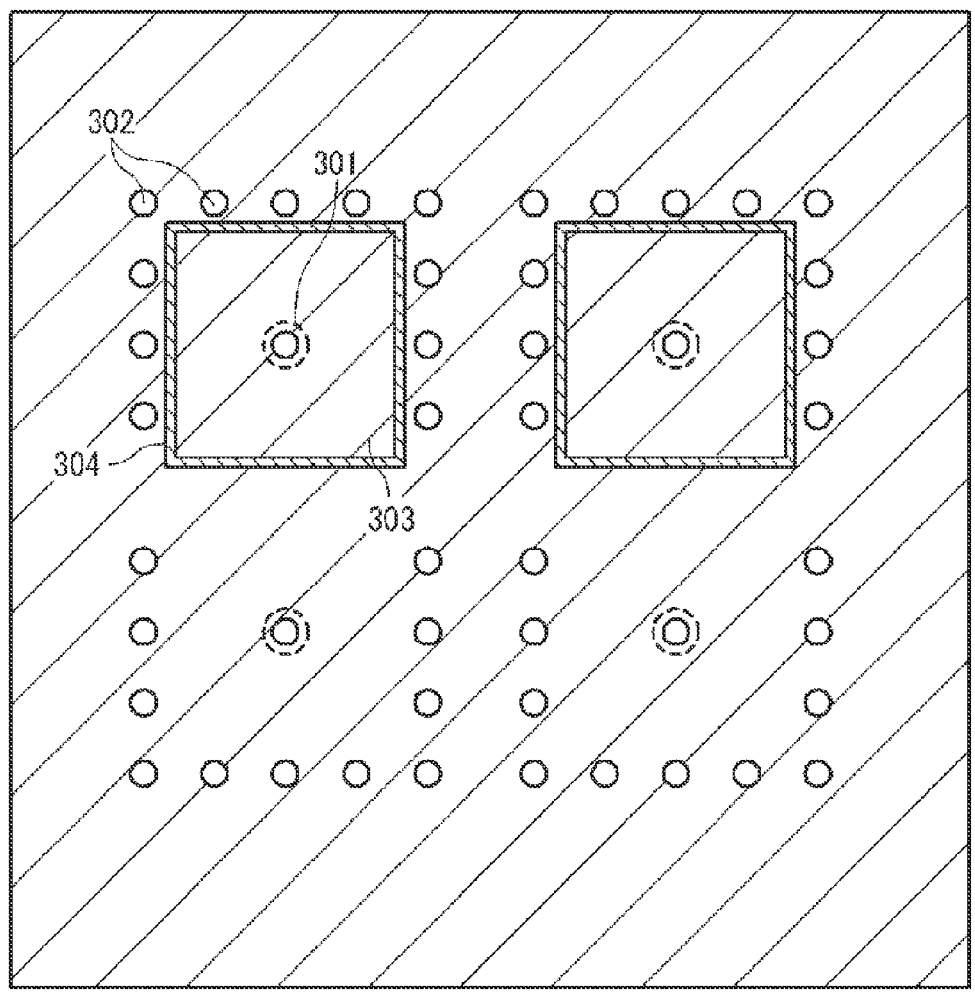
FIG. 3F is a horizontal cross-sectional view of the filter in further another exemplary embodiment of the present invention at the conductor layers 3L4 and 3L6 shown in FIGS. 3B and 3C.
Figure 3G:
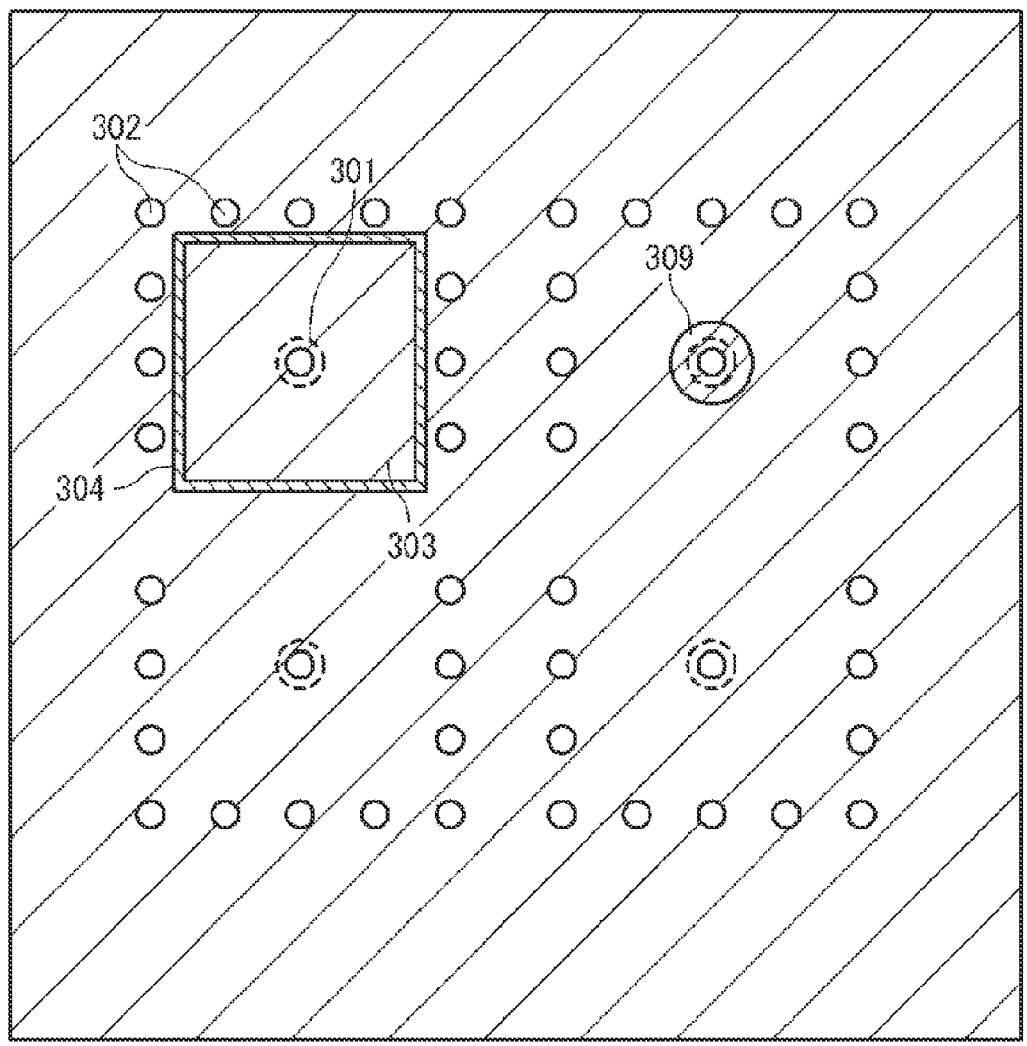
FIG. 3G is a horizontal cross-sectional view of the filter in further another exemplary embodiment of the present invention at the conductor layers 3L5 and 3L7 shown in FIGS. 3B and 3C.
Figure 3H:
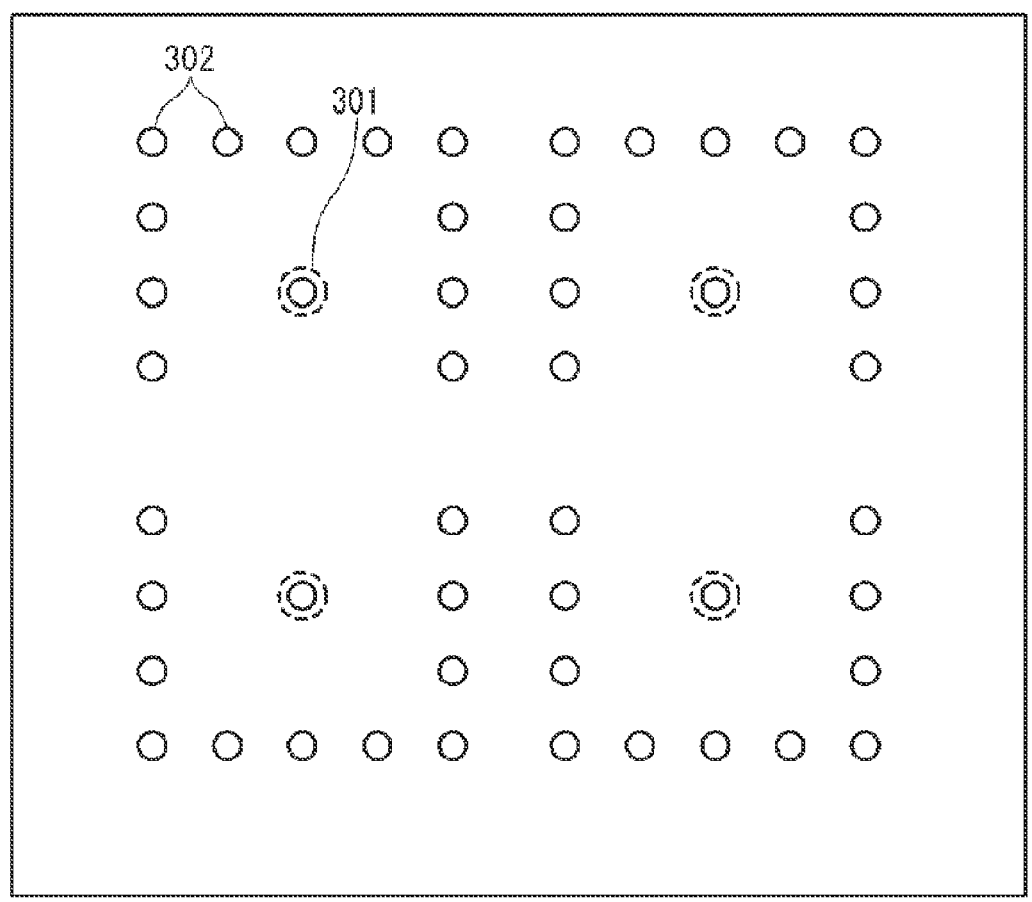
FIG. 3H is a bottom view of the filter shown in FIGS. 3A to 3G.

A filter in further another exemplary embodiment of the present invention is shown in FIGS. 3A to 3H. FIG. 3A is a top view of a filter in further another exemplary embodiment of the present invention. FIG. 3B is a vertical cross-sectional view of the filter in further another exemplary embodiment of the present invention on the 3B-3B section shown in FIG. 3A. FIG. 3C is a vertical cross-sectional view of the filter in further another exemplary embodiment of the present invention on the 3C-3C section shown in FIG. 3A. FIG. 3D is a horizontal cross-sectional view of the filter in further another exemplary embodiment of the present invention at the conductor layer 3L2 shown in FIGS. 3B and 3C. FIG. 3E is a horizontal cross-sectional view of the filter in further another exemplary embodiment of the present invention at the conductor layer 3L3 shown in FIGS. 3B and 3C. FIG. 3F is a horizontal cross-sectional view of the filter in further another exemplary embodiment of the present invention at the conductor layers 3L4 and 3L6 shown in FIGS. 3B and 3C. FIG. 3G is a horizontal cross-sectional view of the filter in further another exemplary embodiment of the present invention at the conductor layers 3L5 and 3L7 shown in FIGS. 3B and 3C. FIG. 3H is a bottom view of the filter shown in FIGS. 3A to 3G.

Similarly to the filters shown in FIGS. 1A to 2F, the filter shown in FIGS. 3A to 3H also is formed in a multilayer substrate having eight conductor layers 3L1 to 3L8 and a dielectric material 305 isolating the conductor layers 3L1 to 3L8 from each other. Each of the conductor layers 3L1 to 3L8 includes a ground conductor 306.

The filter shown in FIGS. 3A to 3H includes two hybrid resonators 307. Each hybrid resonator 307 includes two resonant elements 308A and 308B and a coupling strip 313 connecting the resonant elements 308A and 308B at the top conductor layer 3L1.

In the present embodiment, a big difference between own resonance frequencies of the resonant elements can be obtained due to different structures of artificial dielectrics filling in resonant elements 308A and 308B, and also their different lengths.

Each of resonant elements 308A or 308B includes a signal via 301, a group of ground vias 302 surrounding the signal via 301 and an artificial dielectric. The signal via 301 is disposed through the multilayer substrate. The group of the ground vias 302 is disposed through the multilayer substrate, surrounding the signal via 301 and the artificial dielectric and connected to the ground conductor 306 at each of the conductor layers 3L1 to 3L8. The artificial dielectric is disposed in the multilayer substrate and between the signal via 301 and the group of ground vias 302.

In the resonant element 308A, the artificial dielectric includes a conductive plate 303 and an isolating slit 304 which are disposed at each of conductor layers 3L1, 3L2 and 3L3. At each of the conductor layers 3L1, 3L2 and 3L3, the conductive plate 303 is isolated from the ground conductor 306 by the isolating slit 304. In the resonant element 308A, the signal via 301 is connected to the ground conductors 306 at conductor layers 3L4 to 3L8. The length of the resonant element 308A is from the bottom side of the conductor layer 3L1 to top side of the conductor layer 3L4.

The artificial dielectric in the resonant element 308B includes a group of conductor plates 303 and a group of isolating slits 304 which are arranged at the conductor layer 3L1, 3L2, 3L4, and 3L6. In each of conductor layers 3L1, 3L2, 3L4 and 3L6, the conductor plate 303 is isolated from ground conductor 306 by the isolating slit 304.

The artificial dielectric in the resonant element 308B also includes a group of clearance holes 309 arranged at the conductor layers 3L3, 3L5 and 3L7. In each of conductor layers 3L3, 3L5 and 3L7, the signal via 301 is isolated from the ground conductor 306 by the clearance hole 309.

In the resonant element 308B, the signal via 301 is connected to the ground conductor 306 at the bottom conductor layer 3L8. The length of this resonant element is defined from bottom side of the conductor layer 3L1 to top side of the conductor layer 3L8.

In the hybrid resonator 307 of the present embodiment, the resonant elements 308A and 308B are shorted. In such type of hybrid resonators, a large difference between resonant frequencies of the resonant elements can be provided and, due to this attribute, a high Q-factor of the hybrid resonator can be achieved.

The top conductor layer 3L1 includes coupling strips 313, a connection strip 311 and microstrip lines 312. Coupling strips 313 of hybrid resonators 307 are joined by a connection strip 311 serving as an impedance transformer which can provide required in-band return and insertion losses. Also, microstrip lines 312 serve as terminals of the filter proposed.

Further Another Exemplary Embodiment

Figure 4A:
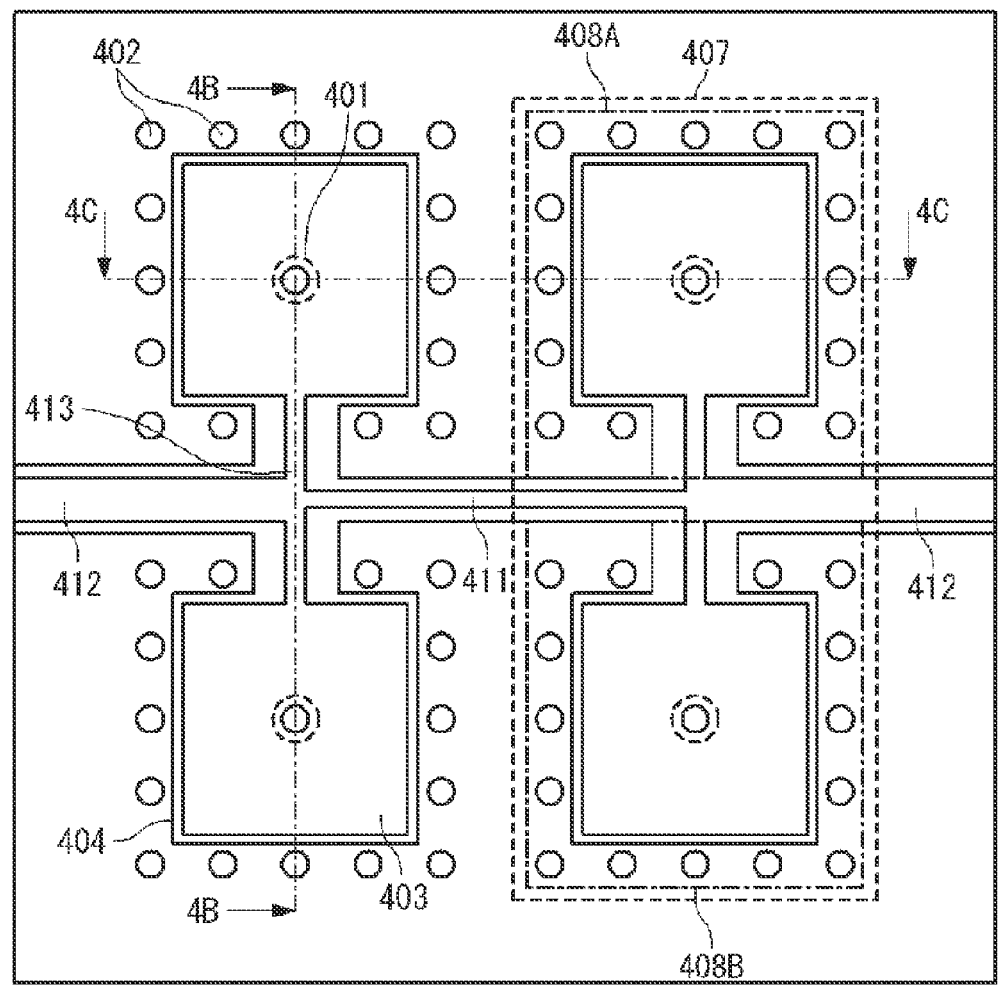
FIG. 4A is a top view of a filter in further another embodiment of the present invention.
Figure 4C:
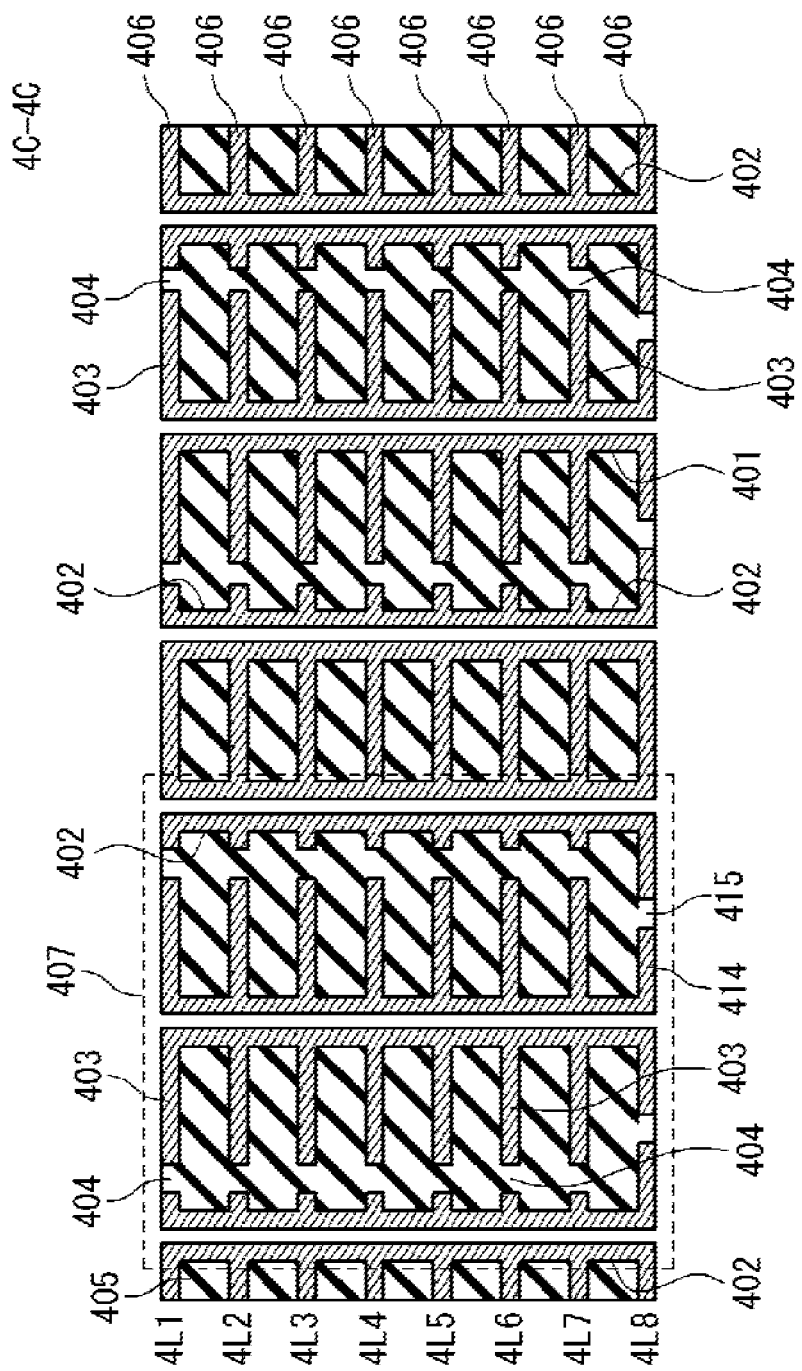
FIG. 4C is a vertical cross-sectional view of the filter in further another embodiment of the present invention on the 4C-4C section shown in FIG. 4A.
Figure 4E:
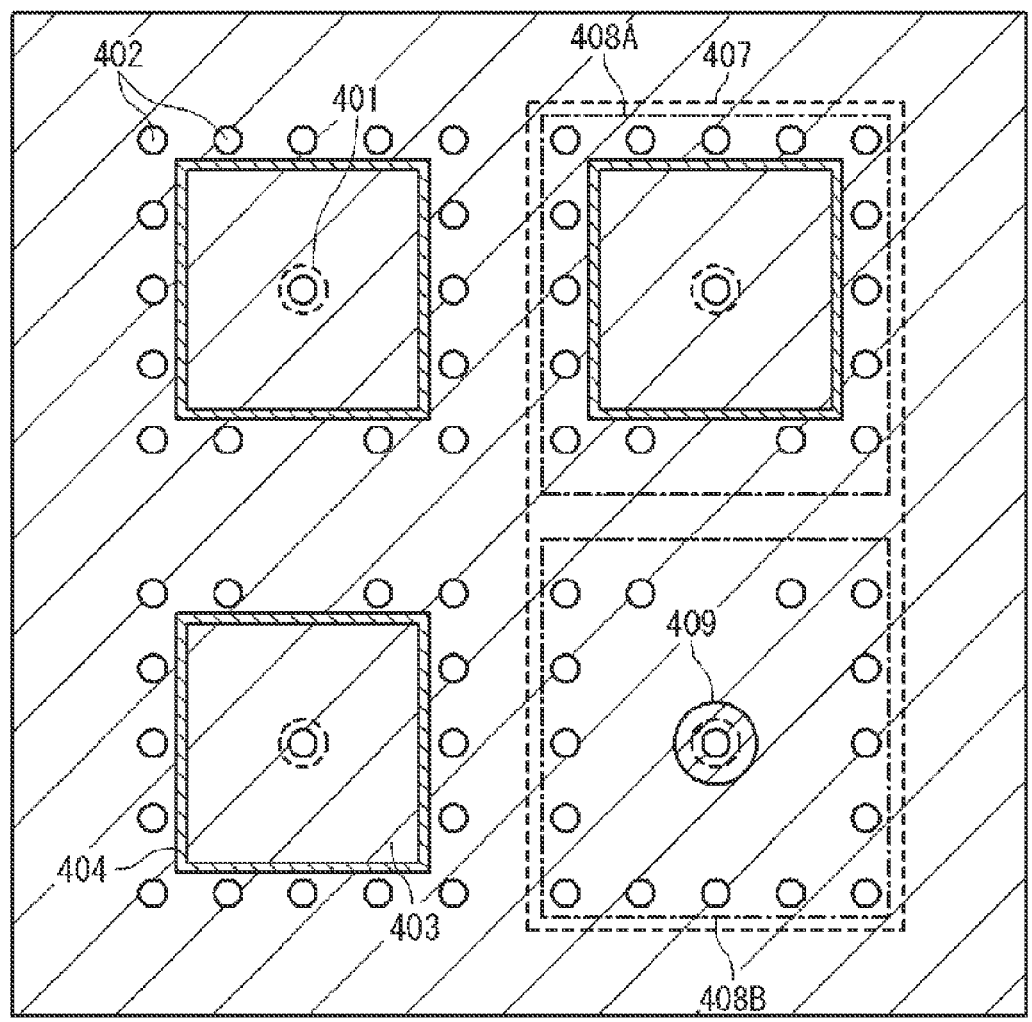
FIG. 4E is a horizontal cross-sectional view of the filter in further another embodiment of the present invention at the conductor layers 4L3, 4L5, and 4L7 shown in FIGS. 4B and 4C.
Figure 4F:
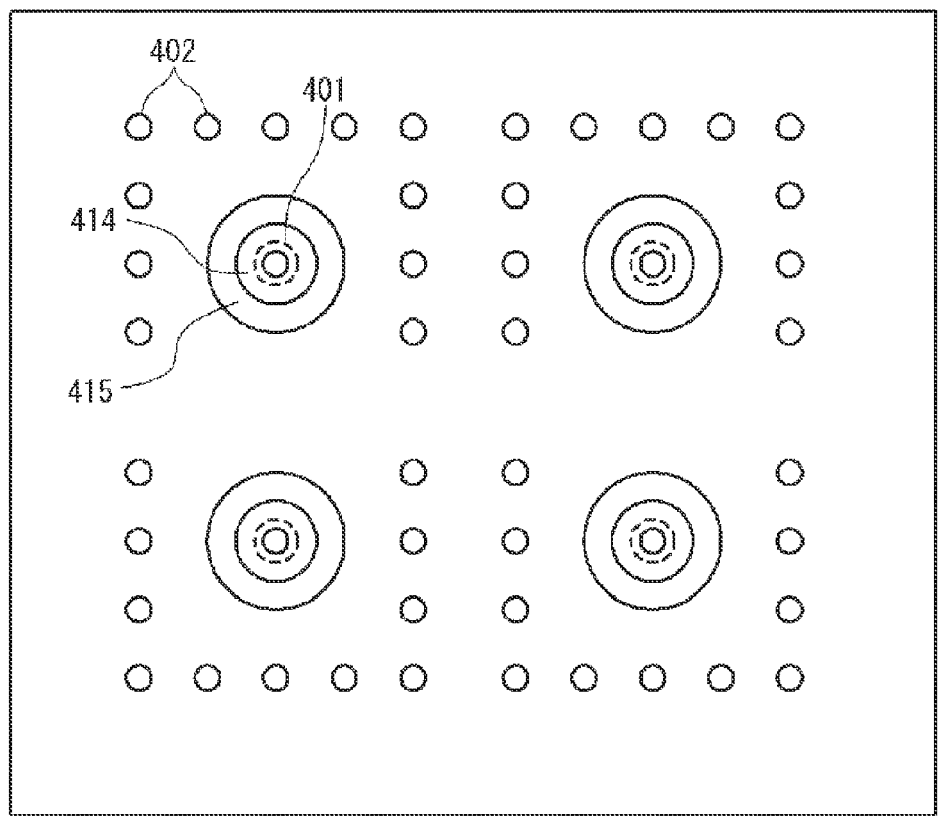
FIG. 4F is a bottom view of the filter in further another embodiment of the present invention shown in FIGS. 4A to 4E.

A filter in further another exemplary embodiment of the present invention is shown in FIGS. 4A to 4F. FIG. 4A is a top view of a filter in further another embodiment of the present invention. FIG. 4B is a vertical cross-sectional view of the filter in further another embodiment of the present invention on the 4B-4B section shown in FIG. 4A. FIG. 4C is a vertical cross-sectional view of the filter in further another embodiment of the present invention on the 4C-4C section shown in FIG. 4A. FIG. 4D is a horizontal cross-sectional view of the filter in further another embodiment of the present invention at the conductor layers 4L2, 4L4, and 4L6 shown in FIGS. 4B and 4C. FIG. 4E is a horizontal cross-sectional view of the filter in further another embodiment of the present invention at the conductor layers 4L3, 4L5, and 4L7 shown in FIGS. 4B and 4C. FIG. 4F is a bottom view of the filter in further another embodiment of the present invention shown in FIGS. 4A to 4E.

Similarly to the filters shown in FIGS. 1A to 3H, the filter shown in FIGS. 4A to 4F also is formed in a multilayer substrate having eight conductor layers 4L1 to 4L8 and a dielectric material 405 isolating the conductor layers 4L1 to 4L8 from each other. Each of the conductor layers 4L1 to 4L8 includes a ground conductor 406.

The filter of the present embodiment includes two hybrid resonators 407. Each hybrid resonator 407 includes two resonant elements 408A and 408B and a coupling strip 413 connecting the resonant elements 408A and 408B at the top conductor layer 4L1.

Each of the resonant elements 408A and 408B includes a signal via 401, a group of ground vias 402 and an artificial dielectric. The signal via 401 is disposed through the multilayer substrate. The group of ground vias 402 is disposed through the multilayer substrate, surrounding the signal via 401 and the artificial dielectric and connected to the ground conductor 406 of each conductor layers 4L1 to 4L8. The artificial dielectric is disposed in the multilayer substrate between the signal via 401 and the group of ground vias 402.

The resonant elements 408A and 408B of the present embodiment are open-circuited. That is, the signal via 401 is isolated from the ground conductor 406 at any of the conductor layers 4L1 to 4L8.

The artificial dielectric of the resonant element 408A includes at each of conductor layers 4L1 to 4L7 a conductor plate 403 and an isolating slit 404 isolating the conductor plate 403 from the ground conductor 406. The artificial dielectric of the resonant element 408B includes at each of conductor layers 4L1, 4L2, 4L4 and 4L6 a conductor plate 403 and an isolating slit 404 isolating the conductor plate 403 from the ground conductor 406. The artificial dielectric of the resonant element 408B includes at each of conductor layers 4L3, 4L5 and 4L7 a clearance hole 409 isolating the signal via 401 from the ground conductor 406. At the bottom conductor layer 4L8, each of the artificial dielectrics 408A and 408B includes a pad 414 connected to the signal via 401 and a clearance hole 415 isolating the pad 414 and the signal via 401 from the ground conductor 406.

The top conductor layer 4L1 includes coupling strips 413, a connection strip 411 and microstrip lines 412. Coupling strips 413 of the hybrid resonators 407 are joined by a connection strip segment 411. Strip segments 412 connected to the coupling strip 413 of the hybrid resonators 407 serve as terminals of the filter presented.

Further Another Exemplary Embodiment

Figure 5A:
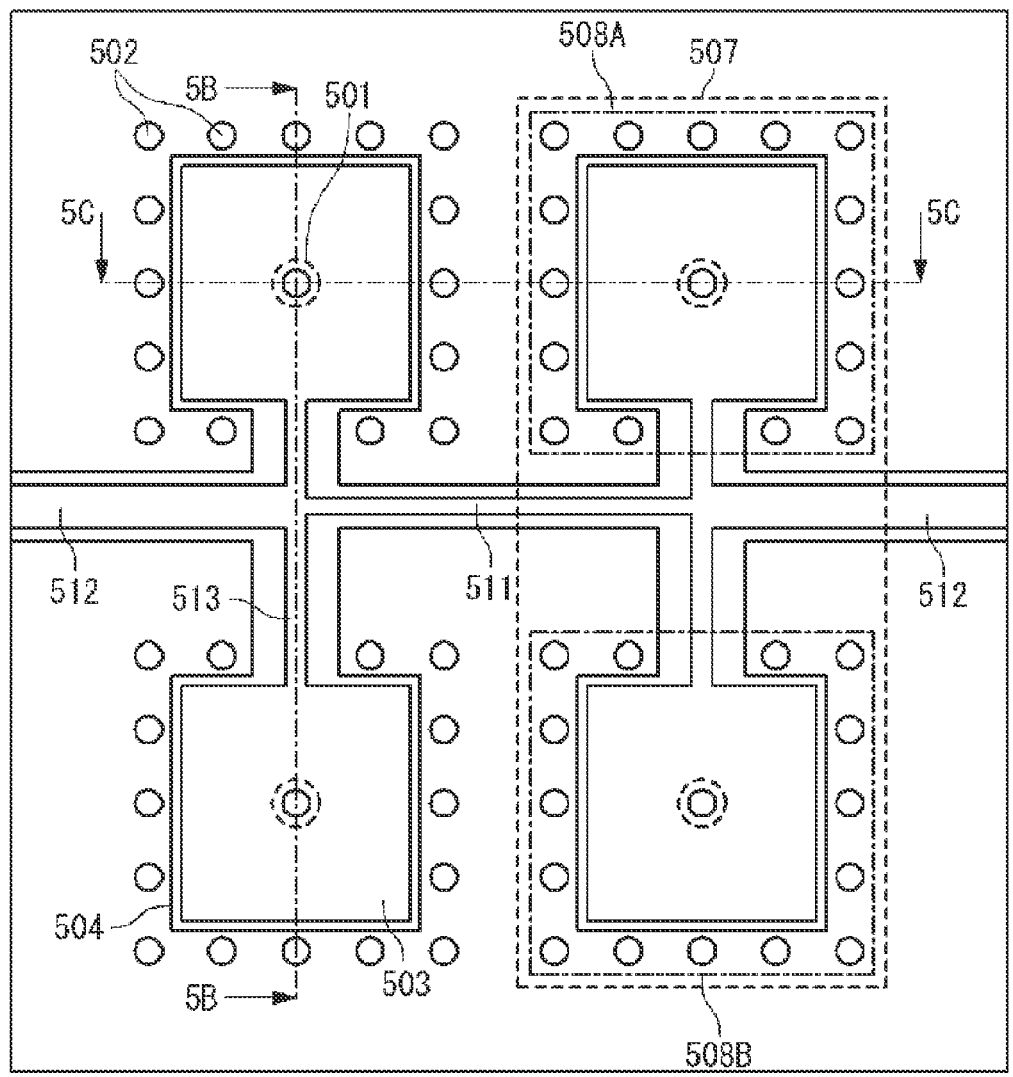
FIG. 5A is a top view of a filter in further another embodiment of the present invention.
Figure 5B:
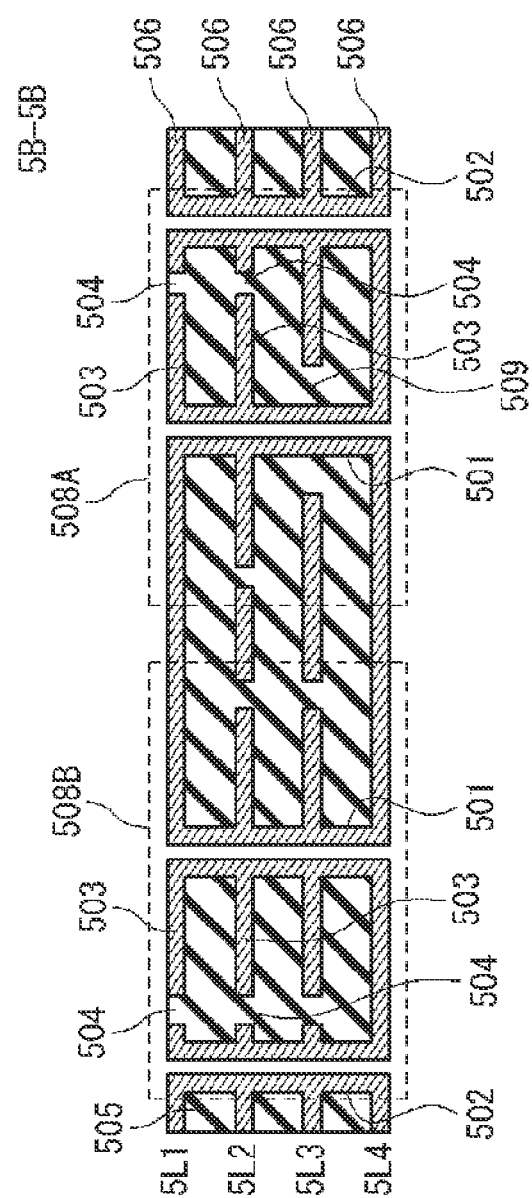
FIG. 5B is a vertical cross-sectional view of the filter in further another embodiment of the present invention on the 5B-5B section shown in FIG. 5A.
Figure 5C:
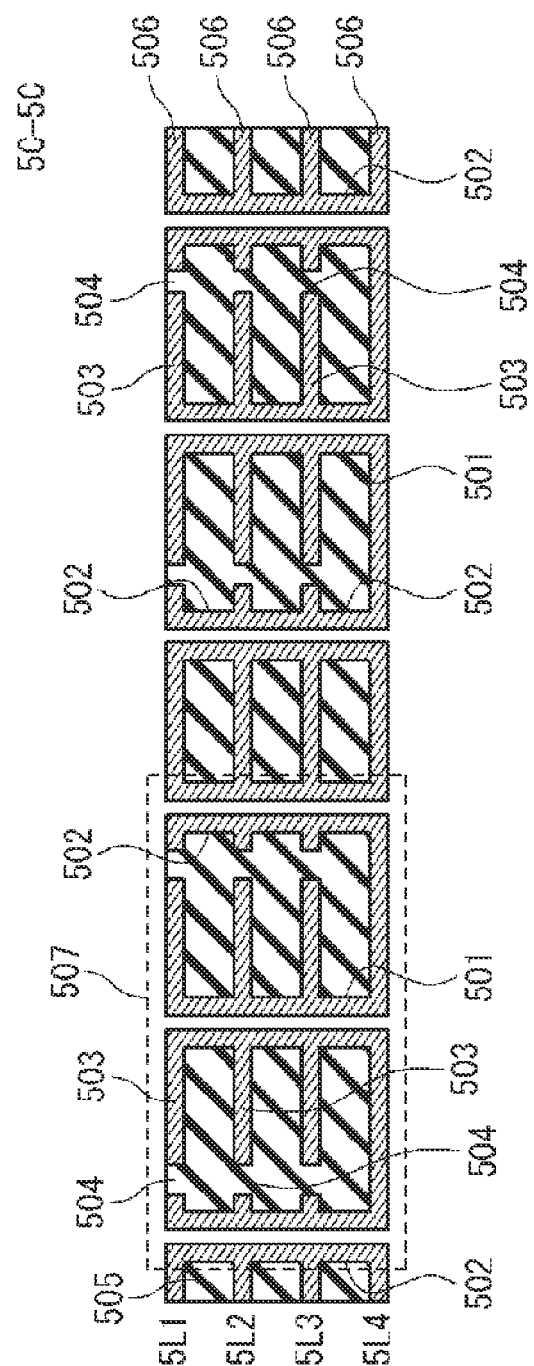
FIG. 5C is a vertical cross-sectional view of the filter in further another embodiment of the present invention on the 5C-5C section shown in FIG. 5A.
Figure 5D:
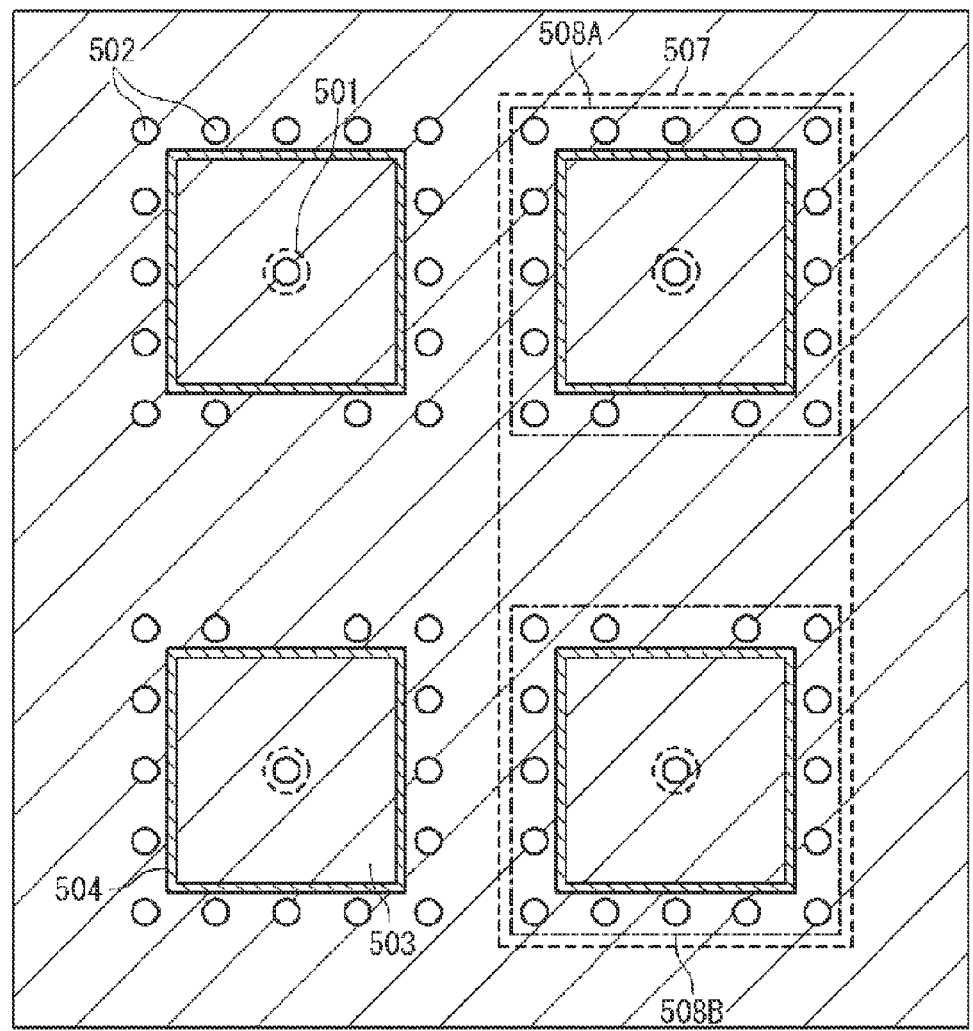
FIG. 5D is a horizontal cross-sectional view of the filter in further another embodiment of the present invention at the conductor layer 5L2 shown in FIGS. 5B and 5C.
Figure 5F:
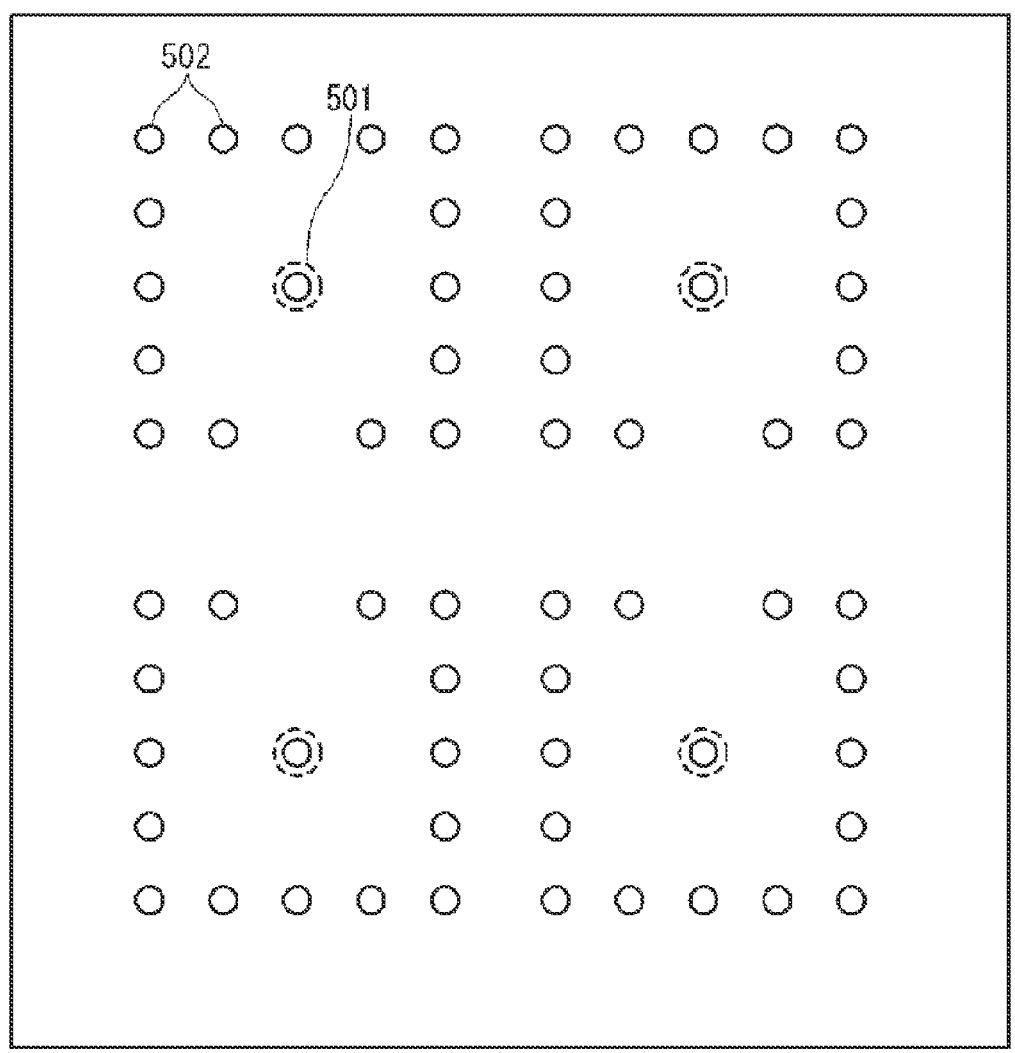
FIG. 5F is a bottom view of the filter in further another embodiment of the present invention shown in FIGS. 5A to 5E.

A filter in further another exemplary embodiment of the present invention is shown in FIGS. 5A to 5F. FIG. 5A is a top view of a filter in further another embodiment of the present invention. FIG. 5B is a vertical cross-sectional view of the filter in further another embodiment of the present invention on the 5B-5B section shown in FIG. 5A. FIG. 5C is a vertical cross-sectional view of the filter in further another embodiment of the present invention on the 5C-5C section shown in FIG. 5A. FIG. 5D is a horizontal cross-sectional view of the filter in further another embodiment of the present invention at the conductor layer 5L2 shown in FIGS. 5B and 5C. FIG. 5E is a horizontal cross-sectional view of the filter in further another embodiment of the present invention at the conductor layers 5L3 shown in FIGS. 5B and 5C. FIG. 5F is a bottom view of the filter in further another embodiment of the present invention shown in FIGS. 5A to 5E.

The filter of the present embodiment is disposed in a multilayer substrate with four conductor layers 5L1 to 5L4 and a dielectric material 505 isolating the conductor layers 5L1 to 5L4 from each other. Each of the conductor layers 5L1 to 5L4 includes a ground conductor 506.

The filter of the present embodiment includes two hybrid resonators 507 disposed in the multilayer substrate. Each of the hybrid resonators 507 includes two resonant elements 508A and 508B and a coupling strip 513 connecting the resonant elements 508A and 508B at the top conductor layer 5L1.

Each of the resonant elements 508A or 508B includes a signal via 501, a group of ground vias 502 and an artificial dielectric. The signal via 501 is disposed through the multilayer substrate. The group of ground vias 502 is disposed through the multilayer substrate and surrounding the signal via 501 and the artificial dielectric. The artificial dielectric is disposed in the multilayer substrate between the signal via 501 and the group of ground vias 502.

The artificial dielectric in the resonant element 508A includes a conductive plate 503 and an isolating slit 504 which are disposed at each of conductor layers 5L1 and 5L2. At each of conductor layers 5L1 and 5L2, the conductive plate 503 is connected to the signal via 501 and isolated from the ground conductor 506 by the isolating slit 504. The artificial dielectric in the resonant element 508A also includes a clearance hole 509 and the ground conductor 506 at the conductor layer 5L3. At the conductor layer 5L3, the signal via 501 is isolated from the ground conductor 506 by the clearance hole 509.

The artificial dielectric in the resonant element 508B includes a conductive plate 503 and an isolating slit 504 which are disposed at each of conductor layers 5L1 to 5L3. At each of conductor layers 5L1 to 5L3, the conductive plate 503 is connected to the signal via 501 and isolated from the ground conductor 506 by the isolating slit 504.

The top conductor layer 5L1 includes coupling strips 513, a connection strip 511 and microstrip lines 512. Coupling strips 513 of the hybrid resonators 507 are joined by a connection strip 511 and, in addition, strip segments 512 connected to the coupling strip 513 serve as terminals of the filter described. In the present embodiment, resonant elements 508A and 508B forming the hybrid resonator 507 are arranged on different distances with respect to a horizontal axis of the strip 511.

Further Another Exemplary Embodiment

A filter according to the present invention can be formed by a different number of hybrid resonators.

Figure 6A:
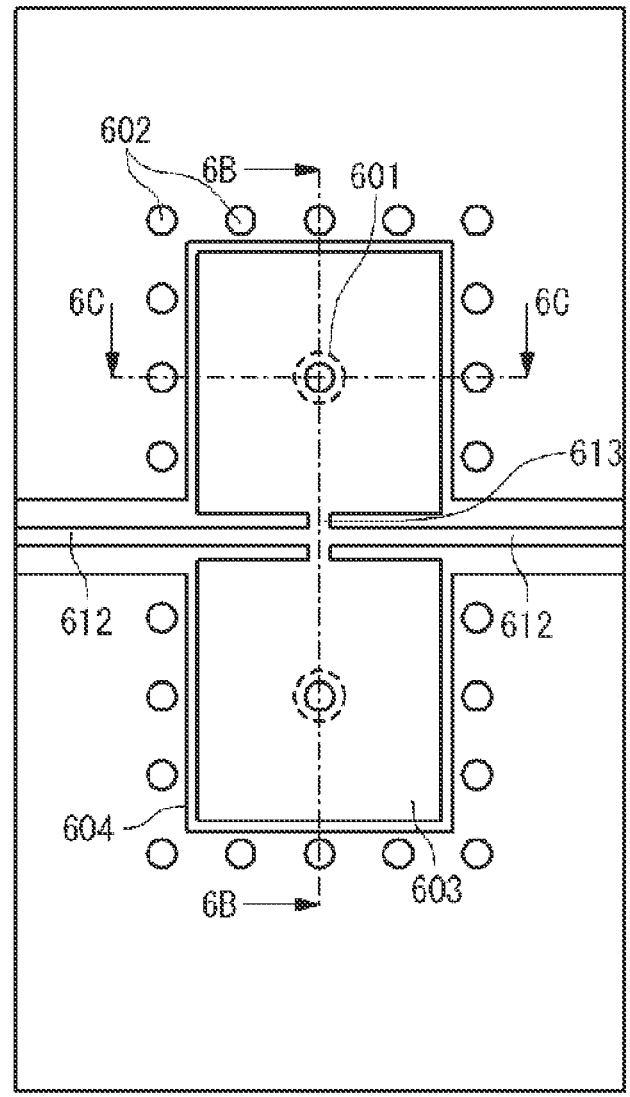
FIG. 6A is a top view of a filter in further another embodiment of the present invention.
Figure 6B:
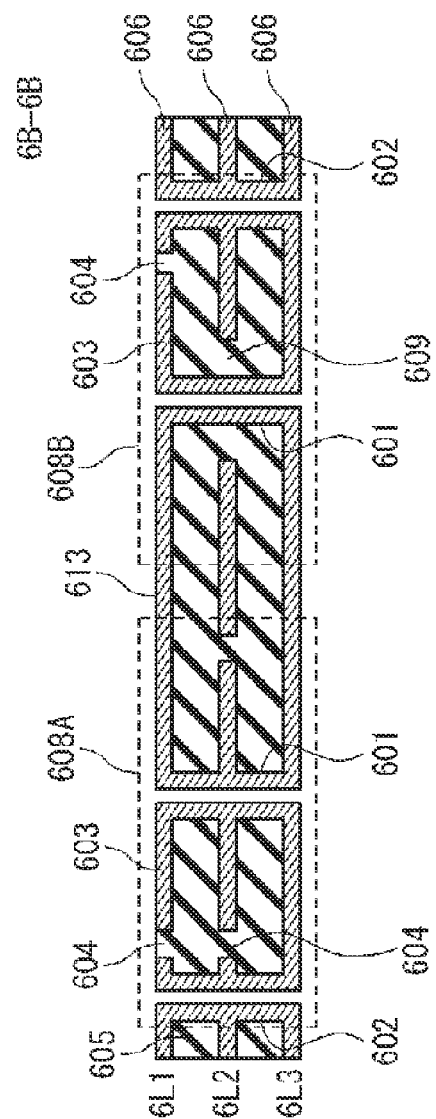
FIG. 6B is a vertical cross-sectional view of the filter in further another embodiment of the present invention on the 6B-6B section shown in FIG. 6A.
Figure 6C:
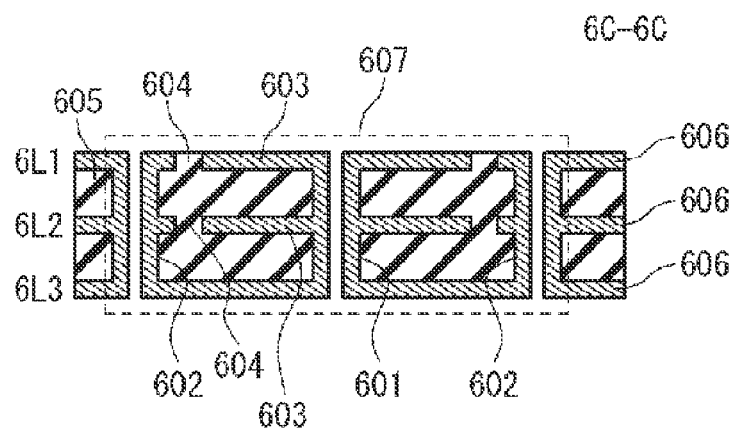
FIG. 6C is a vertical cross-sectional view of the filter in further another embodiment of the present invention on the 6C-6C section shown in FIG. 6A.
Figure 6D:
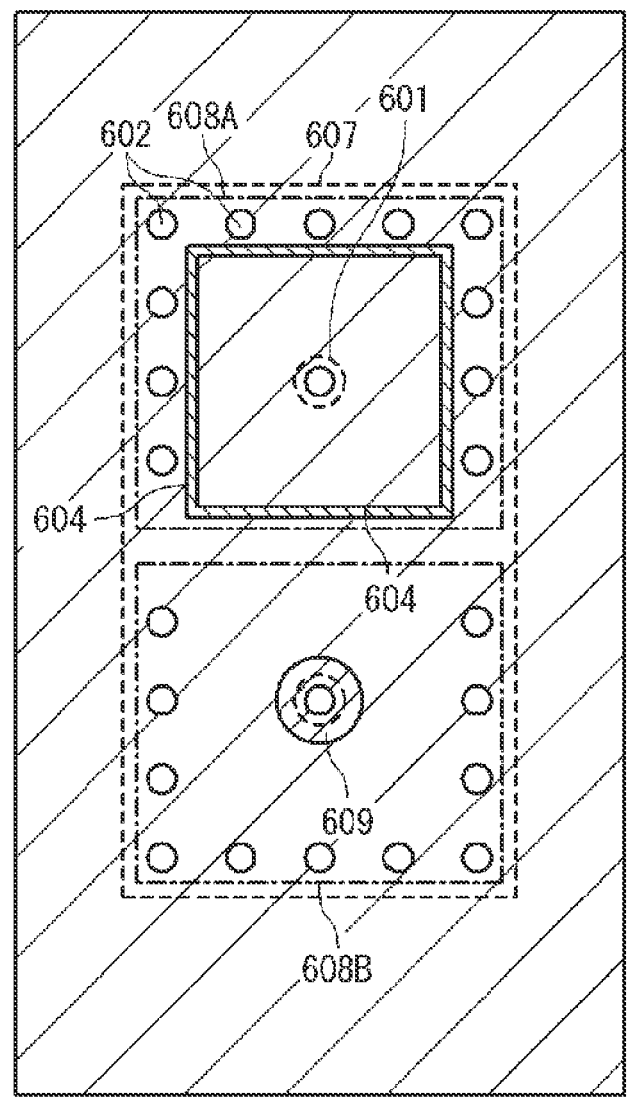
FIG. 6D is a horizontal cross-sectional view of the filter in further another embodiment of the present invention at the conductor layer 6L2 shown in FIGS. 6B and 6C.
Figure 6E:
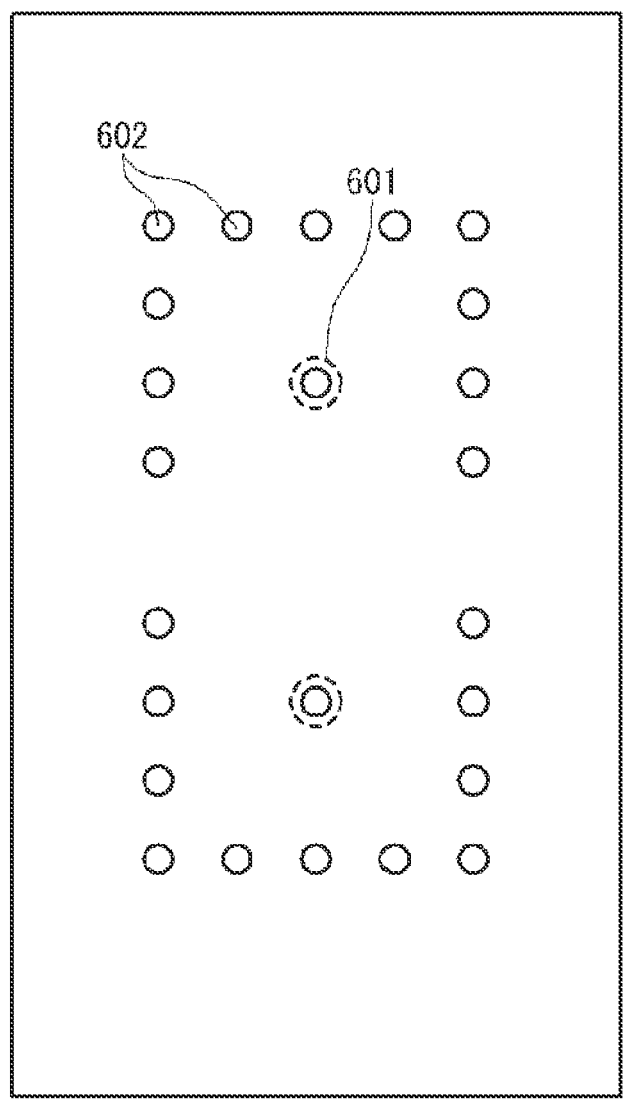
FIG. 6E is a bottom view of the filter in further another embodiment of the present invention shown in FIGS. 6A to 6D.

A filter in further another exemplary embodiment of the present invention is shown in FIGS. 6A to 6E. FIG. 6A is a top view of a filter in further another embodiment of the present invention. FIG. 6B is a vertical cross-sectional view of the filter in further another embodiment of the present invention on the 6B-6B section shown in FIG. 6A. FIG. 6C is a vertical cross-sectional view of the filter in further another embodiment of the present invention on the 6C-6C section shown in FIG. 6A. FIG. 6D is a horizontal cross-sectional view of the filter in further another embodiment of the present invention at the conductor layer 6L2 shown in FIGS. 6B and 6C. FIG. 6E is a bottom view of the filter in further another embodiment of the present invention shown in FIGS. 6A to 6D.

The filter shown in FIGS. 6A to 6E is formed in a multilayer substrate having three conductor layers 6L1 to 6L3 and a dielectric material 605 isolating the conductor layers 6L1 to 6L3 from each other. Each of the conductor layers 6L1 to 6L3 includes a ground conductor 606.

The filter shown in FIGS. 6A to 6E includes one hybrid resonator 607. The hybrid resonator 607 includes two resonant elements 608A and 608B and a coupling strip 613 connecting the resonant elements 608A and 608B at the top conductor layer 6L1.

Each of the resonator elements 608A or 608B includes a signal via 601, a group of ground vias 602 and an artificial dielectric. The signal via 601 is disposed through the multilayer substrate. The group of ground vias 602 is disposed through the multilayer substrate, surrounding the signal via 601 and the artificial dielectric and connected to the ground conductor 606 at each of the conductor layers 6L1 to 6L3. The artificial dielectric is disposed in the multilayer substrate between the signal via 601 and the group of ground vias 602.

The artificial dielectric in the resonant element 608A includes at each of conductor layers 6L1 and 6L2 a conductive plate 603 and an isolating slit 604. At each of conductor layers 6L1 and 6L2, the conductive plate 603 is connected to the signal via 601 and isolated from the ground conductor 606 by the isolating slit 604.

The artificial dielectric in the resonant element 608B includes at the top conductor layer 6L1 a conductive plate 603 and an isolating slit 604. At the top conductor layer 6L1, the conductive plate 603 is connected to the signal via 601 and isolated from the ground conductor 606 by the isolating slit 604. The artificial dielectric in the resonant element 608B also includes at the conductor layer 6L2 a clearance hole 609 and the ground conductor 606. At the conductor layer 6L2, the signal via 601 is isolated from the ground conductor 606 by the clearance hole 609.

The top conductor layer 6L1 includes coupling strips 613 and microstrip lines 612. Strip segments 612 connected to the coupling strip 613 serve as terminals of the filter.

Further Another Exemplary Embodiment

Figure 7A:
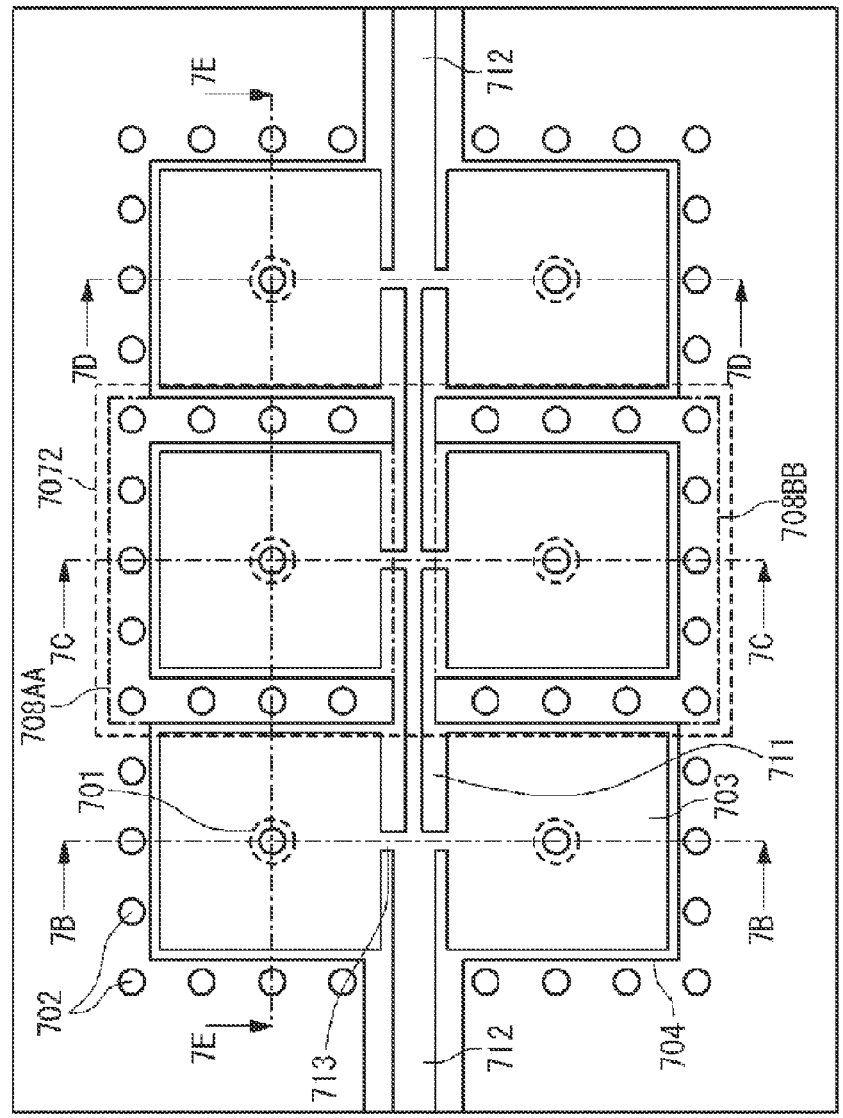
FIG. 7A is a top view of a filter in further another embodiment of the present invention.
Figure 7B:
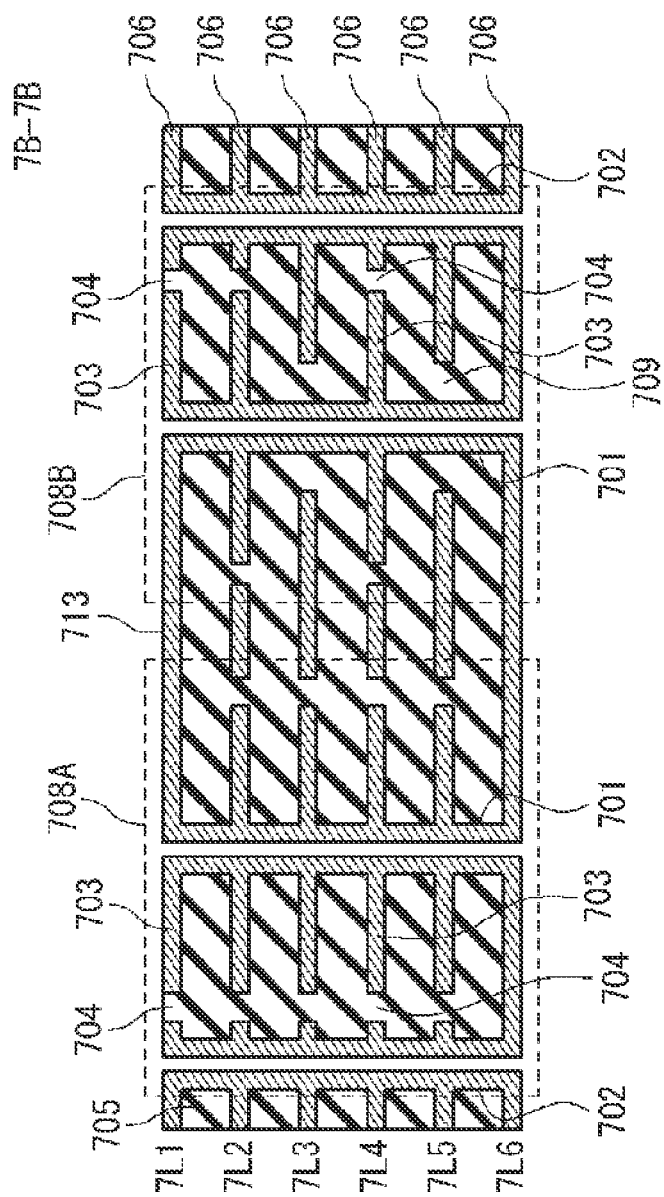
FIG. 7B is a vertical cross-sectional view of the filter in further another embodiment of the present invention on the 7B-7B section shown in FIG. 7A.
Figure 7C:
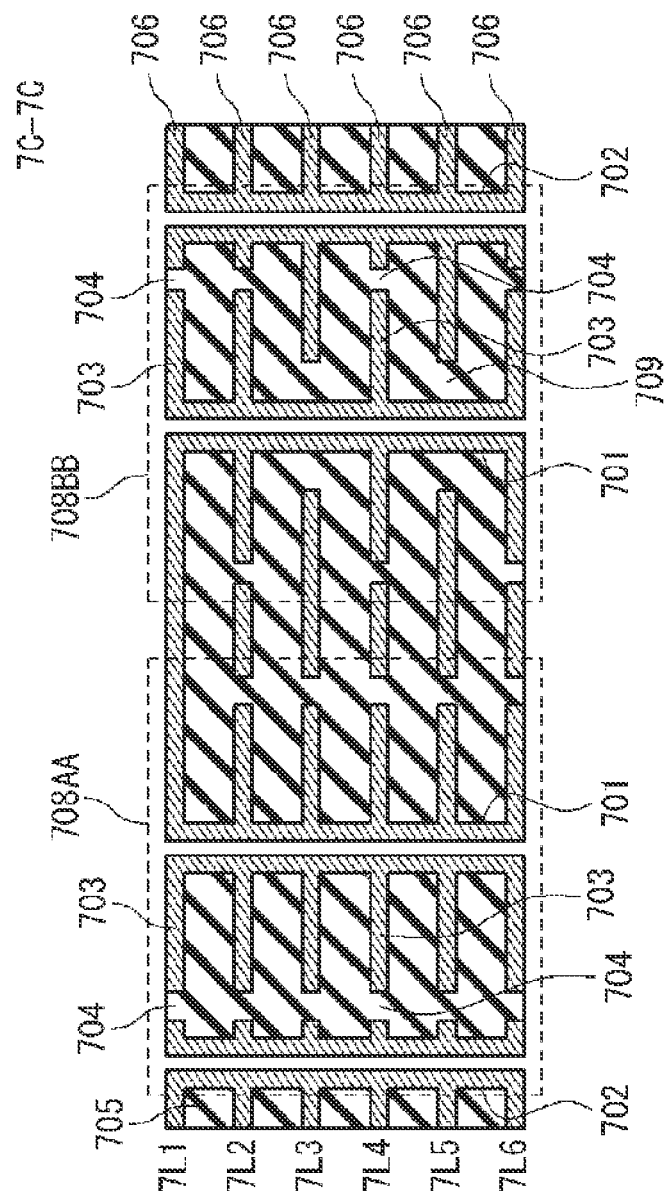
FIG. 7C is a vertical cross-sectional view of the filter in further another embodiment of the present invention on the 7C-7C section shown in FIG. 7A.
Figure 7D:
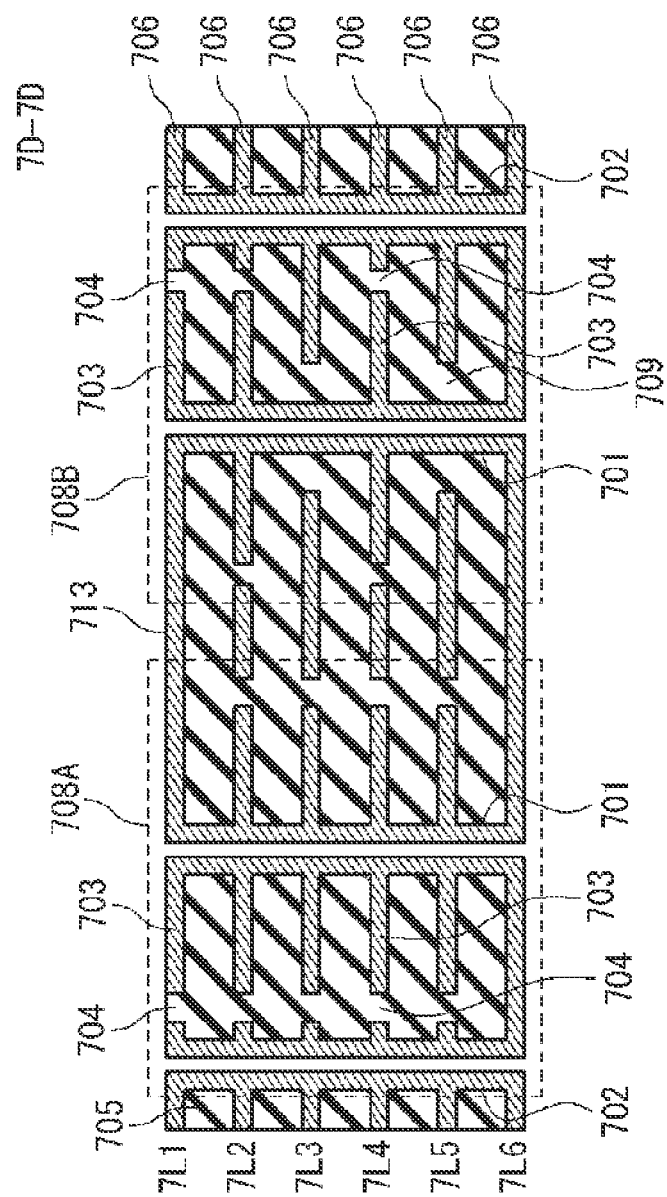
FIG. 7D is a vertical cross-sectional view of the filter in further another embodiment of the present invention on the 7D-7D section shown in FIG. 7A.
Figure 7E:
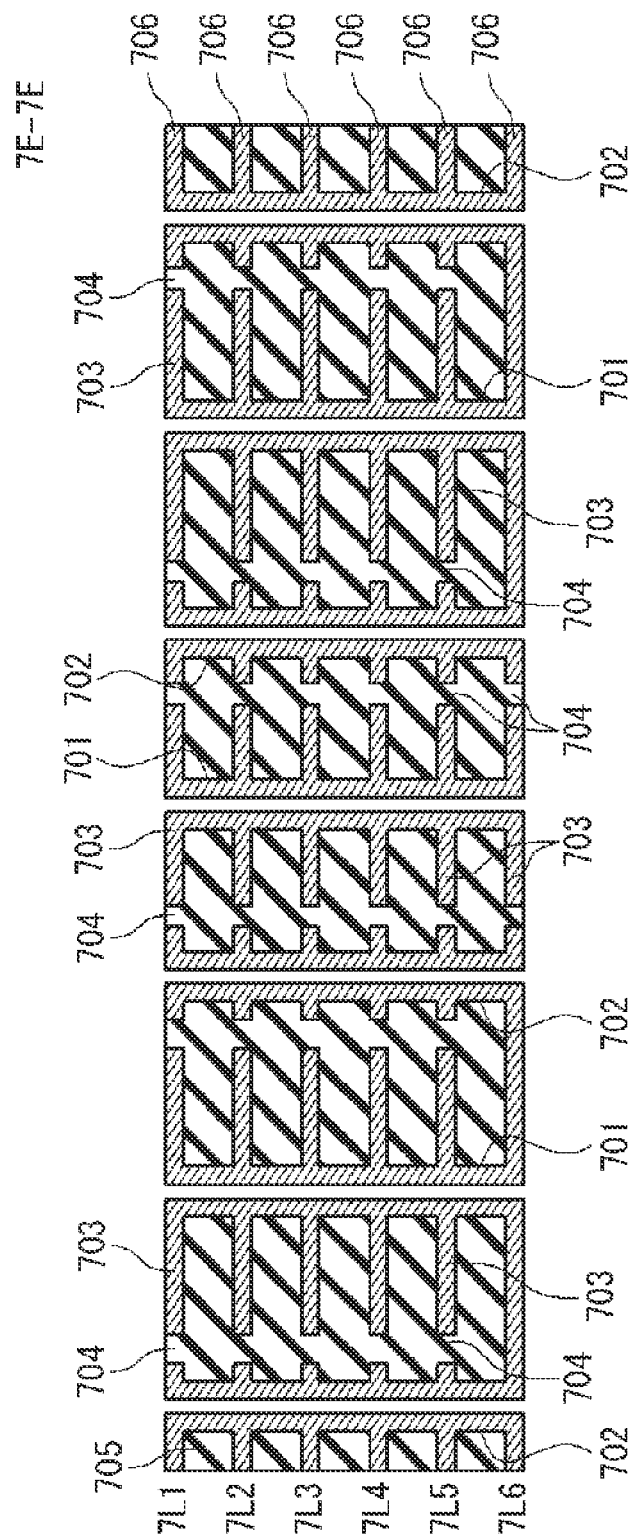
FIG. 7E is a vertical cross-sectional view of the filter in further another embodiment of the present invention on the 7E-7E section shown in FIG. 7A.
Figure 7F:
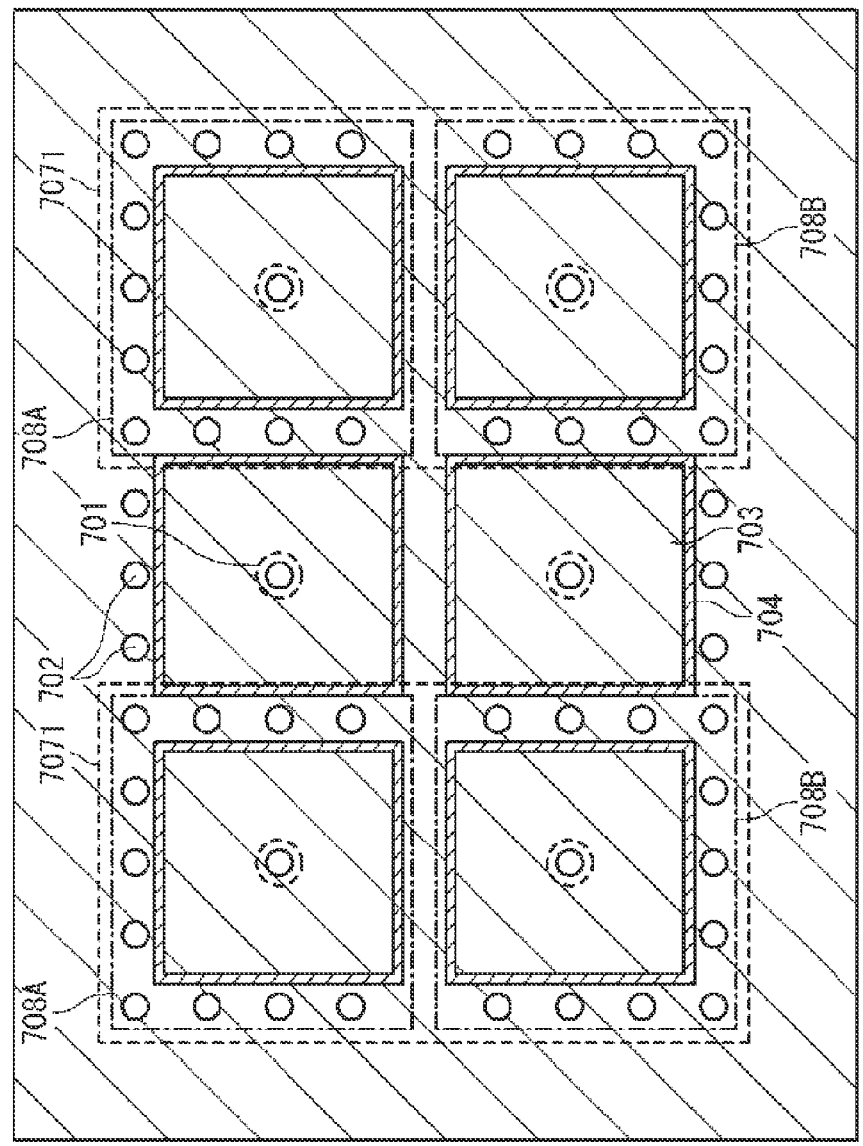
FIG. 7F is a horizontal cross-sectional view of the filter in further another embodiment of the present invention at the conductor layers 7L2 and 7L4 shown in FIGS. 7B to 7E.
Figure 7G:
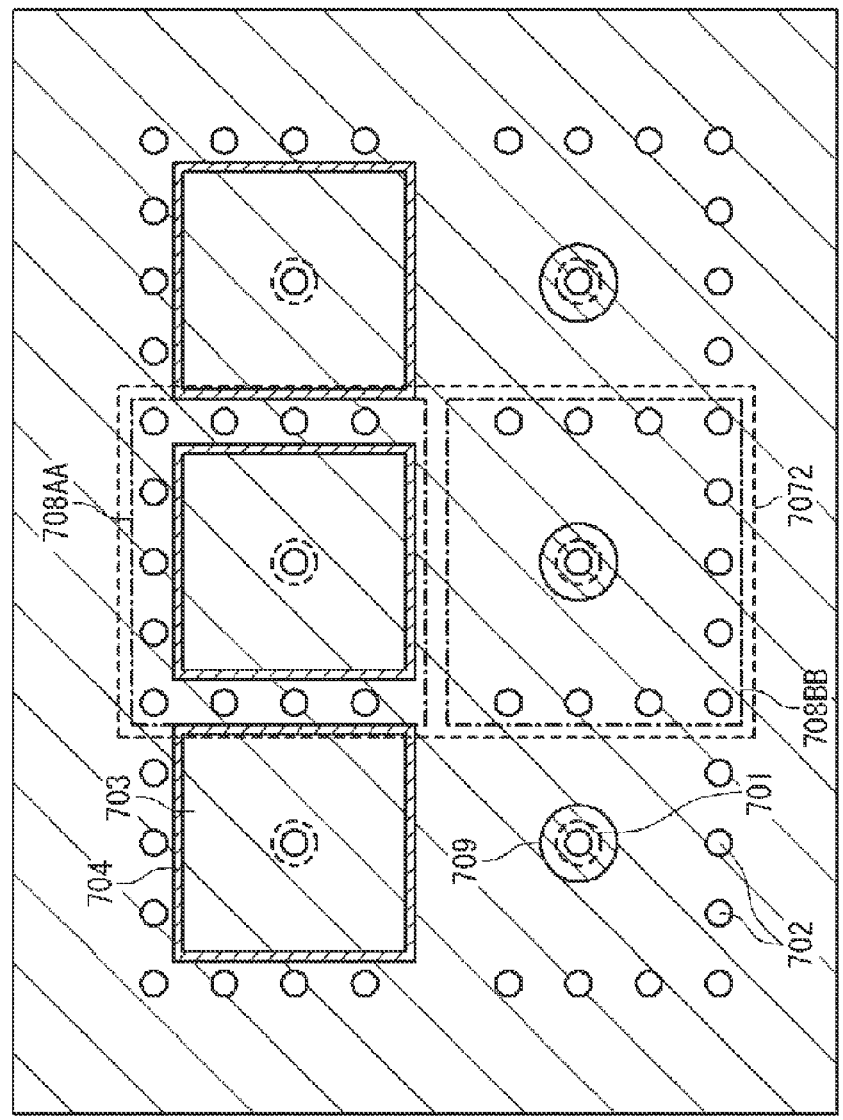
FIG. 7G is a horizontal cross-sectional view of the filter in further another embodiment of the present invention at the conductor layers 7L3 and 7L5 shown in FIGS. 7B to 7E.
Figure 7H:
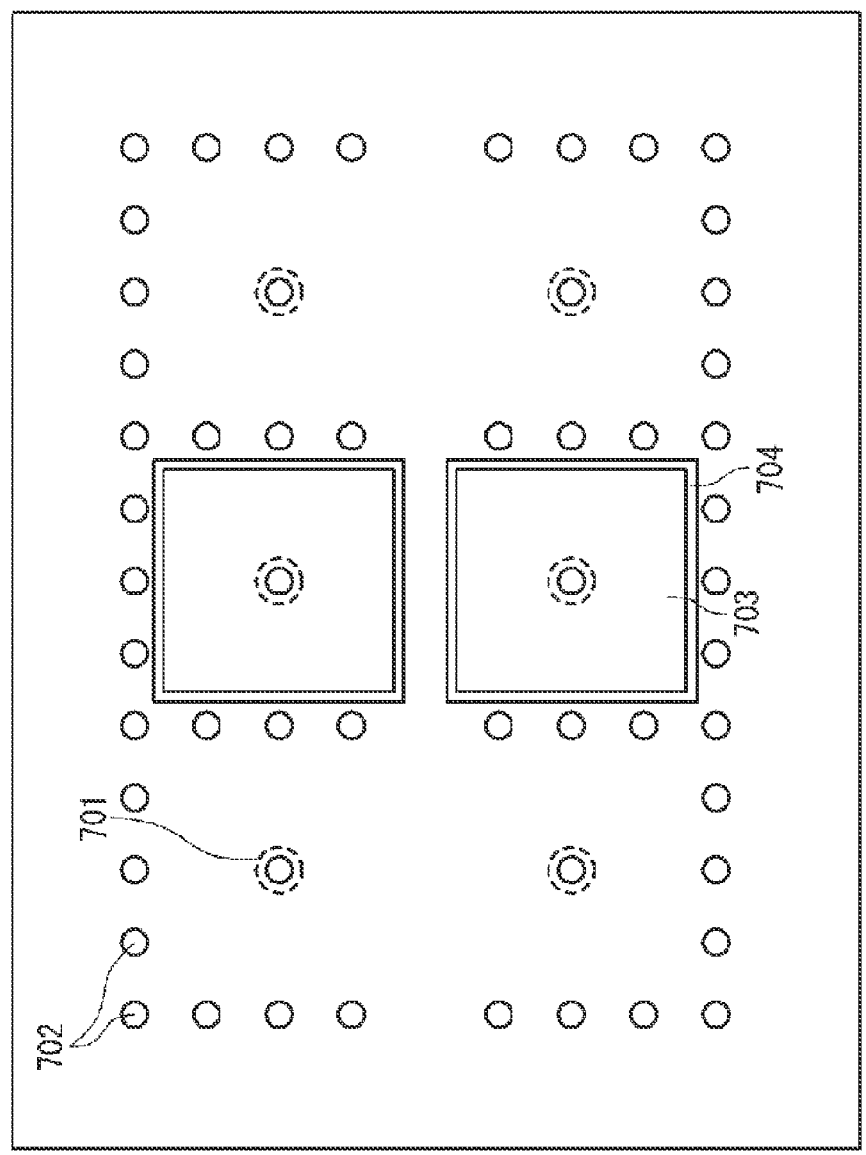
FIG. 7H is a bottom view of the filter in further another embodiment of the present invention shown in FIGS. 7A to 7G.

A filter in further another exemplary embodiment of the present invention is shown in FIGS. 7A to 7H. FIG. 7A is a top view of a filter in further another embodiment of the present invention. FIG. 7B is a vertical cross-sectional view of the filter in further another embodiment of the present invention on the 7B-7B section shown in FIG. 7A. FIG. 7C is a vertical cross-sectional view of the filter in further another embodiment of the present invention on the 7C-7C section shown in FIG. 7A. FIG. 7D is a vertical cross-sectional view of the filter in further another embodiment of the present invention on the 7D-7D section shown in FIG. 7A. FIG. 7E is a vertical cross-sectional view of the filter in further another embodiment of the present invention on the 7E-7E section shown in FIG. 7A. FIG. 7F is a horizontal cross-sectional view of the filter in further another embodiment of the present invention at the conductor layers 7L2 and 7L4 shown in FIGS. 7B to 7E. FIG. 7G is a horizontal cross-sectional view of the filter in further another embodiment of the present invention at the conductor layers 7L3 and 7L5 shown in FIGS. 7B to 7E. FIG. 7H is a bottom view of the filter in further another embodiment of the present invention shown in FIGS. 7A to 7G.

The filter shown in FIGS. 7A to 7H is formed in a multilayer substrate having six conductor layers 7L1 to 7L6 and a dielectric material 705 isolating the conductor layers 7L1 to 7L6 from each other. Each of the conductor layers 7L1 to 7L6 includes a ground conductor 706.

The filter shown in FIGS. 7A to 7H includes three hybrid resonators, among which two hybrid resonators 7071 are formed in a short-circuited type and one hybrid resonator 7072 is formed in an open-circuited type.

Each of two hybrid resonators 7071 includes two resonant elements 708A and 708B and a coupling strip 713 connecting the resonant elements 708A and 708B. The hybrid resonator 7072 includes two resonant elements 708AA and 708BB and a coupling strip 713 connecting the resonant elements 708AA and 708BB. Each of the resonant elements 708A, 708AA, 708B and 708BB includes a signal via 701, a group of ground vias 702 and an artificial dielectric. The signal via 701 is disposed through the multilayer substrate. The group of ground vias 702 is disposed through the multilayer substrate, surrounding the signal via 701 and the artificial dielectric and connected to the ground conductor 706 at each of conductor layers 7L1 to 7L6. The artificial dielectric is disposed in the multilayer substrate and between the signal via 701 and the group of ground vias 702.

The top conductor layer 7L1 includes coupling strips 713, connection strips 711 and microstrip lines 712. Coupling strips 713 of the hybrid resonators 7071 and 7072 are joined by connection strips 711 and strip segments 712 serve as terminals of the filter.

The artificial dielectric in each resonant element 708A includes at each of the conductor layers 7L1 to 7L5 a conductive plate 703 and an isolating slit 704. At each of the conductor layers 7L1 to 7L5, the conductive plate 703 is connected to the signal via 701 and isolated from the ground conductor 706 by the isolating slit 704. In each resonant element 708A the signal via 701 is connected to the ground conductor 706 at the bottom conductor layer 7L6.

The artificial dielectric in each resonant element 708B includes at each of the conductor layers 7L1, 7L2 and 7L4 a conductive plate 703 and an isolating slit 704. At each of the conductor layers 7L1, 7L2 and 7L4, the conductive plate 703 is connected to the signal via 701 and isolated from the ground conductor 706 by the isolating slit 704. The artificial dielectric in each resonant element 708B includes at each of the conductor layers 7L3 and 7L5 a clearance hole 709 and the ground conductor 706. At each of the conductor layers 7L3 and 7L5, the signal via 701 is isolated from the ground conductor 706 by the clearance hole 709. In each resonant element 708B the signal via 701 is connected to the ground conductor 706 at the bottom conductor layer 7L6.

The artificial dielectric in the resonant element 708AA includes at each of the conductor layers 7L1 to 7L6 a conductive plate 703 and an isolating slit 704. At each of the conductor layers 7L1 to 7L6, the conductive plate 703 is connected to the signal via 701 and isolated from the ground conductor 706 by the isolating slit 704.

The artificial dielectric in each resonant element 708BB includes at each of the conductor layers 7L1, 7L2, 7L4 and 7L6 a conductive plate 703 and an isolating slit 704. At each of the conductor layers 7L1, 7L2, 7L4 and 7L6, the conductive plate 703 is connected to the signal via 701 and isolated from the ground conductor 706 by the isolating slit 704. The artificial dielectric in each resonant element 708BB includes at each of the conductor layers 7L3 and 7L5 a clearance hole 709 and the ground conductor 706. At each of the conductor layers 7L3 and 7L5, the signal via 701 is isolated from the ground conductor 706 by the clearance hole 709.

Compactness of the filter is provided by the artificial dielectrics of a high-permittivity formed between the signal vias 701 and the groups of ground vias 702. The structures of the above obtained artificial dielectrics can provide different effective permittivities of the artificial dielectrics and, as a result, different own resonant frequencies of resonant elements in a pair forming an asymmetric hybrid resonator 7071 or 7072.

Further Another Exemplary Embodiment

Figure 8A:
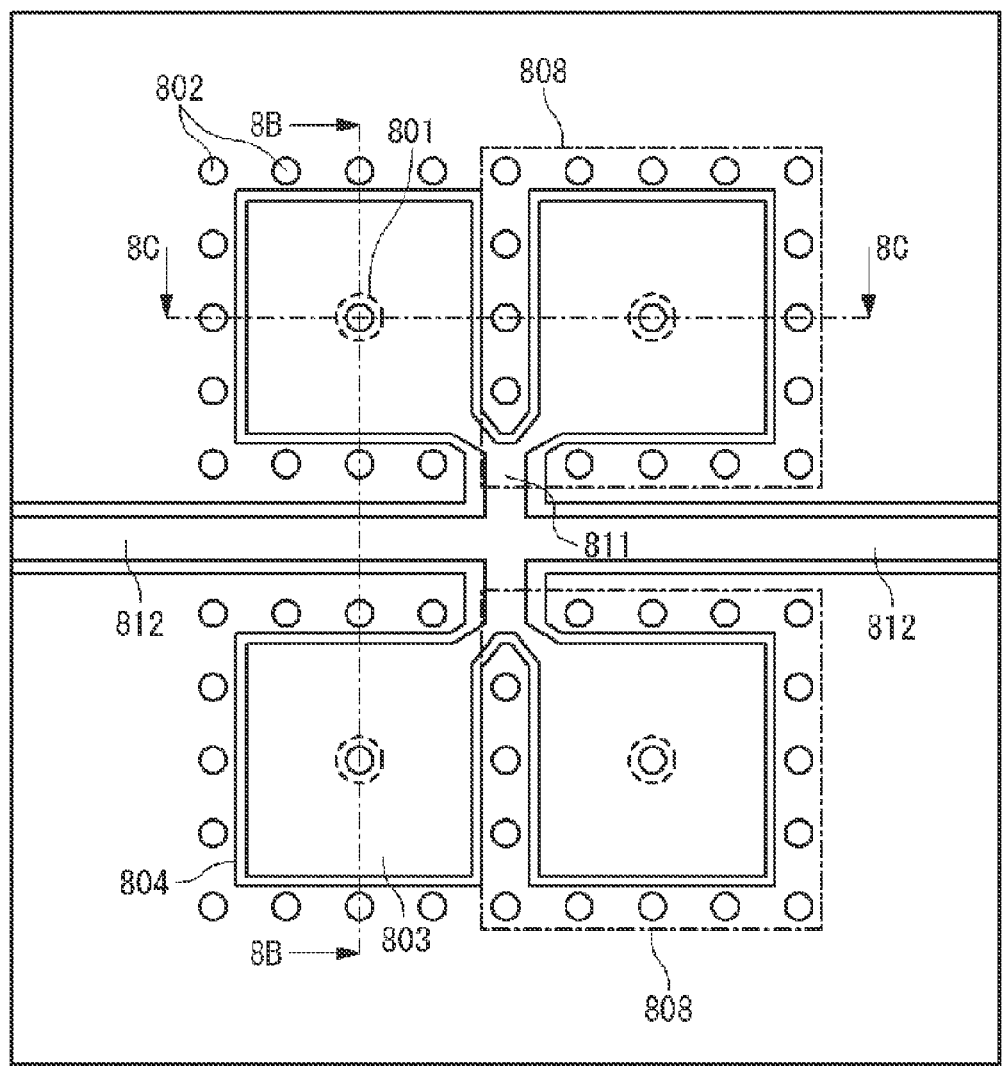
FIG. 8A is a top view of a filter in further another embodiment of the present invention.
Figure 8B:
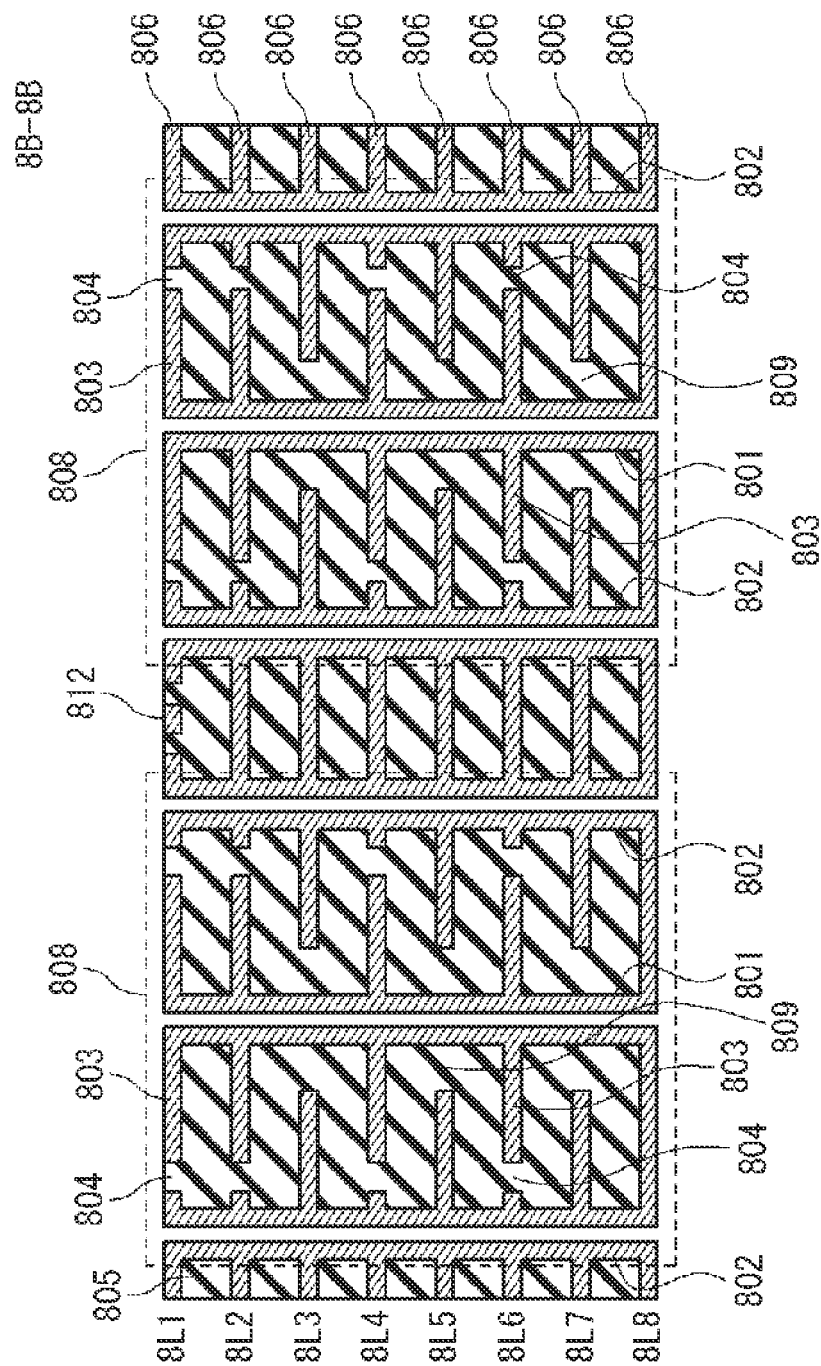
FIG. 8B is a vertical cross-sectional view of the filter in further another embodiment of the present invention on the 8B-8B section shown in FIG. 8A.
Figure 8D:
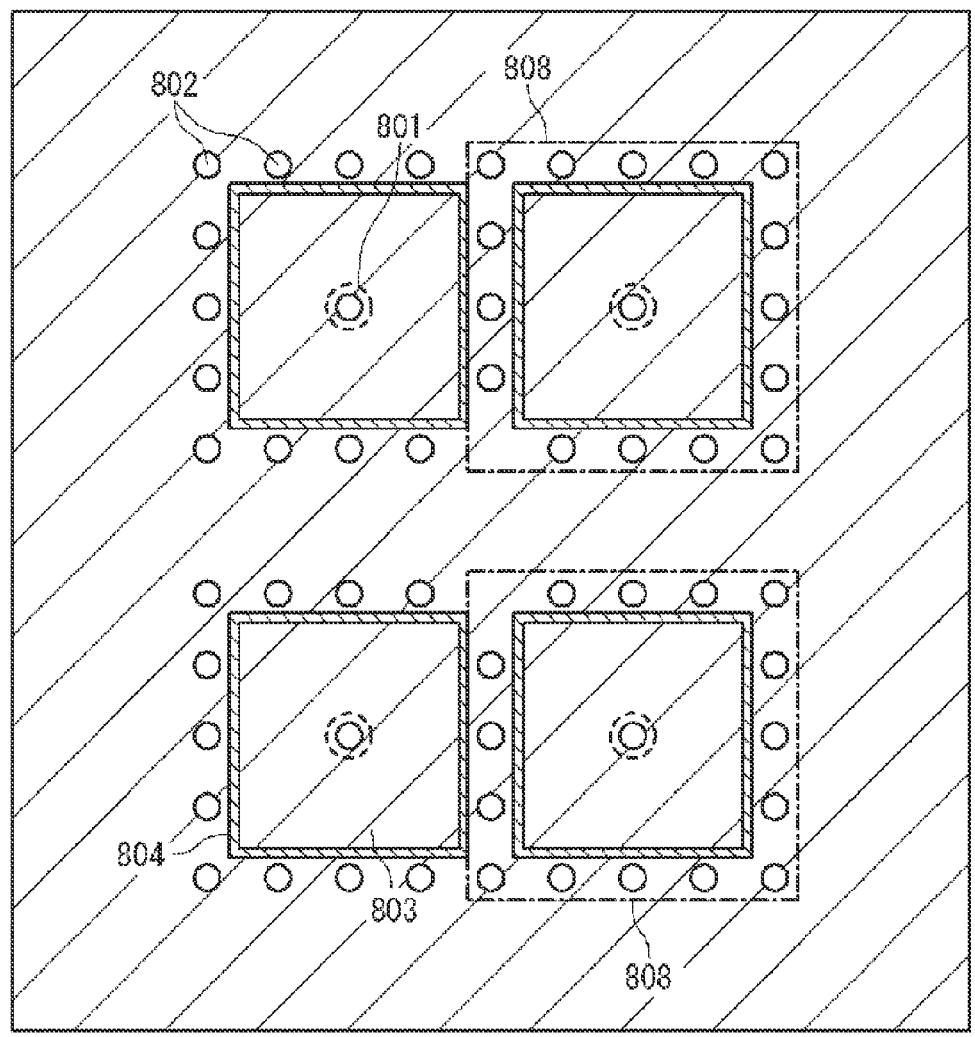
FIG. 8D is a horizontal cross-sectional view of the filter in further another embodiment of the present invention at the conductor layers 8L2, 8L4, and 8L6 shown in FIGS. 8B and 8C.
Figure 8E:
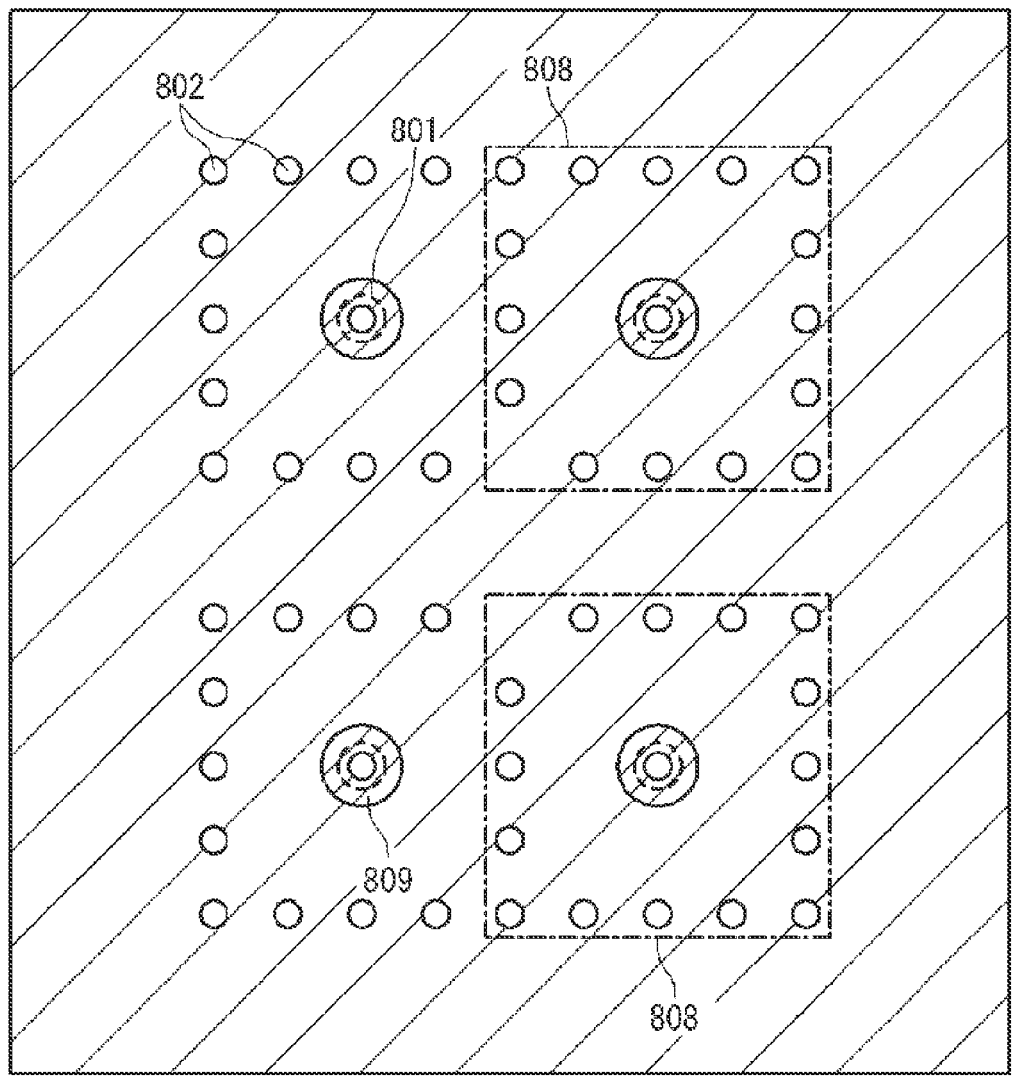
FIG. 8E is a horizontal cross-sectional view of the filter in further another embodiment of the present invention at the conductor layers 8L3, 8L5, and 8L7 shown in FIGS. 8B and 8C.
Figure 8F:
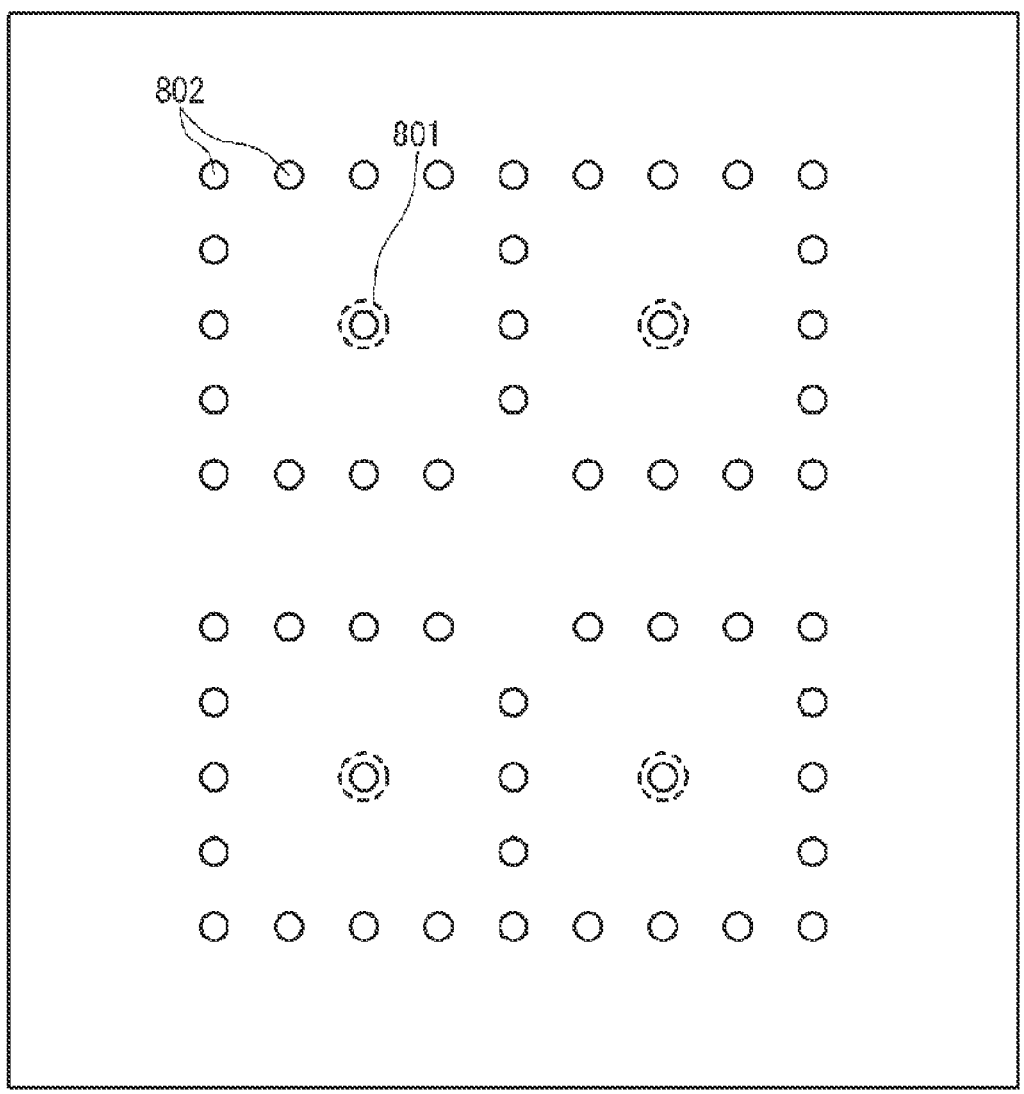
FIG. 8F is a bottom view of the filter in further another embodiment of the present invention shown in FIGS. 8A to 8E.

A filter in further another exemplary embodiment of the present invention is shown in FIGS. 8A to 8F. FIG. 8A is a top view of a filter in further another embodiment of the present invention. FIG. 8B is a vertical cross-sectional view of the filter in further another embodiment of the present invention on the 8B-8B section shown in FIG. 8A. FIG. 8C is a vertical cross-sectional view of the filter in further another embodiment of the present invention on the 8C-8C section shown in FIG. 8A. FIG. 8D is a horizontal cross-sectional view of the filter in further another embodiment of the present invention at the conductor layers 8L2, 8L4, and 8L6 shown in FIGS. 8B and 8C. FIG. 8E is a horizontal cross-sectional view of the filter in further another embodiment of the present invention at the conductor layers 8L3, 8L5, and 8L7 shown in FIGS. 8B and 8C. FIG. 8F is a bottom view of the filter in further another embodiment of the present invention shown in FIGS. 8A to 8E.

The filter shown in FIGS. 8A to 8F is formed in a multilayer substrate including eight conductor layers 8L1 to 8L8 and a dielectric material 805 isolating the conductor layers 8L1 to 8L8 from each other. Each of the conductor layers 8L1 to 8L8 includes a ground conductor 806.

The filter of the present embodiment includes one hybrid resonator which includes four resonant elements 808 and a coupling strip structure 811 connecting four resonant elements 808 at the top conductor layer 8L1.

Each resonant element 808 of the one hybrid resonator includes a signal via 801, a group of ground vias 802 and an artificial dielectric. The signal via 801 is disposed through the multilayer substrate. The group of ground vias 802 is disposed through the multilayer substrate, surrounding the signal via 801 and the artificial dielectric and connected to the ground conductor 806 of each conductor layers 8L1 to 8L8. The artificial dielectric is disposed in the multilayer substrate between the signal via 801 and the group of ground vias 802.

The artificial dielectric of each resonant element 808 has a high permittivity and includes a conductive plate 803 and an isolating slit 804 at each of conductor layers 8L1, 8L2 8L4 and 8L6 and a clearance hole 809 and the ground conductor 806 at each of the conductor layers 8L3, 8L5 and 8L7.

At each of conductor layers 8L1, 8L2, 8L4 and 8L6, the conductive plate 803 is connected to the signal via 801 and isolated from the ground plate 806 by the isolating slit 804.

At each of conductor layers 8L3, 8L5 and 8L7, the signal via 801 is isolated from the ground conductor 806 by the clearance hole 809.

At the bottom conductor layer 8L8, the signal via 801 is connected to the ground conductor 806.

Resonant frequency of each resonant element 808 is dependent on its length and the effective permittivity of the artificial dielectric. In-band performance of the filter is dependent on geometry and dimensions of the coupling strip structure 811.

The top conductor layer 8L1 includes coupling strips 811 and microstrip lines 812. Strip segments 812 are connected to the coupling strip structure 811 and serve as filter terminals.

To show advantages of a filter obtained by the use of a hybrid resonator proposed in the present invention, full-wave electromagnetic simulations were made by the Finite-Difference Time-Domain (FDTD) technique which is one of the most used and accurate numerical methods. Two filter structures to be compared have been used in these simulations. One of the filter structures to be compared is the structure of a filter in an art related to the present invention and will be described below referring FIGS. 9A to 9D. Another one of the filter structures to be compared is the structure of a filter of the present invention and will be described in FIGS. 10A to 10E.

Related Art

Figure 9A:
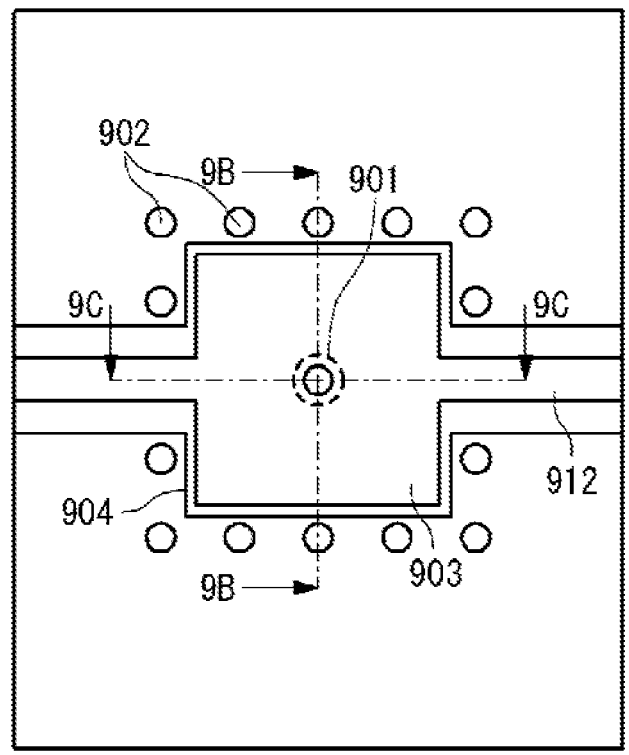
FIG. 9A is a top view of a filter in a related art.
Figure 9B:
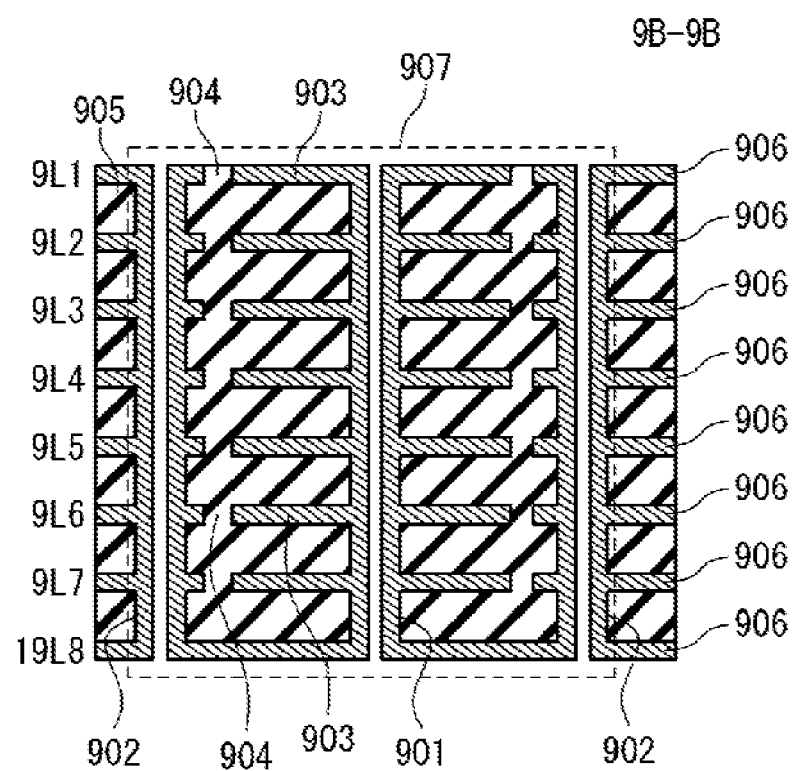
FIG. 9B is a vertical cross-sectional view of the filter in a related art on the 9B-9B section shown in FIG. 9A.
Figure 9D:
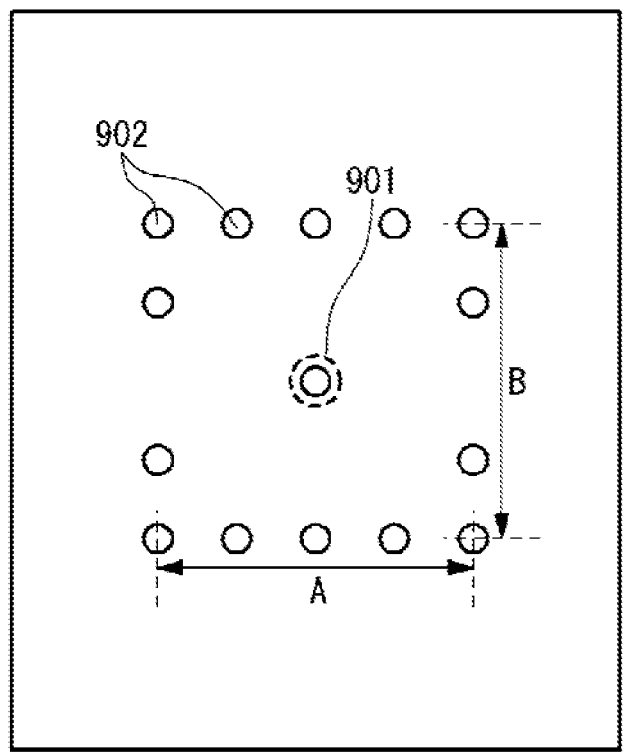
FIG. 9D is a bottom view of the filter in a related art shown in FIGS. 9A to 9C.

A filter in an art related to the present invention is shown in FIGS. 9A to 9D. FIG. 9A is a top view of a filter in a related art. FIG. 9B is a vertical cross-sectional view of the filter in a related art on the 9B-9B section shown in FIG. 9A. FIG. 9C is a vertical cross-sectional view of the filter in a related art on the 9C-9C section shown in FIG. 9A. FIG. 9D is a bottom view of the filter in a related art shown in FIGS. 9A to 9C.

The filter of the related art is disposed in a multilayer substrate having eight conductor layers 9L1 to 9L8 and a dielectric material 905 isolating the conductor layers 9L1 to 9L8 from each other.

The filter of the related art includes a resonant element 907 and strip segments 912. The resonant element 907 is disposed in the multilayer substrate. Strip segments 912 are disposed at the top conductor layer 9L1 and connected to the resonant element 907 and serve as terminals of the filter.

The resonant element 907 includes a signal via 901, a group of ground vias 902 and an artificial dielectric. The signal via 901 is disposed through the multilayer substrate. The group of ground vias 902 is disposed in the multilayer substrate, surrounding the signal via 901 and the artificial dielectric and connected to the ground conductor 906 at each of the conductor layers 9L1 to 9L8. The artificial dielectric is disposed in the multilayer substrate and between the signal via 901 and the group of ground vias 902.

The artificial dielectric includes at each of the conductor layers 9L1 to 9L7 a conductive plate 903 and an isolating slit 904. At each of the conductor layers 9L1 to 9L7, the conductive plate 903 is connected to the signal via 901 and isolated from the ground conductor 906 by the isolating slit 904.

At the bottom conductor layer 9L8, the signal via 901 is connected to the ground conductor 906.

Further Another Exemplary Embodiment

Figure 10A:
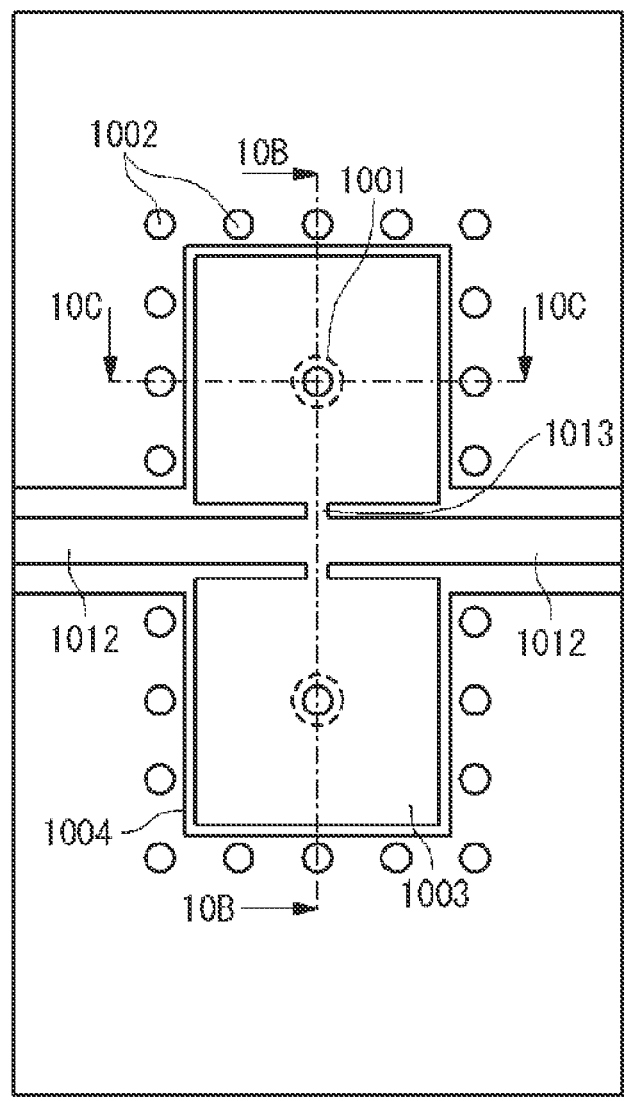
FIG. 10A is a top view of a filter in further another embodiment of the present invention.
Figure 10B:
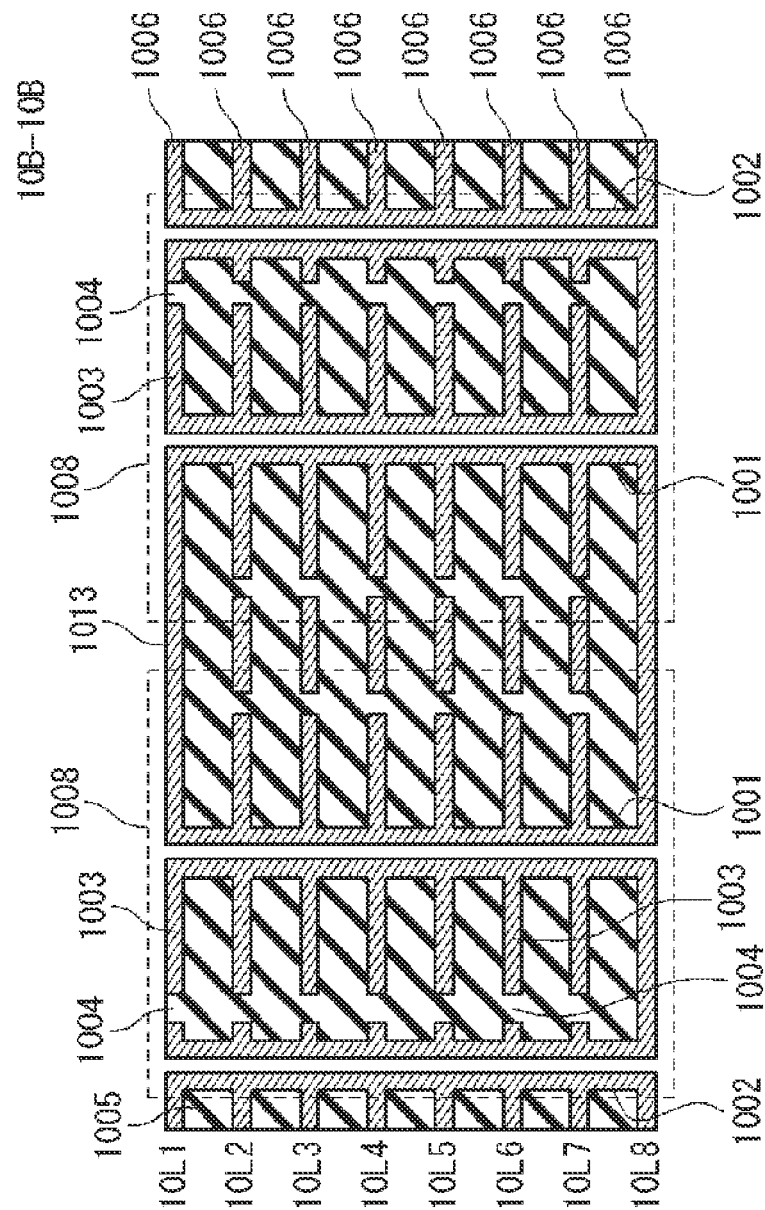
FIG. 10B is a vertical cross-sectional view of the filter in further another embodiment of the present invention on the 10B-10B section shown in FIG. 10A.
Figure 10C:
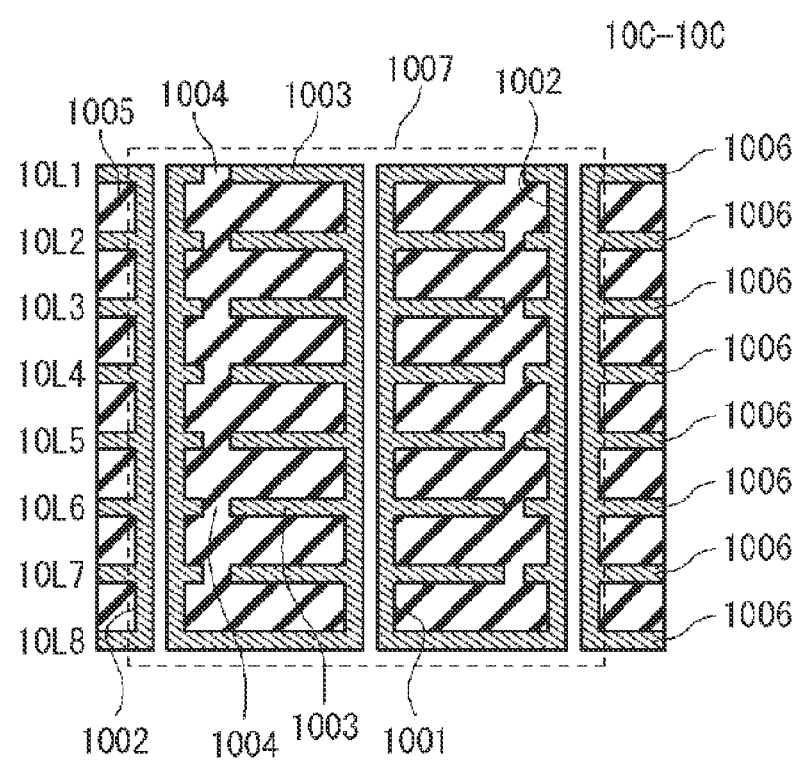
FIG. 10C is a vertical cross-sectional view of the filter in further another embodiment of the present invention on the 10C-10C section shown in FIG. 10A.
Figure 10D:
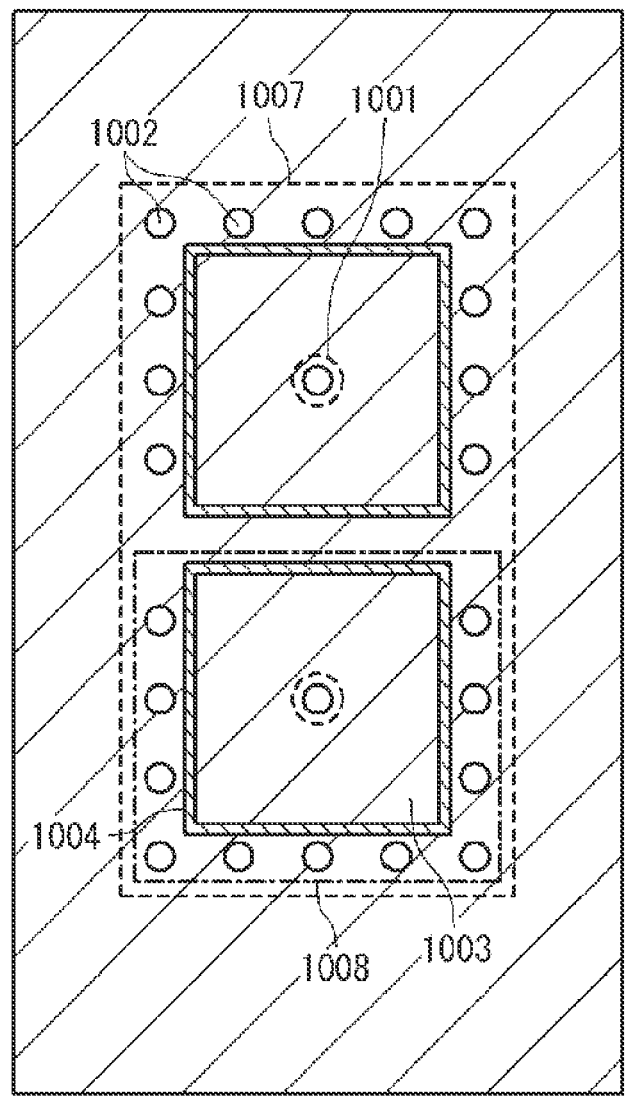
FIG. 10D is a horizontal cross-sectional view of the filter in further another embodiment of the present invention at the conductor layers 10L2 to 10L7 shown in FIGS. 10B and 10C.
Figure 10E:
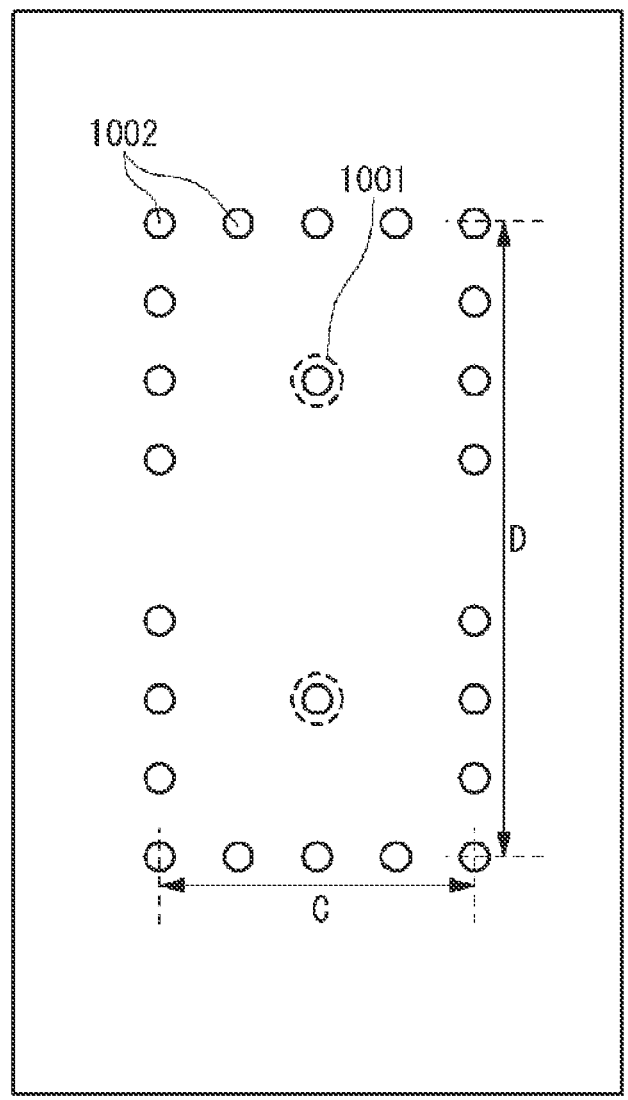
FIG. 10E is a bottom view of the filter in further another embodiment of the present invention shown in FIGS. 10A to 10D.

A filter in further another exemplary embodiment of the present invention is shown in FIGS. 10A to 10E. FIG. 10A is a top view of a filter in further another embodiment of the present invention. FIG. 10B is a vertical cross-sectional view of the filter in further another embodiment of the present invention on the 10B-10B section shown in FIG. 10A. FIG. 10C is a vertical cross-sectional view of the filter in further another embodiment of the present invention on the 10C-10C section shown in FIG. 10A. FIG. 10D is a horizontal cross-sectional view of the filter in further another embodiment of the present invention at the conductor layers 10L2 to 10L7 shown in FIGS. 10B and 10C. FIG. 10E is a bottom view of the filter in further another embodiment of the present invention shown in FIGS. 10A to 10D.

The filter shown in FIGS. 10A to 10E includes a multilayer substrate having eight conductor layers 10L1 to 10L8 and a dielectric material 1005 isolating the conductor layers 10L1 to 10L8 from each other. Each of the conductor layers 10L1 to 10L8 includes a ground conductor 1006.

The filter shown in FIGS. 10A to 10E includes one hybrid resonator 1007. The hybrid resonator 1007 includes two short-circuited resonant elements and a coupling strip 1013 connecting two resonant elements at the top conductor layer 10L1.

Each of two resonant elements includes a signal via 1001, a group of ground vias 1002 and an artificial dielectric. The signal via 1001 is disposed through the multilayer substrate. The group of ground vias 1002 is disposed through the multilayer substrate, surrounding the signal via 1001 and the artificial dielectric and connected to the ground conductor 1006 at each of conductor layers 10L1 to 10L8. The artificial dielectric is disposed in the multilayer substrate and between the signal via 1001 and the group of ground vias 1002.

The artificial dielectric of each resonant element includes at each of conductor layers 10L1 to 10L7 a conductor plate 1003 and an isolating slit 1004 isolating the conductor plate 1003 from the ground conductor 1006.

At the bottom conductor layer 10L8, the signal via 1001 of each resonant element is connected to the ground conductor 1006.

The top conductor layer 10L1 includes coupling strips 1013 and microstrip lines 1012. Strip segments 1012 are connected to the coupling strip 1013 of the hybrid resonators and serve as terminals of the filter presented.

In these figures, the filter of the present invention includes one hybrid resonator 1007 consisting of two short-circuited resonant elements 1008 which are connected by a strip 1013.

Characteristics dimensions of the filter structures are as followings. Both filters are designed in a multilayer substrate having eight copper conductor layers which are separated by a dielectric having the relative permittivity of 3.5 and loss tangent of 0.006. Total thickness of this substrate was 1.62 mm and the thickness of the each copper conductor layer was 0.035 mm.

In both filters, the signal via diameter was 0.5 mm, ground via diameter was 0.25 mm, and the artificial dielectric was formed by the square conductive plates of the 2.4 mm side which were separated from ground conductors by the slits of the width of 0.1 mm.

In the filters, 50 Ohm transmission line segments served as terminals. Transverse dimensions of the relating art filter shown in FIGS. 9A to 9D were A=3 mm and B=3 mm while transverse dimensions of the filter according to the embodiment presented in FIGS. 10A to 10E were C=3 mm and D=6 mm.

Figure 11:
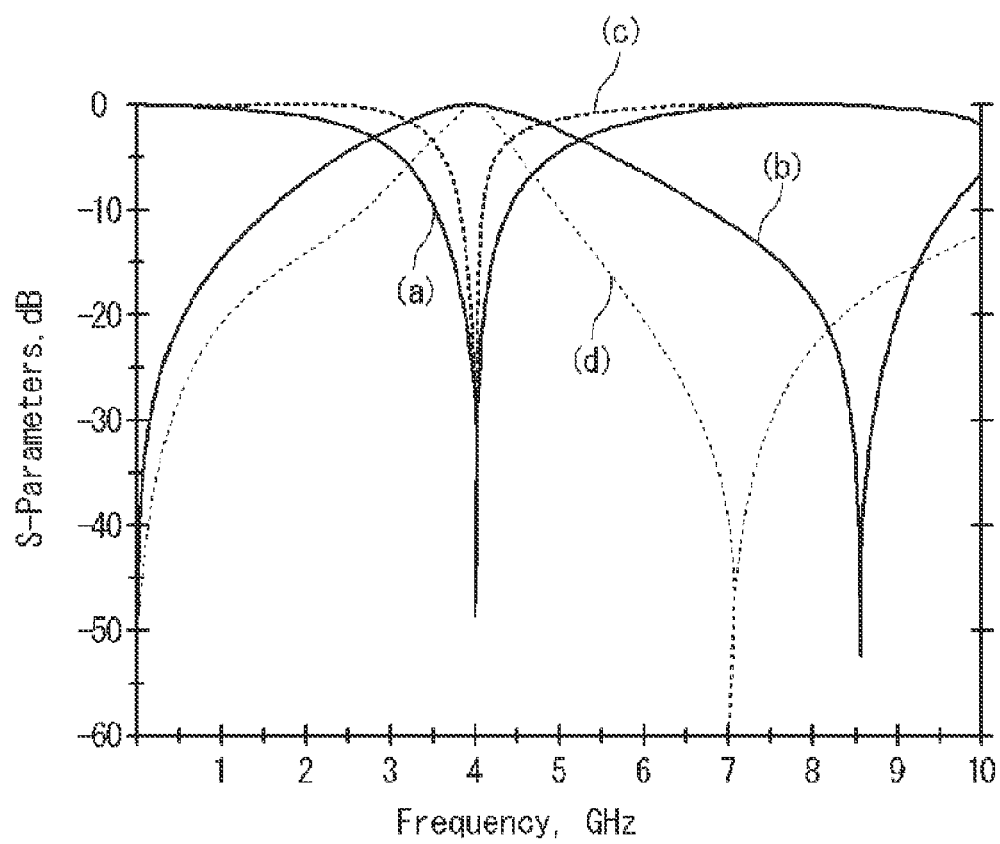
FIG. 11 is a graph showing the simulation result comparing the S-parameters between filters based on a resonator of a related art and a hybrid resonator of the present invention.

FIG. 11 is a graph showing the simulation result comparing the S-parameters between filters based on a resonator of a related art and a hybrid resonator of the present invention.

FIG. 11 includes four graphs (a) to (d). The first graph (a) shows the $|S_{11}|$ parameter of the filter of the related art. The second graph (b) shows the $|S_{21}|$ parameter of the filter of the related art. The third graph (c) shows the $|S_1|$ parameter of the filter based on the hybrid resonator of the present invention. The fourth graph (d) shows the $|S_{21}|$ parameter of the filter based on the hybrid resonator of the present invention.

As follows from presented data, the filter comprising the hybrid resonator have the Q-factor which is much higher, compared with that using the relating art filter for which calculations were made in the same frequency band and for the identical substrate.

Introduction of asymmetry in a hybrid resonator can lead to further improvement of the Q-factor in a filter.

Figure 12:
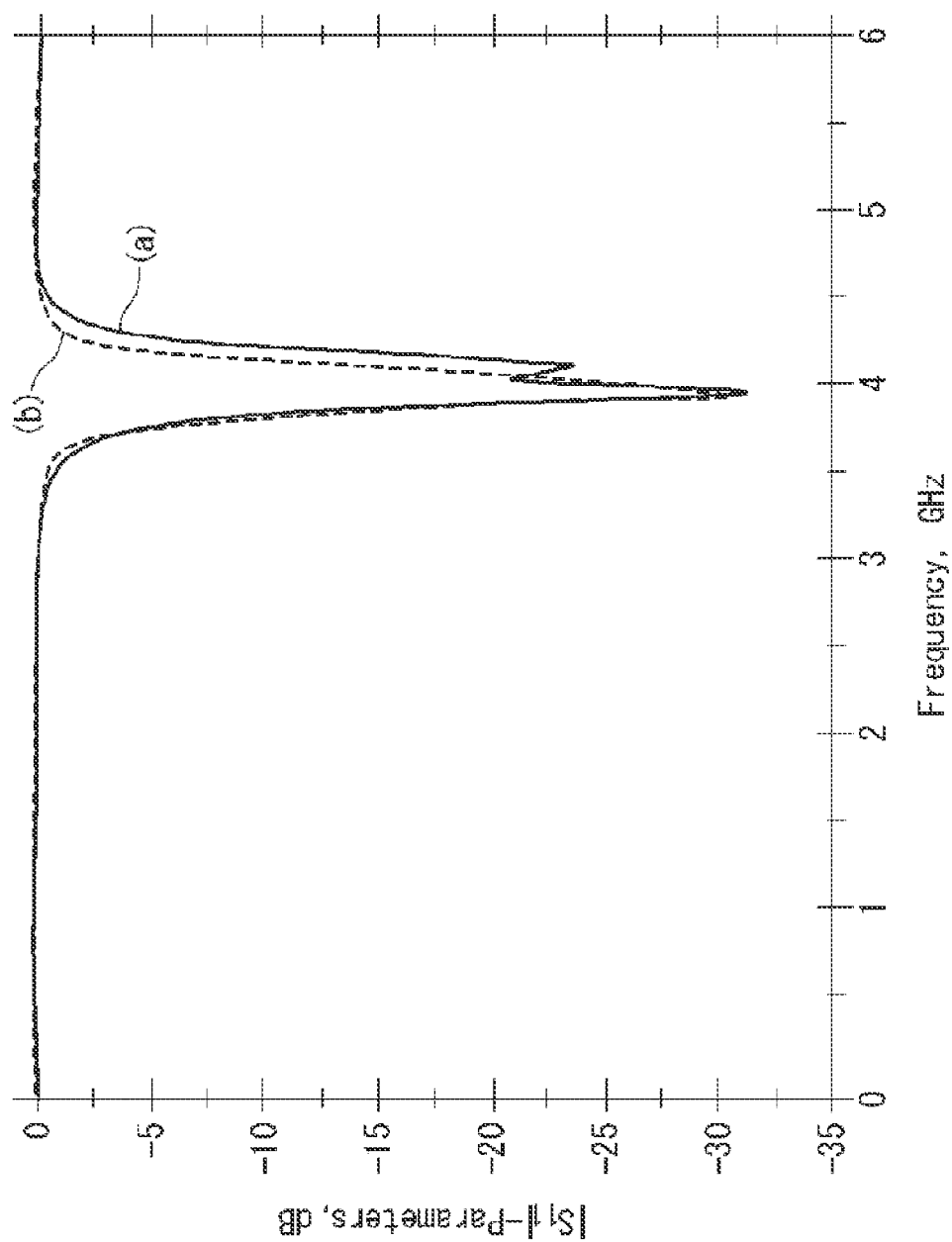
FIG. 12 is a graph showing the simulation result comparing the return losses ($|S_{11}|$-parameters) between filters based on two symmetrical hybrid resonators and two asymmetrical resonators of the present invention.

FIG. 12 is a graph showing the simulation result comparing the return losses ($|S_{11}|$-parameters) between filters based on two symmetrical hybrid resonators and two asymmetrical resonators of the present invention.

FIG. 12 includes two graphs (a) and (b). The first graph (a) shows the $|S_{11}|$ parameter of the filter based on two symmetrical hybrid resonators. The second graph (b) shows the $|S_{11}|$ parameter of the filter based on two asymmetrical hybrid resonators.

Figure 13:
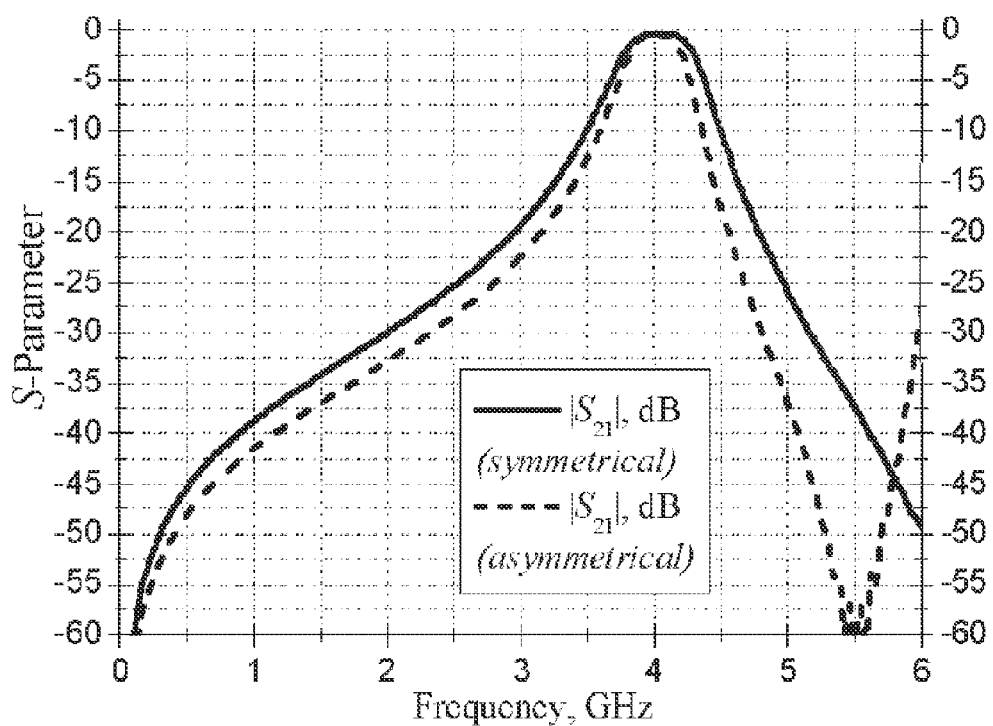
FIG. 13 is a graph showing the simulation result comparing the insertion losses ($|S_{21}|$-parameters) between filters based on two symmetrical hybrid resonators and two asymmetrical resonators of the present invention.

FIG. 13 is a graph showing the simulation result comparing the insertion losses ($|S_{21}|$-parameters) between filters based on two symmetrical hybrid resonators and two asymmetrical resonators of the present invention.

FIG. 13 includes two graphs (a) and (b). The first graph (a) shows the $|S_{21}|$ parameter of the filter based on two symmetrical hybrid resonators. The second graph (b) shows the $|S_{21}|$ parameter of the filter based on two asymmetrical hybrid resonators.

In FIGS. 12 and 13, S-parameters of two types of the filters proposed are demonstrated. In the first type, the filter is consisted of two symmetrical hybrid resonators formed by two same resonant elements. This type is similar to that shown in FIGS. 1A to 1E and is also disposed in an eight-conductor-layers substrate. The second type is obtained by two asymmetrical hybrid resonators having different effective permittivities. The second type filter is presented in FIGS. 2A to 2F.

Following characteristic dimensions of both filters were the same: the signal via diameter was 0.5 mm; ground vias of 0.25 mm diameter surrounding the signal via were arranged as the square with the side of 3.0 mm; the distance between centers of hybrid resonators was 4 mm; and the transmission line segments had dimensions providing the 50 Ohm characteristic impedance at terminals.

Both filters were embedded in the eight copper conductor layers substrate filled in dielectric material having the relative permittivity of 3.5 and loss tangent of 0.006.

However, in the first type of the filters formed by symmetrical hybrid resonators, the artificial dielectric in both resonant elements is obtained by square conductive plates with the side of 2.4 mm connected to the signal via and separated from ground conductors by isolating slits of the width of 0.1 mm.

In the second type of the filter, the artificial dielectric structures in the resonant elements forming the hybrid resonator are different.

As a result, effective permittivities of the artificial dielectric in the resonant elements are also different. The artificial dielectric in one of the resonant elements is obtained by square conductive plates similarly to previous symmetrical hybrid resonator filter case, but other resonant element is formed by conductive plates and ground plates connected to ground vias and separated from the signal via by clearance holes of the diameter of 0.9 mm.

The hybrid resonators in this filter are asymmetrical ones due to the difference in the resonant frequencies of the resonant elements. As follows from the data presented in the FIGS. 12 and 13 the pass-band filter formed by asymmetrical hybrid resonators has the Q-factor higher than that obtained by symmetrical hybrid resonators.

Also an important parameter to control the in-band filter performance is the width of connection strip joining the coupling strip of the hybrid resonators and serving as an impedance transformer.

Figure 14:
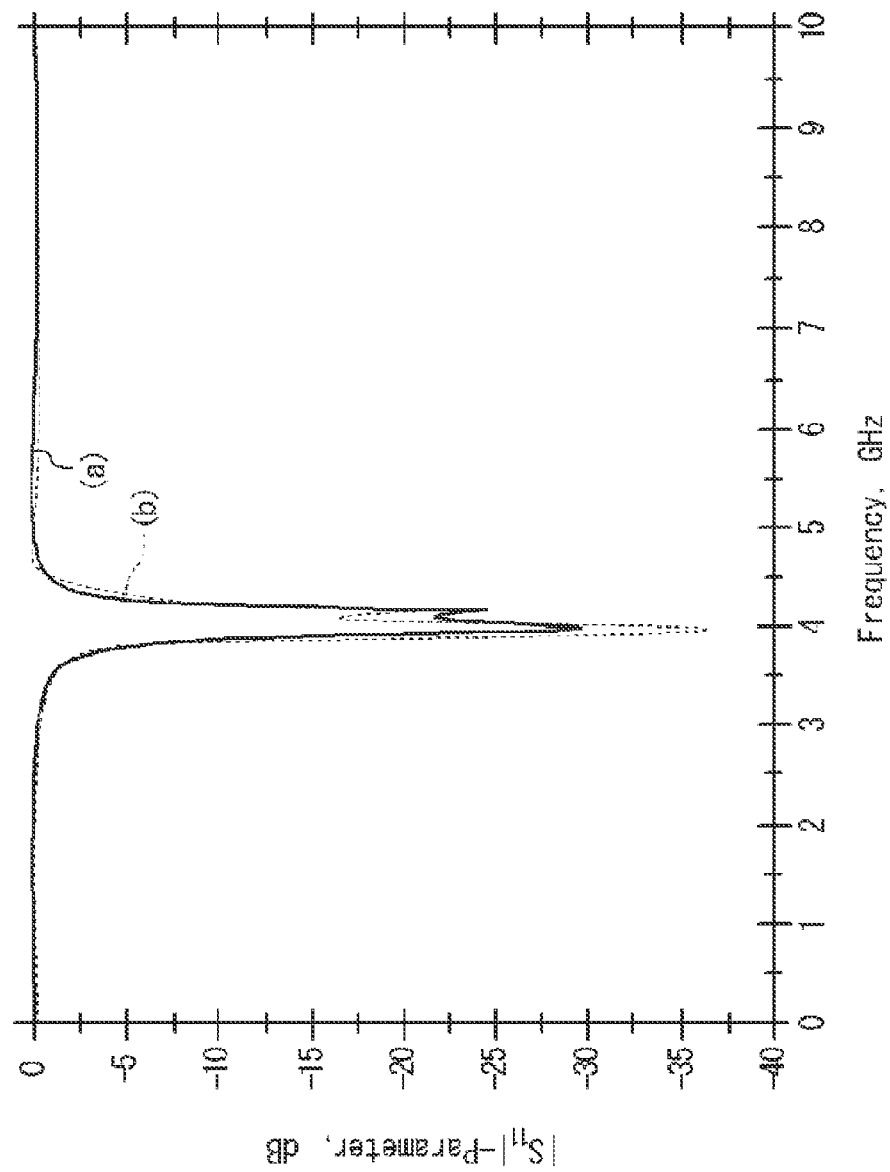
FIG. 14 is a graph showing the simulation result of return losses ($|S_{11}|$-parameter) comparison between filters of the present invention in which different widths of a connection strip joining two hybrid resonators are used.

FIG. 14 is a graph showing the simulation result of return losses ($|S_{11}|$-parameter) comparison between filters of the present invention in which different widths of a connection strip joining two hybrid resonators are used.

FIG. 14 includes two graphs (a) and (b). The first graph (a) shows the $|S_{11}|$ parameter of the filter with a width of the connection strip $l=0.9$ mm (solid line). The second graph (b) shows the $|S_{11}|$ parameter of the filter with a width of the connection strip $l=1.3$ mm (dashed line).

Figure 15:
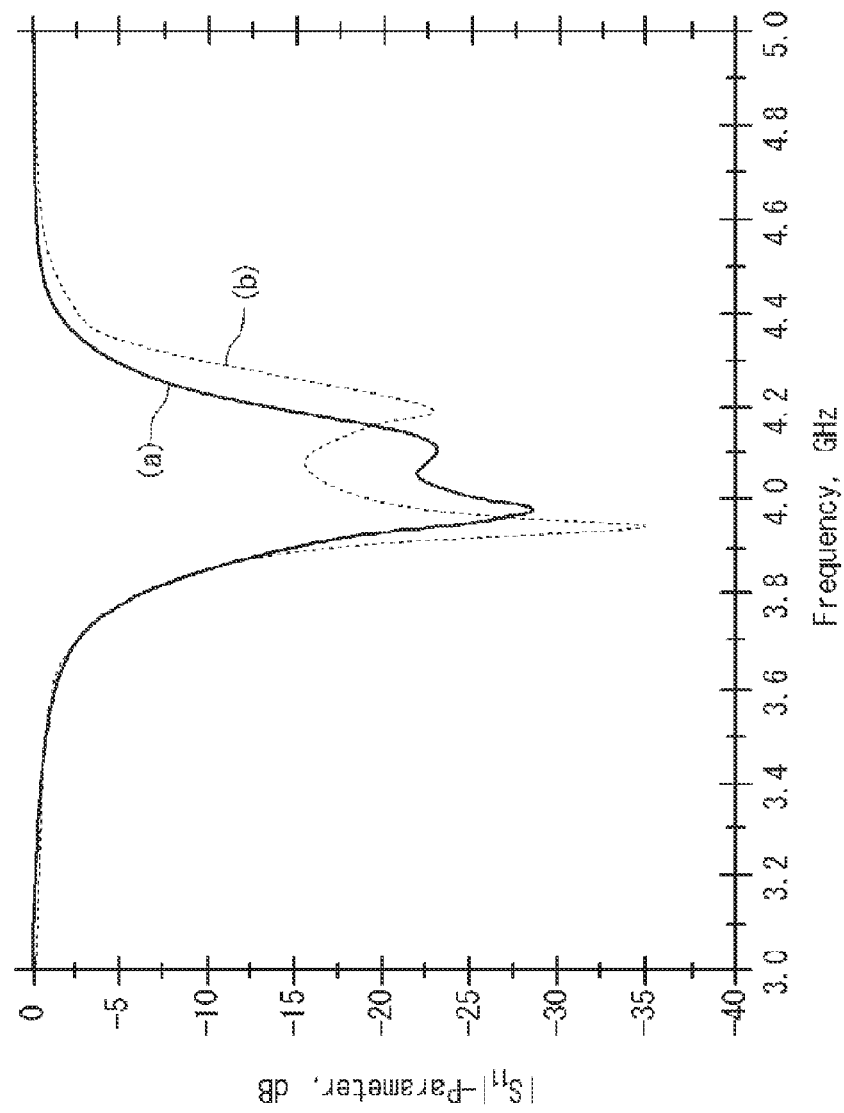
FIG. 15 is a graph showing the simulation result of return losses ($|S_{11}|$-parameter) comparison between filters of the present invention in which different widths of a connection strip joining two hybrid resonators are used, with increased details of the passband area demonstrated in FIG. 14.

FIG. 15 is a graph showing the simulation result of return losses ($|S_{11}|$-parameter) comparison between filters of the present invention in which different widths of a connection strip joining two hybrid resonators are used, with increased details of the passband area demonstrated in FIG. 14.

FIG. 15 includes two graphs (a) and (b). The first graph (a) shows the $|S_{11}|$ parameter of the filter with a width of the connection strip $l=0.9$ mm. The second graph (b) shows the $|S_{11}|$ parameter of the filter with a width of the connection strip $l=1.3$ mm.

Figure 16:
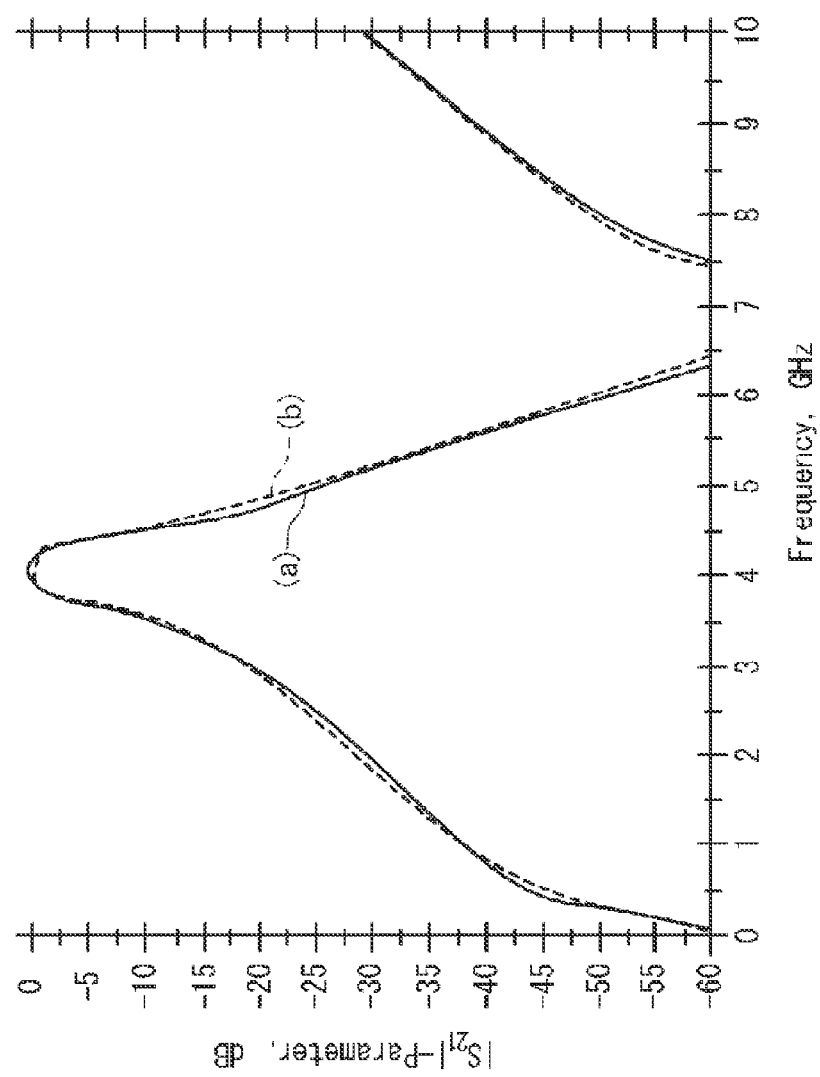
FIG. 16 is a graph showing the simulation result of insertion losses ($|S_{21}|$-parameter) comparison between filters of the present invention in which different widths of a connection strip joining two hybrid resonators are used.

FIG. 16 is a graph showing the simulation result of insertion losses ($|S_{21}|$-parameter) comparison between filters of the present invention in which different widths of a connection strip joining two hybrid resonators are used.

FIG. 16 includes two graphs (a) and (b). The first graph (a) shows the $|S_{21}|$ parameter of the filter with a width of the connection strip $l=0.9$ mm (solid line). The second graph (b) shows the $|S_{21}|$ parameter of the filter with a width of the connection strip $l=1.3$ mm (dashed line).

Figure 17:
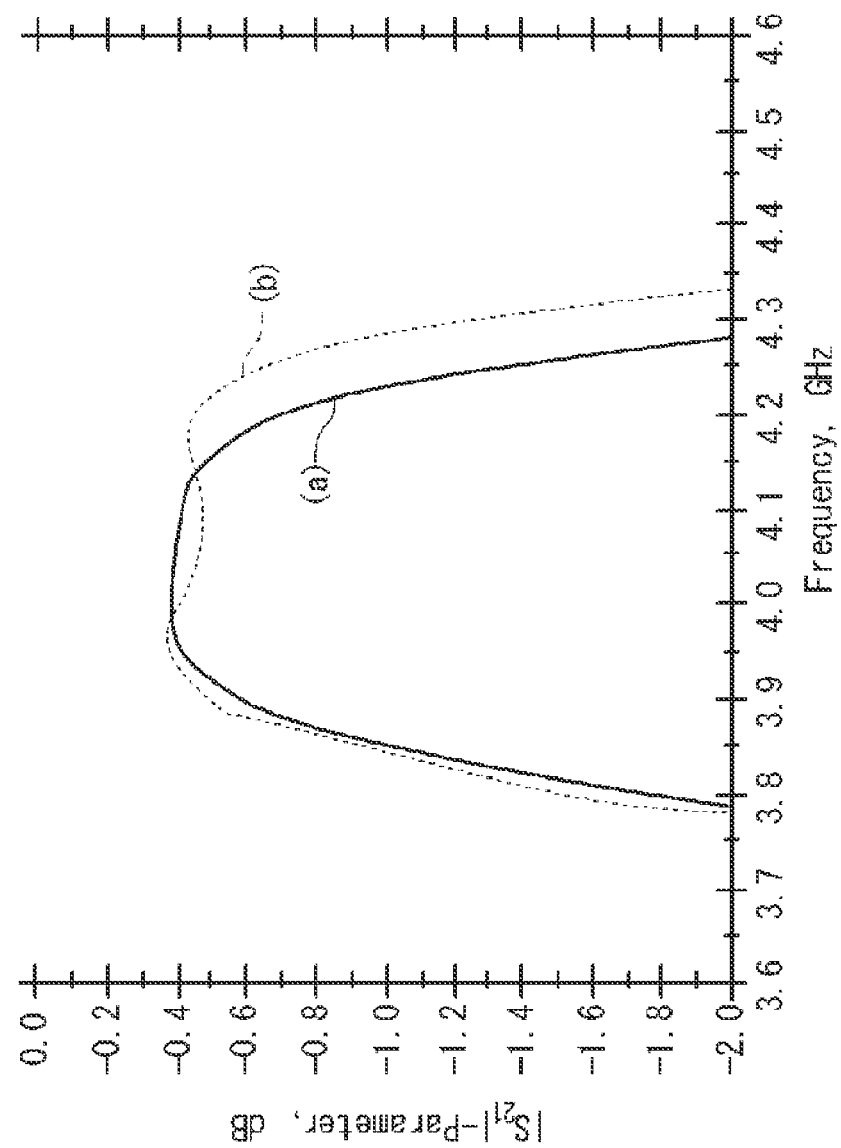
FIG. 17 is a graph showing the simulation result of insertion losses ($|S_{21}|$-parameter) comparison between filters of the present invention in which different widths of a connection strip joining two hybrid resonators are used, with increased details of the passband area demonstrated in FIG. 16.

FIG. 17 is a graph showing the simulation result of insertion losses ($|S_{21}|$-parameter) comparison between filters of the present invention in which different widths of a connection strip joining two hybrid resonators are used, with increased details of the passband area demonstrated in FIG. 16.

FIG. 17 includes two graphs (a) and (b). The first graph (a) shows the $|S_{21}|$ parameter of the filter with a width of the connection strip $l=0.9$ mm. The second graph (b) shows the $|S_{21}|$ parameter of the filter with a width of the connection strip $l=1.3$ mm.

In FIGS. 14 to 17, the electrical performance the bandpass filter formed by symmetrical hybrid resonators (the filter structure is similar to that in FIGS. 12 and 13) is calculated for two widths of the strip connecting the resonators. As one can see, due to the strip width changing it is possible to improve in-band performance of the filter proposed. In these figures, the filter with the connection strip width of l=0.9 mm has the higher performance than the filter with the connection strip width of l=1.3 mm.

While the present invention has been described in relation to some exemplary embodiments, it is to be understood that these exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the presented invention as defined by the claims.

The invention claimed is:

1. A filter comprising:
a multilayer substrate including a plurality of conductor layers and a dielectric configured to isolate said conductor layers from each other;
a first terminal disposed in one of said plurality of conductor layers;
a second terminal disposed in said one conductor layer;
a ground conductor disposed in said one conductor layer; and
a hybrid resonator disposed in said multilayer substrate, wherein said hybrid resonator comprises:
a first resonant element;
a second resonant element; and
a coupling strip configured to connect said first and said second resonant elements,
wherein said first resonant element comprises:
a first signal via disposed through said multilayer substrate;
a first group of ground vias disposed through said multilayer substrate and configured to surround said first signal via; and
a first artificial dielectric disposed in said multilayer substrate and between said first signal via and said first group of ground vias,
wherein said first artificial dielectric comprises:
a first conductive plate connected to said first signal via; and
a first isolating slit configured to isolate said first conductive plate from said first group of ground vias,
wherein said second resonant element comprises:
a second signal via disposed through said multilayer substrate;
a second group of ground vias disposed through said multilayer substrate and configured to surround said second signal via; and
a second artificial dielectric disposed in said multilayer substrate and between said second signal via and said second group of ground via, and
wherein said second artificial dielectric comprises:
a second conductive plate connected to said second signal via; and
a second isolating slit configured to isolate said second conductive plate from said second group of ground vias; and
wherein said first terminal and said second terminal are connected to said coupling strip; and
another hybrid resonator disposed in said multilayer substrate and connected to both said first and said second terminals; and
a connection strip disposed in said one conductor layer configured to connect said hybrid resonator and said another hybrid resonator,
wherein said another hybrid resonator comprises:
a third resonant element;
a fourth resonant element; and
another coupling strip configured to connect said third and said fourth resonant elements,
wherein said third resonant element comprise:
a third signal via disposed through said multilayer substrate;
a third group of ground vias disposed through said multilayer substrate and configured to surround said third signal via; and
a third artificial dielectric disposed in said multilayer substrate and between said third signal via and said third group of ground vias,
wherein said third artificial dielectric comprises:
a third conductive plate connected to said third signal via; and
a third isolating slit configured to isolate said third conductive plate from said third group of grounded via, and
wherein said fourth resonant element comprise:
a fourth signal via disposed through said multilayer substrate;
a fourth group of ground vias disposed through said multilayer substrate and configured to surround said fourth signal via; and
a fourth artificial dielectric disposed in said multilayer substrate and between said fourth signal via and said fourth group of ground vias, and
wherein said fourth artificial dielectric comprises:
a fourth conductive plate connected to said fourth signal via; and
a fourth isolating slit configured to isolate said fourth conductive plate from said third group of ground vias;
another ground conductor disposed in another one of said plurality of conductor layers and connected to said first, said second, said third and said fourth groups of ground vias
wherein said first artificial dielectric further comprises:
another first conductive plate disposed in said another conductor layer and connected to said first signal via; and
another first isolating slit disposed in said another conductor layer configured to isolate said another first conductive late from said another ground conductor,
wherein said second artificial dielectric further comprises:
another second conductive plate disposed in said another conductor layer and connected to said second signal via; and
another second isolating slit disposed in said another conductive layer configured to isolate another second conductive plate from said another ground conductor,
wherein said third artificial dielectric further comprises:
another third conductive plate disposed in said another conductor layer and connected to said third signal via; and
another third isolating slit disposed in said another conductor layer configured to isolate said another third conductive late from sand another ground conductor, and
wherein said fourth artificial dielectric further comprises:
another fourth conductive plate disposed in said another conductor layer and connected to said fourth signal via; and another fourth isolating slit disposed in said another conductor layer configured to isolate said another fourth conductive plate from said another ground conductor, and wherein said first artificial dielectric and said second artificial dielectric are different in length along a thickness of said multilayer substrate.

2. The filter according to claim 1,
wherein a first effective permittivity of said first artificial dielectric and a second effective permittivity of said second artificial dielectric are different from one another.

3. The filter according to claim 2 further comprising:
another hybrid resonator disposed in said multilayer substrate and connected to both said first and second terminals; and
a connection trip disposed in said one conductor layer configured to connect said hybrid resonator and said another hybrid resonator,
wherein said another hybrid resonator comprise:
a third resonant element;
a forth resonant element; and
another coupling strip configured to connect said third and said forth resonant elements,
wherein said third resonant element comprise:
a third signal via disposed through said multilayer substrate;
a third group of ground vias disposed through said multilayer substrate and configured to surround said third signal via; and
a third artificial dielectric disposed ins aid multilayer substrate and between said third signal via and said third group of ground vias,
wherein said third artificial dielectric comprises:
a third conductive plate connected to said third signal via; and
a third isolating slit configured to isolate said third conductive plate from said third group of ground vias, and
wherein said fourth resonant element comprise:
a fourth signal via disposed through said multilayer substrate;
a fourth group of ground vias disposed through said multilayer substrate and configured to surround said fourth signal via; and
a fourth artificial dielectric disposed in said multilayer substrate and between said fourth signal via and said fourth group of ground vias, and
wherein said fourth artificial dielectric comprise:
a fourth conductive plate connected to said fourth signal via; and
a fourth isolating slit configured to isolate said fourth conductive plate from said third group of ground vias.

4. The filter according to claim 2 further comprising another ground conductor disposed in another one of said plurality of conductor layers and connected to said first and said second group of ground vias,
wherein said first artificial dielectric further comprises a clearance hole disposed in said another conductor layer and configured to isolate said first signal via from said another ground conductor, and
wherein said second artificial dielectric further comprises:
another conductive plate disposed in said another conductive layer and connected to said first signal via; and
another isolating slit disposed in said another conductor layer configured to isolate said conductive plate from sand another ground conductor.

5. The filter according to claim 2 further comprising another ground conductor disposed in another one of said plurality of conductor layers and connected to said first and said second groups of ground vias,
wherein said first artificial dielectric further comprises:
another first conductive plate disposed in said another conductor layer and connected to said first signal via; and
another first isolating slit disposed ins aid another conductor layer and configured to isolate said another first conductive plate from said another ground conductor, and
wherein said second artificial dielectric further comprises:
another second conductive plate disposed in said another conductor layer and connected to said second signal via; and
another second isolating slit disposed in said another conductor layer and configured to isolate said another second conductive plate from said another ground conductor.

6. The filter of according to claim 1 further comprising further another hybrid resonator disposed in said multilayer substrate and connected to both said first and said second terminals via said connection strip,
wherein said further another hybrid resonator comprises:
a fifth resonant element
a sixth resonant element; and
further another coupling strip configured to connect said fifth and said sixth resonant elements,
wherein said fifth resonant element comprise:
a fifth signal via disposed through said multilayer substrate;
a fifth group of ground vias disposed through said multilayer substrate and configured to surround said fifth signal via; and
a firth artificial dielectric disposed in said multilayer substrate and between said fifth signal via and said fifth group of ground vias,
wherein said fifth artificial dielectric comprises:
a fifth conductive plate connected to said fifth signal via; and
a fifth isolating slit isolating said fifth conductive plate from said third group of ground vias, and
wherein said sixth resonant element comprise:
a sixth signal via disposed through said multilayer substrate;
a sixth group of ground vias disposed through said multilayer substrate and configured to surround said sixth signal via; and
a sixth artificial dielectric disposed in said multilayer substrate and between said sixth signal via and said sixth group of ground vias,
wherein said sixth artificial dielectric comprises:
a sixth conductive plate connected to said sixth signal via; and
a sixth isolating slit isolating said sixth conductive plate from said third group of ground vias.

7. The filter according to claim 1 further comprising another ground conductor disposed in another one of said plurality of conductor layers and connected to said first and said second groups of ground vias,
wherein said first artificial dielectric further comprises a clearance hole disposed in said another conductor layer and configured to isolate said first signal via from said another ground conductor, and
wherein said second artificial dielectric further comprises:

another conductive plate disposed in said another conductor layer and connected to said first signal via; and another isolating slit disposed in said another conductor layer configured to isolate said conductive plate from said another ground conductor.

8. The filter according to claim 1 further comprising another ground conductor disposed in another one of said plurality of conductor layers and connected to said first and said second groups of ground vias, wherein said first artificial dielectric further comprises:

another first conductive plate disposed in said another conductor layer and connected to said first signal via; and another first isolating slit disposed in said another conductor layer and configured to isolate said another first conductive plate from said another ground conductor, and wherein said second artificial dielectric further comprises:

another second conductive plate disposed in said another conductor layers and connected to said second signal vial; and another second isolating slit disposed in said another conductor layer and configured to isolate said another second conductive plate from said another ground conductor.

9. The filter according to claim 1 further comprising further another ground conductor disposed in further another one of said plurality of conductive layers and connected to said first, said second, said third and said fourth groups of ground vias, wherein said first artificial dielectric further comprises a clearance hole disposed in said further anther conductor layer and configured to isolate said first signal via from said further another ground conductor, wherein said second artificial dielectric further comprises:

further another second conductive plate disposed in said further another conductor layer and connected to said second signal via; and further another second isolating slit disposed in said further another conductor layer configured to isolate said further another second conductive plate from said further another ground conductor, wherein said third artificial dielectric further comprises:

further another third conductive plate disposed in said further another conductor layer and connected to said third signal via; and further another third isolating slit disposed in said further another conductor layer configured to isolate said further another third conductive plate from said further another ground conductor, and wherein said fourth artificial dielectric further comprises:

further another fourth conductive plate disposed in said further another conductor layer and connected to said fourth signal via; and further another fourth isolating slit disposed in said further another conductor layer configured to isolate said further another fourth conductive plate from said further another ground conductor.

10. The filter according to claim 1 further comprising another ground conductor disposed in further another one of said plurality of conductor layers and connected to said first, said second, said third and said fourth group of ground vias, wherein said first artificial dielectric further comprises a clearance hole disposed in said further another conductor layer and configured to isolate said first signal via from said further another ground conductor, wherein said second artificial dielectric further comprises a clearance hole disposed in said further another conductor layer and configured to isolate said second signal via from said further another ground conductor, wherein said third artificial dielectric further comprised a clearance hole dispose d in said further another conductor layer and configured to isolate said third signal via from said further another ground conductor, and wherein said fourth artificial dielectric further comprises a clearance hole disposed in said further another conductor layer and configured to isolate said fourth signal via from said further another ground conductor.

* * * * *